(12) United States Patent
Bhattacharjee

(10) Patent No.: US 11,588,466 B2
(45) Date of Patent: *Feb. 21, 2023

(54) GUIDED WAVE DEVICES WITH SELECTIVELY LOADED PIEZOELECTRIC LAYERS

(71) Applicant: Qorvo US, Inc., Greensboro, NC (US)

(72) Inventor: Kushal Bhattacharjee, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 938 days.

This patent is subject to a terminal disclaimer.

(21) Appl. No.: 16/425,667

(22) Filed: May 29, 2019

(65) Prior Publication Data

US 2019/0296713 A1 Sep. 26, 2019

Related U.S. Application Data

(63) Continuation of application No. 15/087,277, filed on Mar. 31, 2016, now Pat. No. 10,326,426.

(Continued)

(51) Int. Cl.
*H03H 9/02* (2006.01)
*H03H 9/25* (2006.01)
(Continued)

(52) U.S. Cl.
CPC ...... *H03H 9/02787* (2013.01); *H03H 3/0072* (2013.01); *H03H 3/0077* (2013.01);
(Continued)

(58) Field of Classification Search
CPC ............ H03H 9/02787; H03H 9/0009; H03H 9/02228; H03H 9/02244; H03H 9/02259;
(Continued)

(56) References Cited

U.S. PATENT DOCUMENTS

| 4,952,904 A | 8/1990 | Johnson et al. |
| 7,262,676 B2 | 8/2007 | Ruile et al. |

(Continued)

FOREIGN PATENT DOCUMENTS

JP 6104680 A 4/1992

OTHER PUBLICATIONS

Notice of Allowance for U.S. Appl. No. 15/623,856, dated Jul. 1, 2020, 8 pages.
(Continued)

*Primary Examiner* — Jeffrey M Shin
(74) *Attorney, Agent, or Firm* — Withrow & Terranova, P.L.L.C.

(57) ABSTRACT

A micro-electrical-mechanical system (MEMS) guided wave device includes a plurality of electrodes arranged below a piezoelectric layer (e.g., either embedded in a slow wave propagation layer or supported by a suspended portion of the piezoelectric layer) and configured for transduction of a lateral acoustic wave in the piezoelectric layer. The piezoelectric layer permits one or more additions or modifications to be made thereto, such as trimming (thinning) of selective areas, addition of loading materials, sandwiching of piezoelectric layer regions between electrodes to yield capacitive elements or non-linear elastic convolvers, addition of sensing materials, and addition of functional layers providing mixed domain signal processing utility.

15 Claims, 39 Drawing Sheets

Related U.S. Application Data

(60) Provisional application No. 62/281,805, filed on Jan. 22, 2016.

(51) Int. Cl.

| | | |
|---|---|---|
| *H03H 3/08* | (2006.01) | |
| *H03H 3/007* | (2006.01) | |
| *H03H 3/02* | (2006.01) | |
| *H03H 9/13* | (2006.01) | |
| *H03H 9/145* | (2006.01) | |
| *H03H 9/17* | (2006.01) | |
| *H03H 9/00* | (2006.01) | |
| *H03H 9/15* | (2006.01) | |
| *H03H 9/05* | (2006.01) | |

(52) U.S. Cl.
CPC ............... *H03H 3/02* (2013.01); *H03H 3/08* (2013.01); *H03H 9/0009* (2013.01); *H03H 9/0296* (2013.01); *H03H 9/02228* (2013.01); *H03H 9/02244* (2013.01); *H03H 9/02259* (2013.01); *H03H 9/02275* (2013.01); *H03H 9/02338* (2013.01); *H03H 9/0538* (2013.01); *H03H 9/13* (2013.01); *H03H 9/131* (2013.01); *H03H 9/145* (2013.01); *H03H 9/14564* (2013.01); *H03H 9/15* (2013.01); *H03H 9/17* (2013.01); *H03H 9/25* (2013.01); *H03H 2003/027* (2013.01); *H03H 2009/02165* (2013.01); *H03H 2009/02496* (2013.01); *H03H 2009/155* (2013.01)

(58) Field of Classification Search
CPC ........... H03H 9/02275; H03H 9/02338; H03H 9/0296; H03H 9/0538; H03H 9/13; H03H 9/131; H03H 9/145; H03H 9/14564; H03H 9/15; H03H 9/17; H03H 9/25; H03H 3/0072; H03H 3/0077; H03H 3/02; H03H 3/08; H03H 2009/02165; H03H 2009/02496; H03H 2009/155
See application file for complete search history.

(56) References Cited

U.S. PATENT DOCUMENTS

| | | | |
|---|---|---|---|
| 7,586,239 B1 | 9/2009 | Li et al. | |
| 7,898,158 B1 | 3/2011 | Li et al. | |
| 9,059,677 B2 | 6/2015 | Reinhardt et al. | |
| 10,211,806 B2 | 2/2019 | Bhattacharjee | |
| 10,305,442 B2 | 5/2019 | Bhattacharjee | |
| 10,305,443 B2 | 5/2019 | Bhattacharjee | |
| 10,326,426 B2 * | 6/2019 | Bhattacharjee | H03H 9/02787 |
| 2005/0250198 A1 | 11/2005 | Fujimura et al. | |
| 2006/0076852 A1 | 4/2006 | Ruile et al. | |
| 2009/0302715 A1 | 12/2009 | Shibata et al. | |
| 2010/0327995 A1 | 12/2010 | Reinhardt et al. | |
| 2011/0109196 A1 | 5/2011 | Goto et al. | |
| 2012/0198672 A1 | 8/2012 | Ueda et al. | |
| 2013/0106243 A1 | 5/2013 | Reinhardt et al. | |
| 2015/0225231 A1 | 8/2015 | Henn | |
| 2015/0288345 A1 | 10/2015 | Bhattacharjee | |
| 2016/0182007 A1 | 6/2016 | Bhattacharjee | |
| 2016/0182009 A1 | 6/2016 | Bhattacharjee | |
| 2017/0214381 A1 | 7/2017 | Bhattacharjee | |
| 2017/0214382 A1 | 7/2017 | Bhattacharjee | |
| 2017/0214383 A1 | 7/2017 | Bhattacharjee | |
| 2017/0214384 A1 | 7/2017 | Bhattacharjee | |
| 2017/0214385 A1 | 7/2017 | Bhattacharjee | |
| 2017/0288629 A1 | 10/2017 | Bhattacharjee | |
| 2018/0152171 A1 | 5/2018 | Kishimoto et al. | |
| 2018/0159497 A1 | 6/2018 | Iwamoto et al. | |

OTHER PUBLICATIONS

Notice of Allowance for U.S. Appl. No. 15/087,197, dated Aug. 26, 2019, 9 pages.

Author Unknown, "Acoustic Wave Sensors," Vectron International, 2003, 44 pages, www.sengenuity.com/tech_ref/AWS_WebVersion.pdf.

Author Unknown, "Single Crystals and Non-PZT Materials," APC International, Ltd., 2014, 2 pages, www.americanpiezo.com/product-service/custom-piezoelectric-elements/ceramic-crystals.html.

Campbell, Colin K., "An Overview of SAW Devices For Mobile/Wireless Communications," Understanding Surface Acoustic Wave (SAW) Devices for Mobile and Wireless Applications and Design Techniques, Session 19, 2008, 43 pages.

Ferrari, Vittorio et al., "Overview of Acoustic-Wave Microsensors," Piezoelectric Transducers and Applications, Springer-Verlag Berlin Heidelberg, 2008, pp. 39-62.

Hohmann, Siegfried et al., "Surface Acoustic Wave (SAW) Resonators for Monitoring Conditioning Film Formation," Sensors, vol. 15, May 21, 2015, pp. 11873-11888.

Kadota, Michio, et al., "Simulation of solidly mounted plate wave resonator with wide bandwidth using 0-th shear horizontal mode in LiNbO3 plate," Japanese Journal of Applied Physics, vol. 54, Jun. 2015, The Japanese Society of Applied Physics, 4 pages.

Lalinsky, T. et al., "AlGaN/GaN based SAW-HEMT structures for chemical gas sensors," Procedia Engineering, vol. 5, 2010, pp. 152-155.

Luong, Trung-Dung et al., "Surface Acoustic Wave Driven Microfluidics," Micro and Nanosystems, vol. 2, No. 3, 2010, 20 pages.

Shao, Lei, "Active Acoustic Emission from a Two-dimensional Electron Gas," Dissertation, University of Michigan, 2014, 103 pages.

Sherrit, Stewart et al., "BAW and SAW sensors for In-situ analysis," Proceedings of the SPIE Smart Structures Conference San Diego, CA, Mar. 2-6, 2003, Paper 5050-11, SPIE, 11 pages.

Wang, Wen et al., "Advances in SXFA-Coated SAW Chemical Sensors for Organophosphorous Compound Detection," Sensors, vol. 11, Jan. 2011, pp. 1526-1541.

Wong, King-Yuen et al., "Surface acoustic wave device on AlGaN/GaN heterostructure using two-dimensional electron gas interdigital transducers," Applied Physics Letters, vol. 90, No. 21, May 23, 2007, 3 pages.

Zhou, Changjian et al., "Temperature-Compensated High-Frequency Surface Acoustic Wave Device," IEEE Electron Device Letters, vol. 34, No. 12, Dec. 2013, pp. 1572-1574.

Non-Final Office Action for U.S. Appl. No. 15/087,277, dated Oct. 4, 2018, 11 pages.

Notice of Allowance for U.S. Appl. No. 15/087,277, dated Feb. 5, 2019, 7 pages.

Non-Final Office Action for U.S. Appl. No. 15/087,197, dated Oct. 29, 2018, 5 pages.

Ex Parte Quayle Action for U.S. Appl. No. 15/087,197, mailed Mar. 22, 2019, 6 pages.

Non-Final Office Action for U.S. Appl. No. 15/087,354, dated Oct. 1, 2018, 12 pages.

Notice of Allowance for U.S. Appl. No. 15/087,354, dated Jan. 18, 2019, 7 pages.

Non-Final Office Action for U.S. Appl. No. 15/087,409, dated Oct. 1, 2018, 13 pages.

Notice of Allowance for U.S. Appl. No. 15/087,409, dated Jan. 22, 2019, 7 pages.

Non-Final Office Action for U.S. Appl. No. 15/087,320, dated Mar. 9, 2018, 6 pages.

Non-Final Office Action for U.S. Appl. No. 15/623,856, dated Mar. 18, 2020, 11 pages.

* cited by examiner

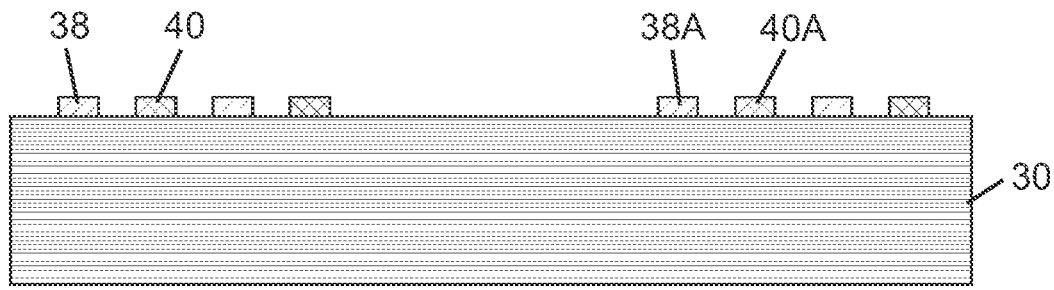
FIG._2A
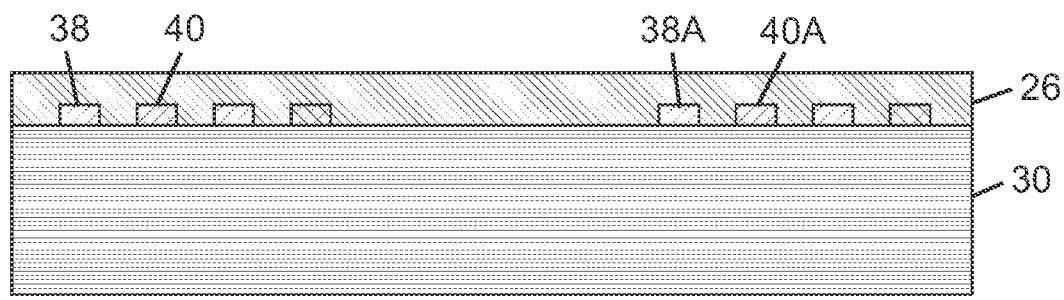
FIG._2B
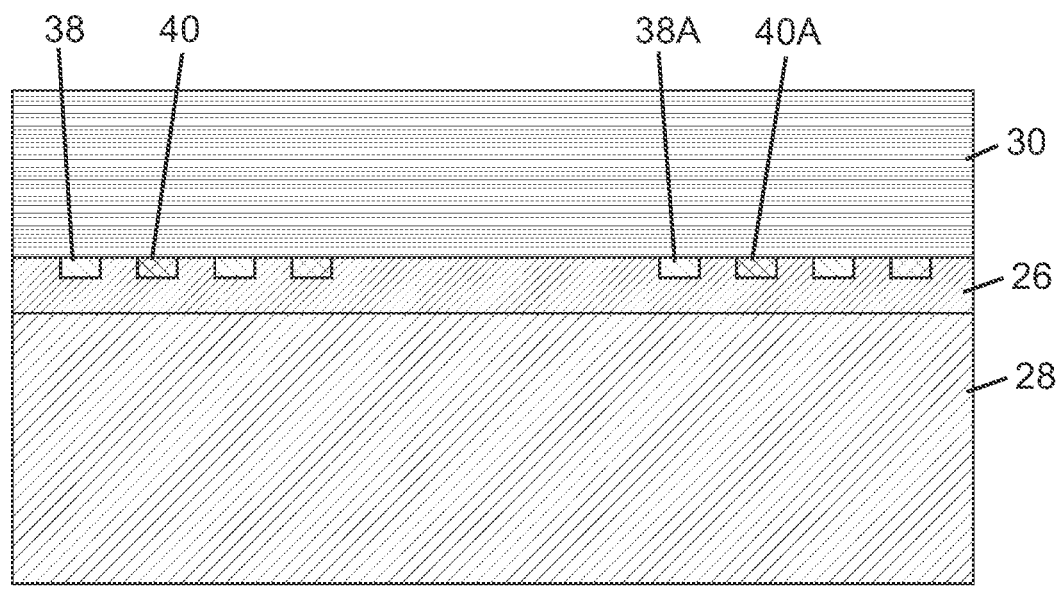
FIG._2C

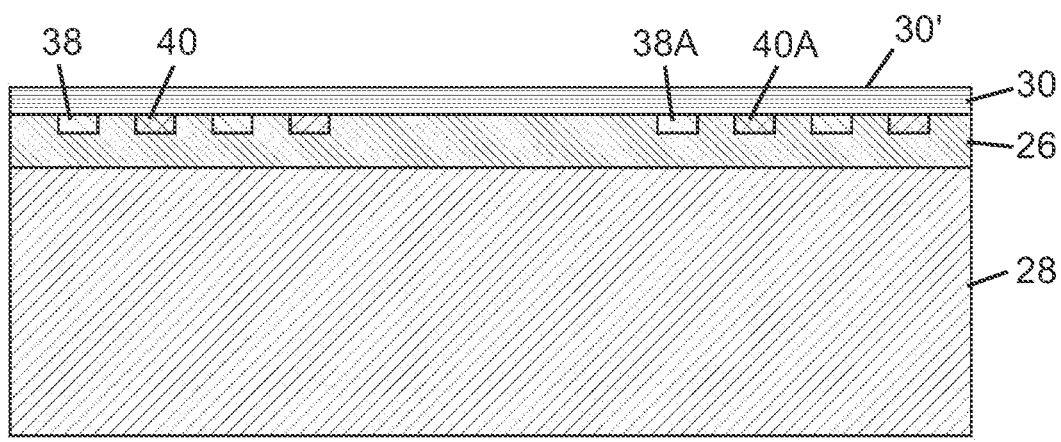
FIG._2D

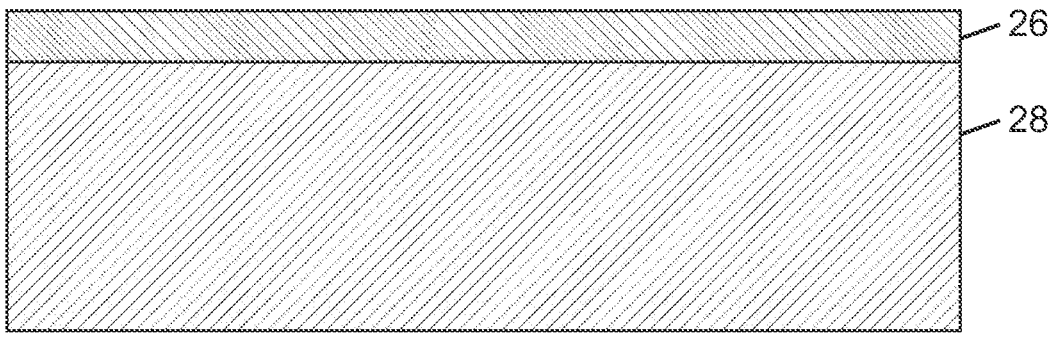
FIG._3A
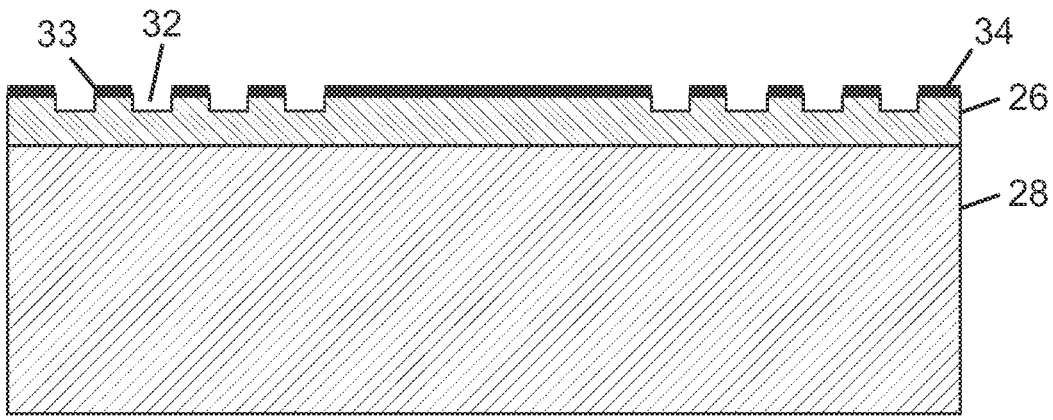
FIG._3B
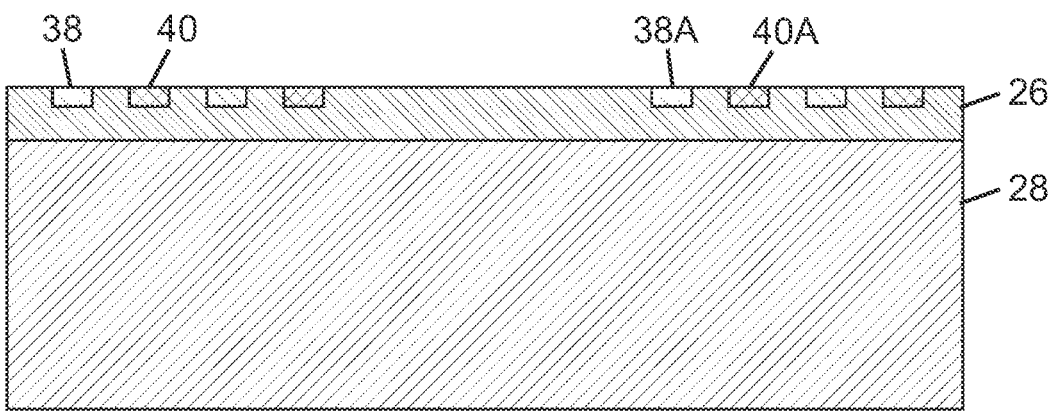
FIG._3C

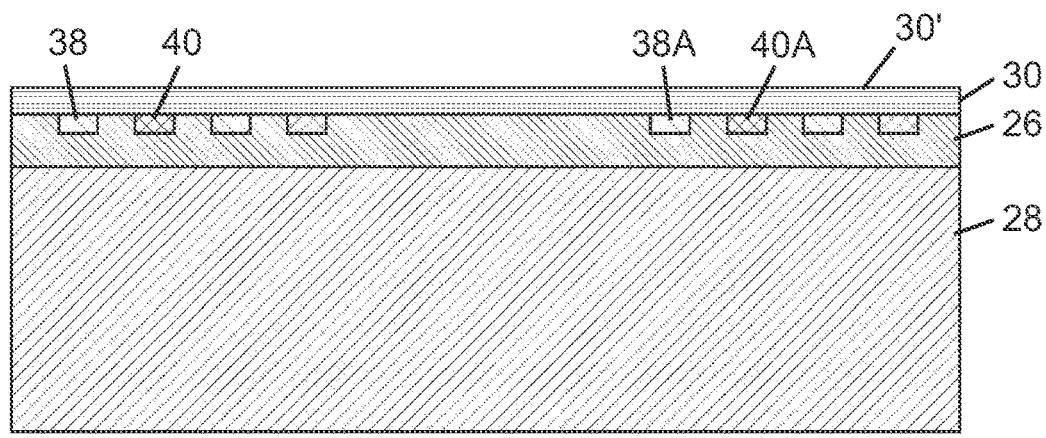
FIG._3D
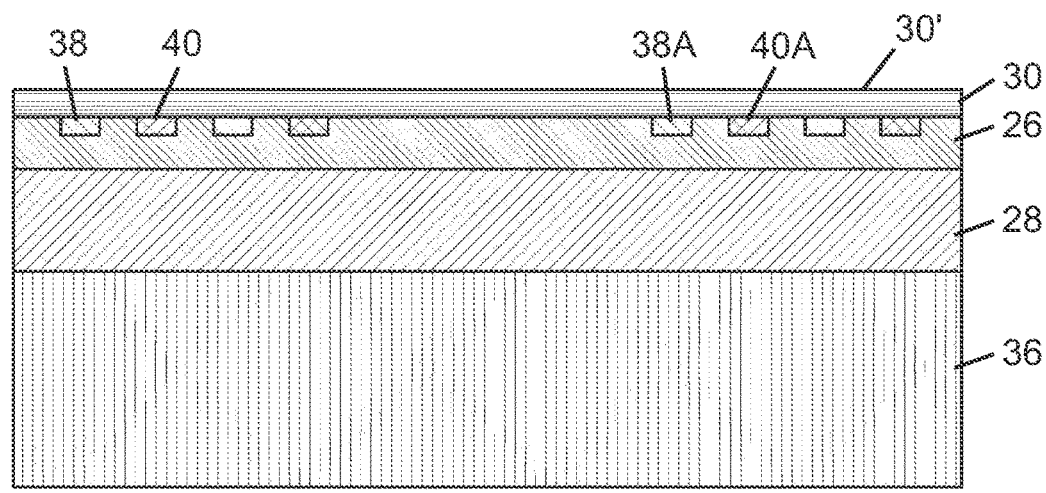
FIG._4
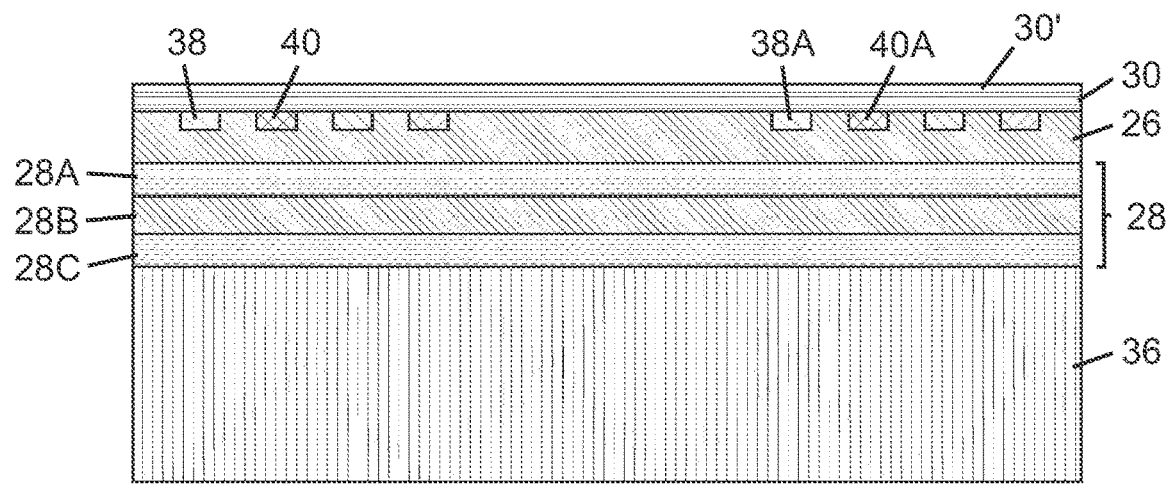
FIG._5

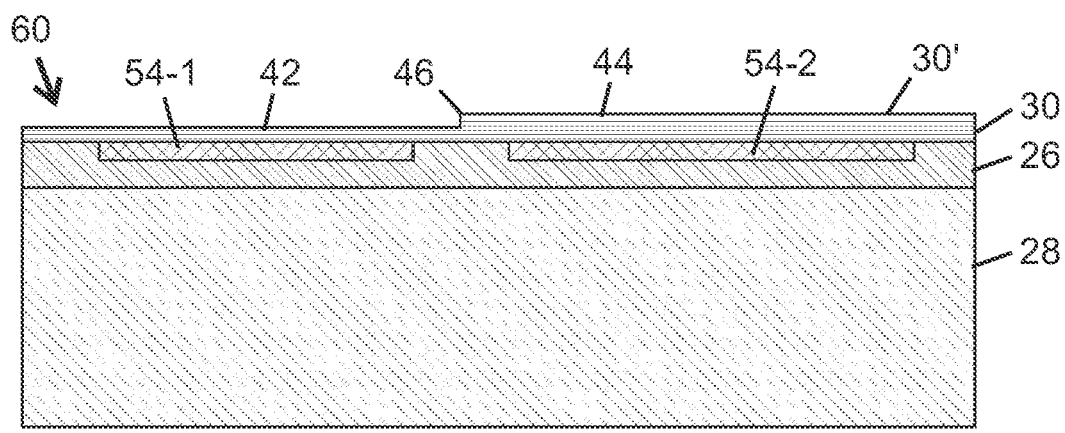
FIG._7B
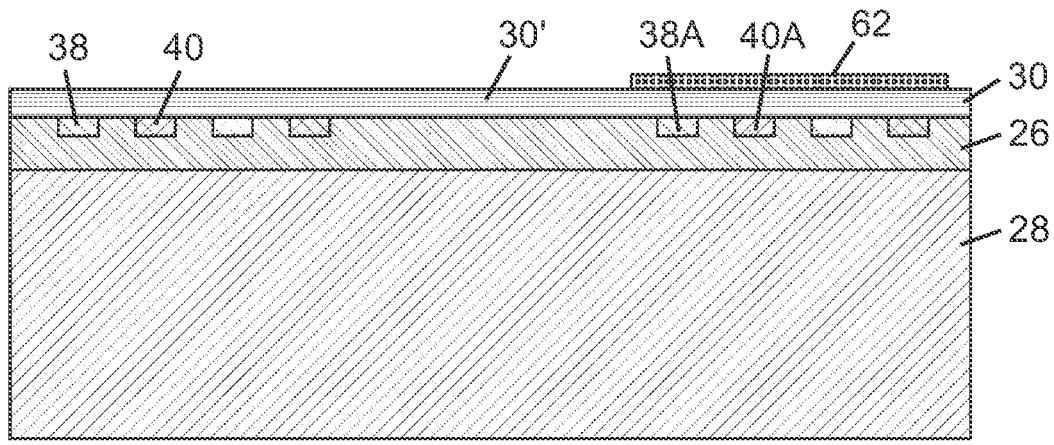
FIG._8
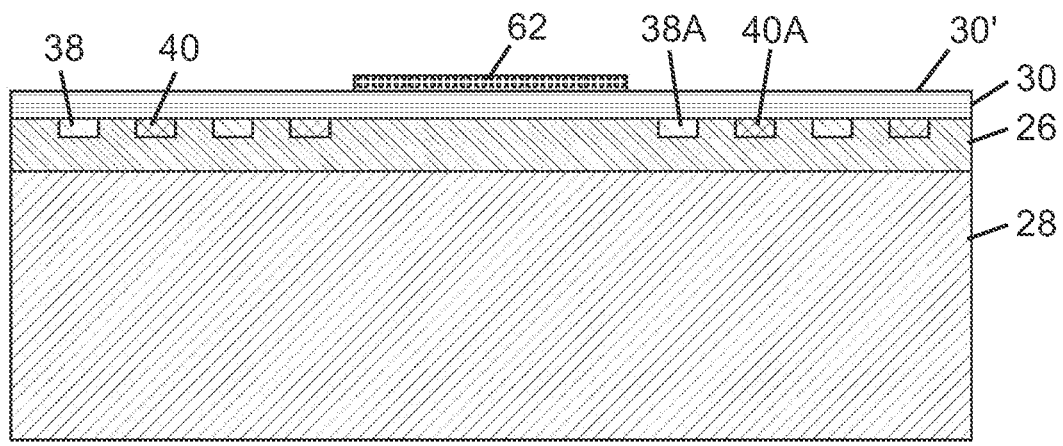
FIG._9

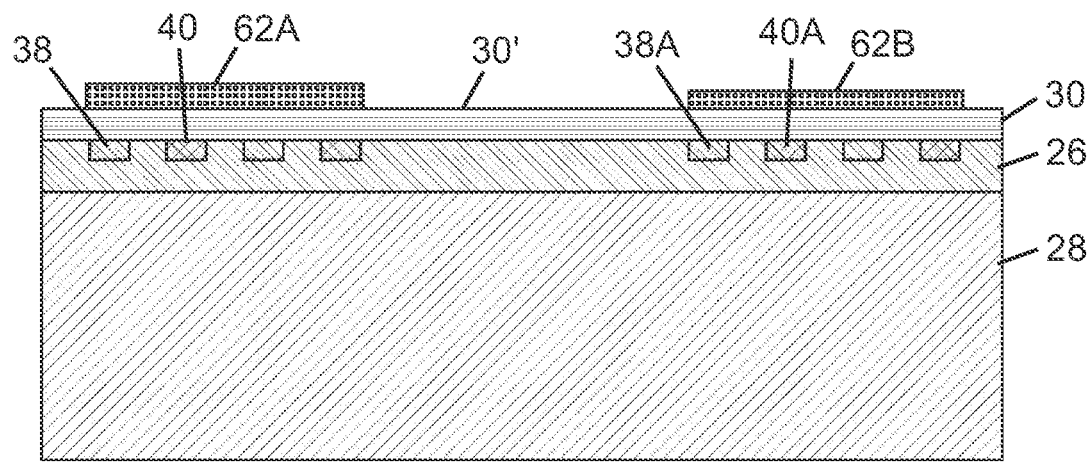
FIG._10

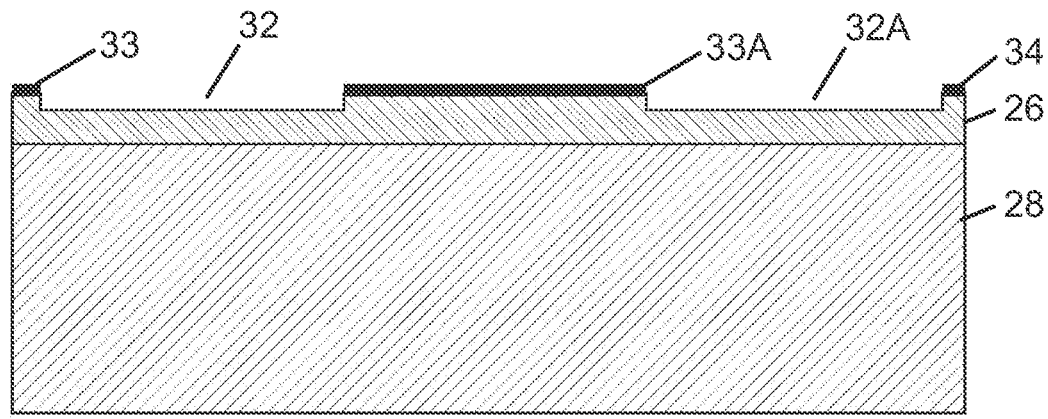
FIG._11A
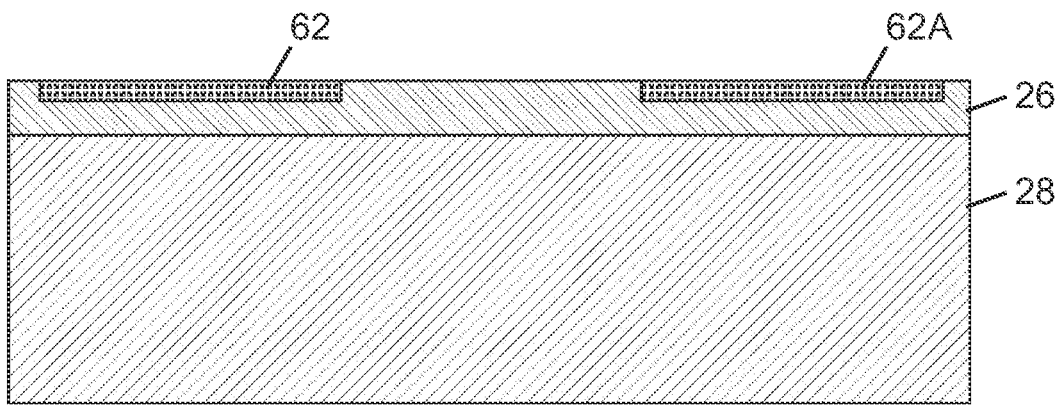
FIG._11B
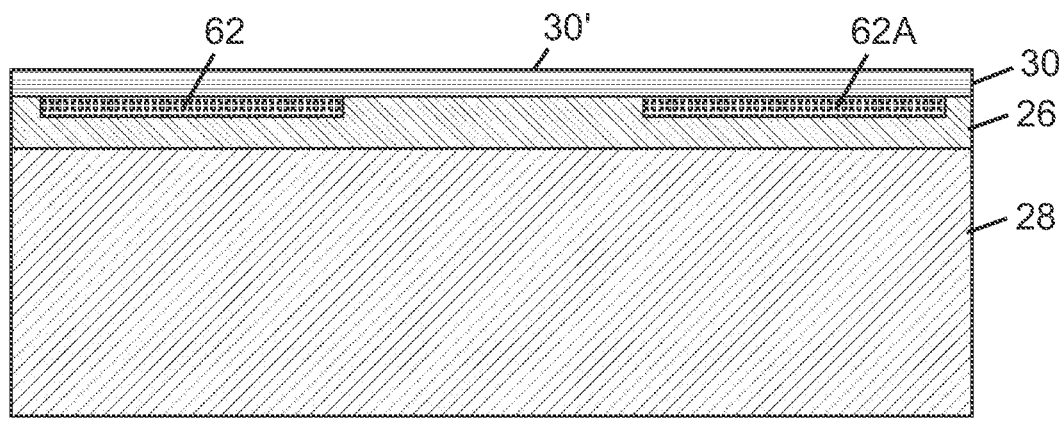
FIG._11C

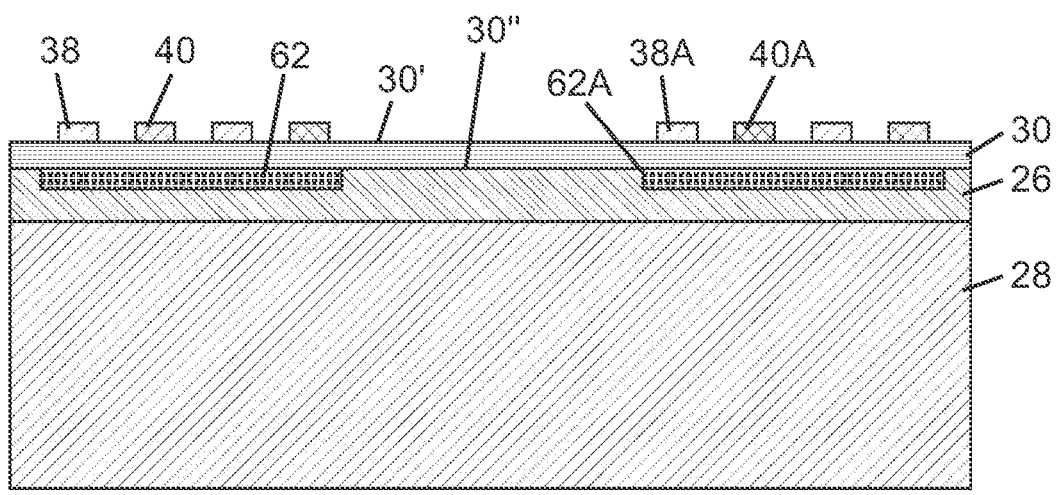
FIG._11D

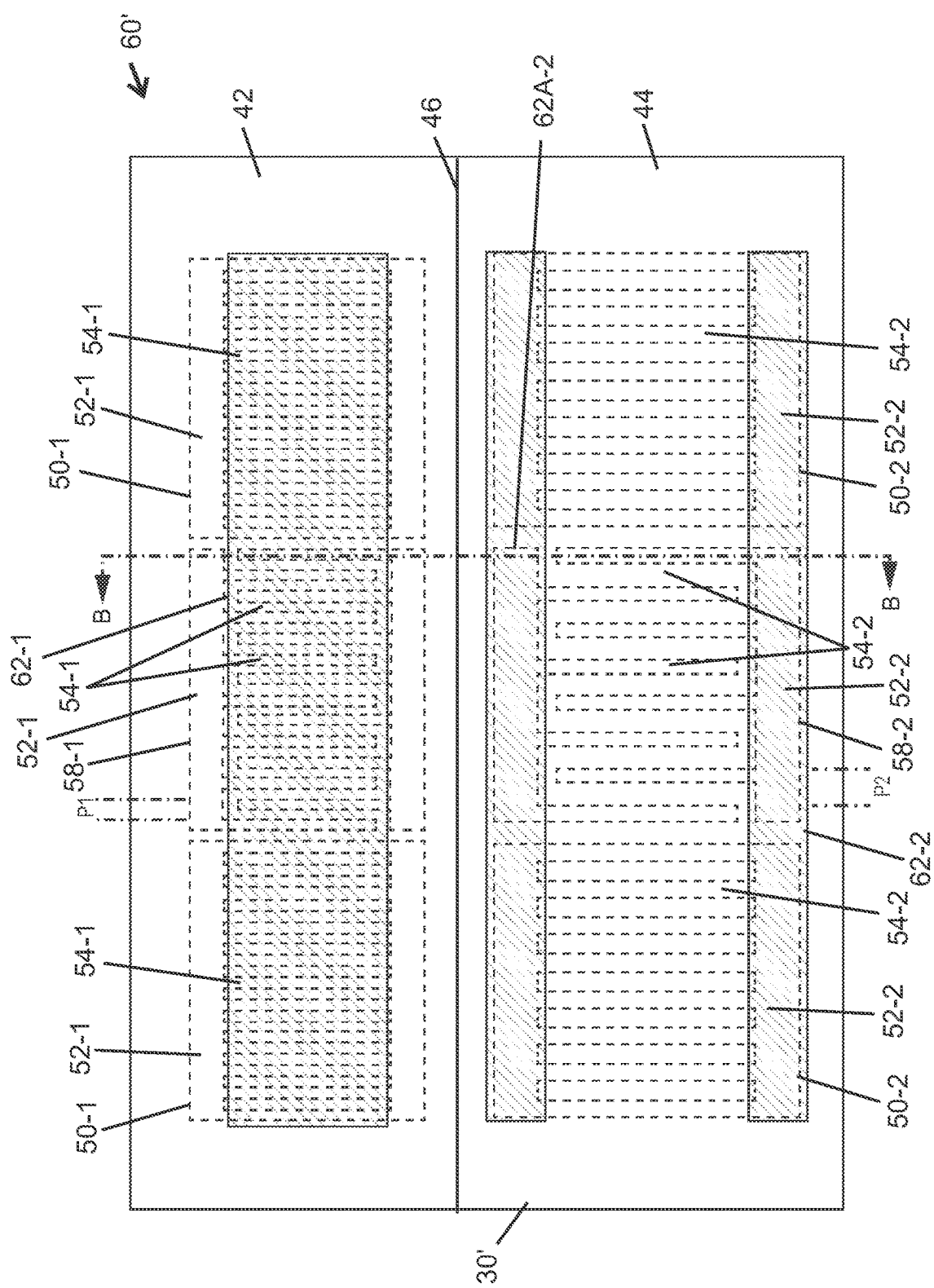
FIG._12A

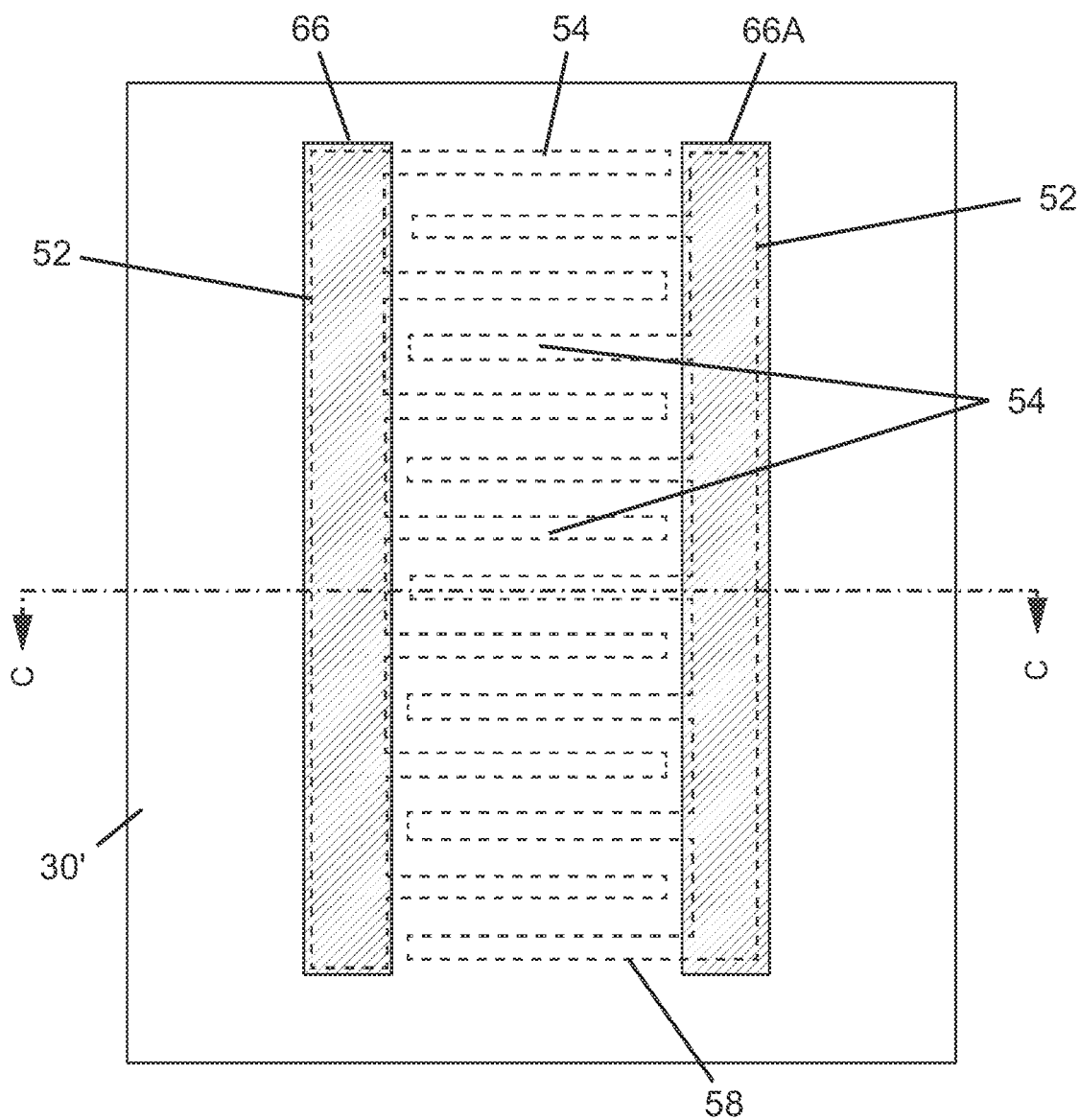
FIG._13A

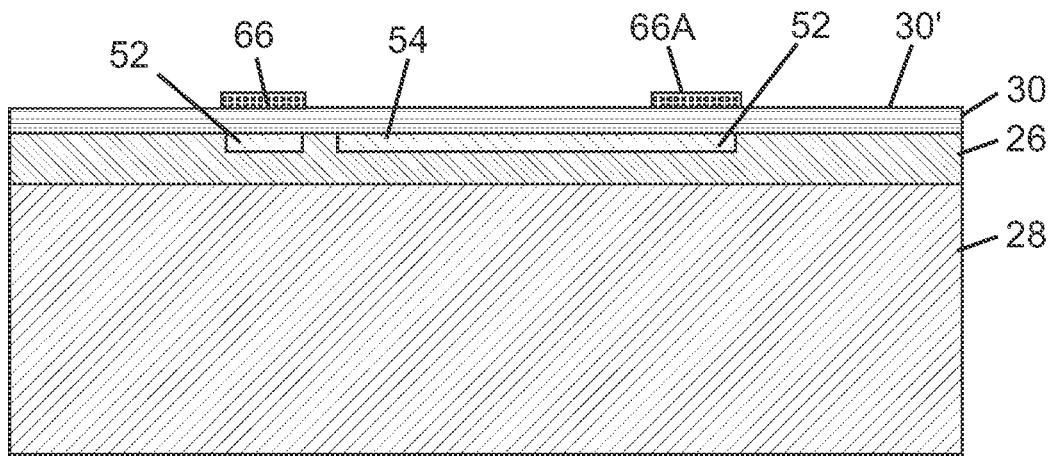
FIG._13B

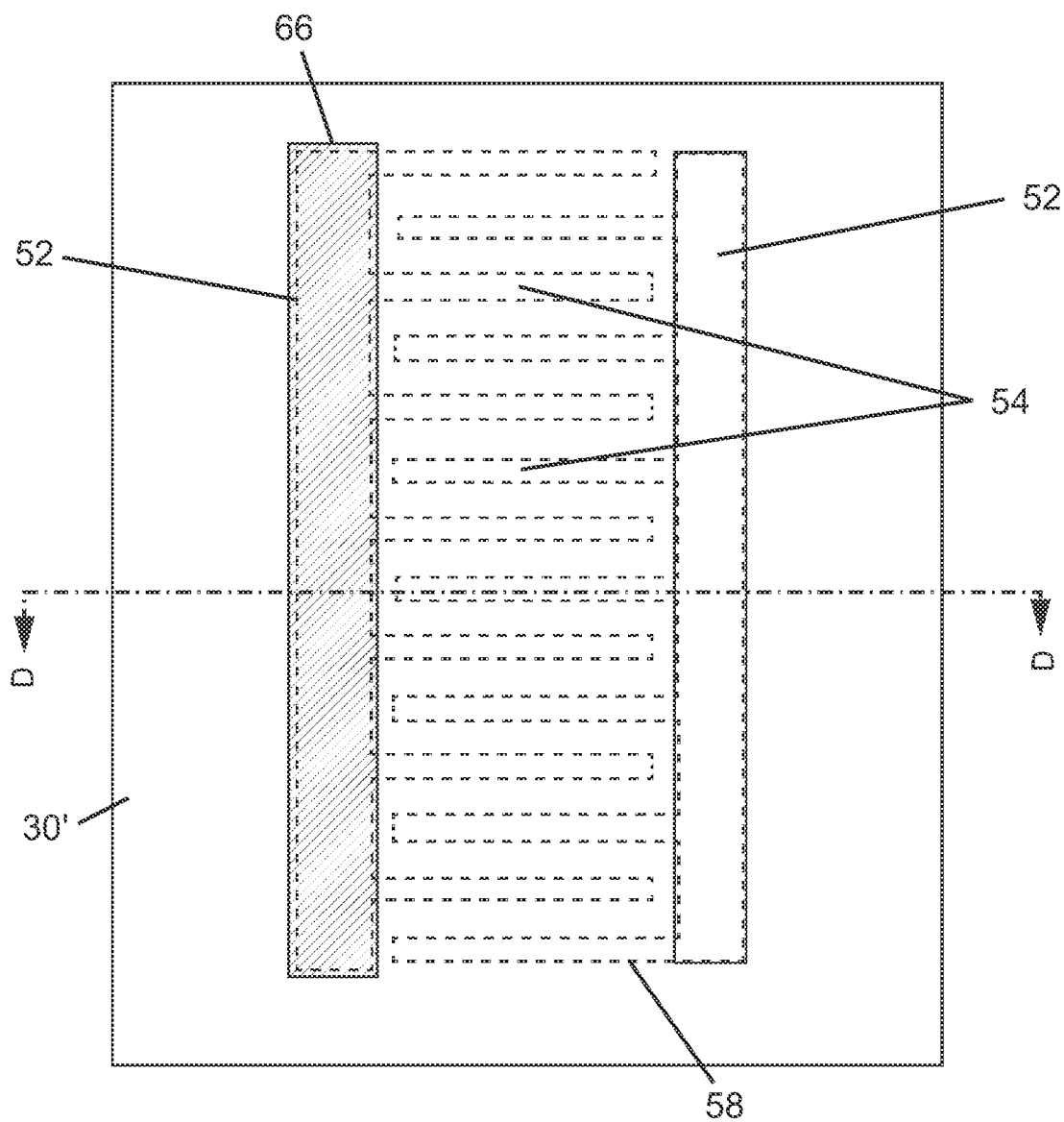
FIG._14A

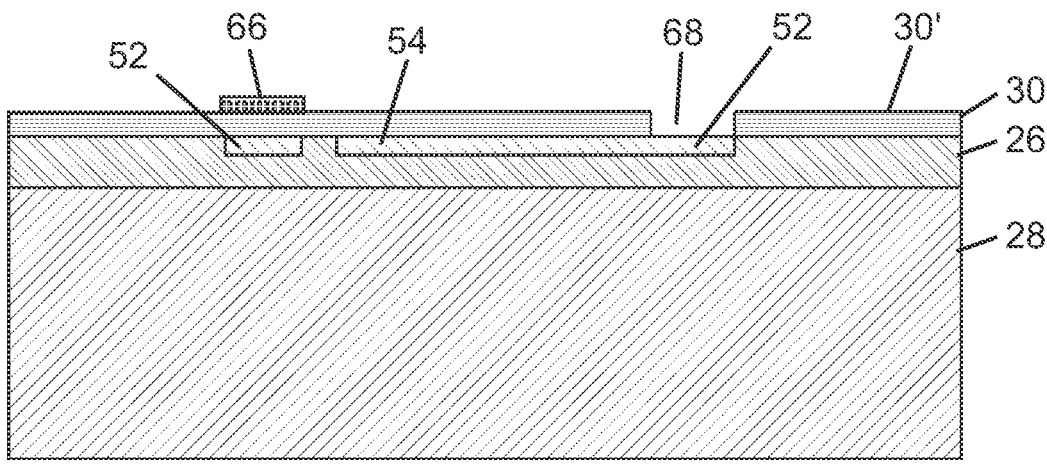
FIG._14B
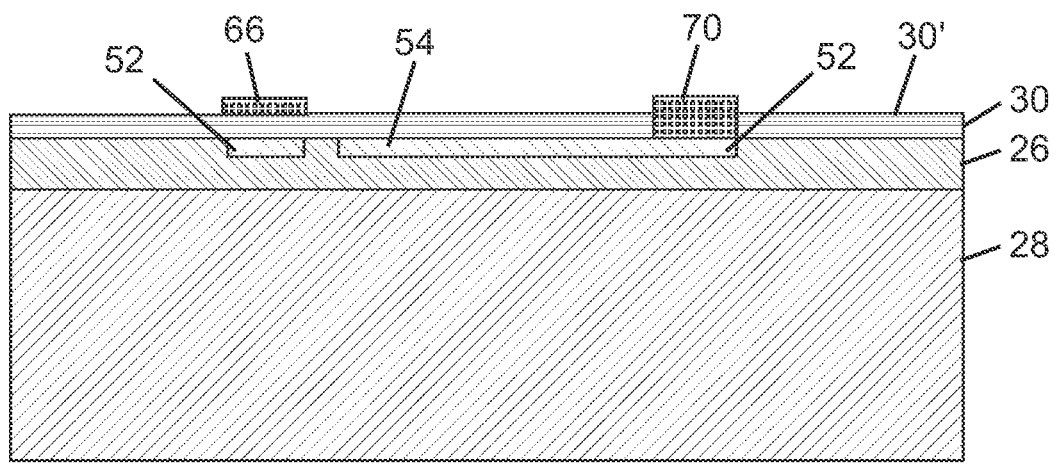
FIG._14C
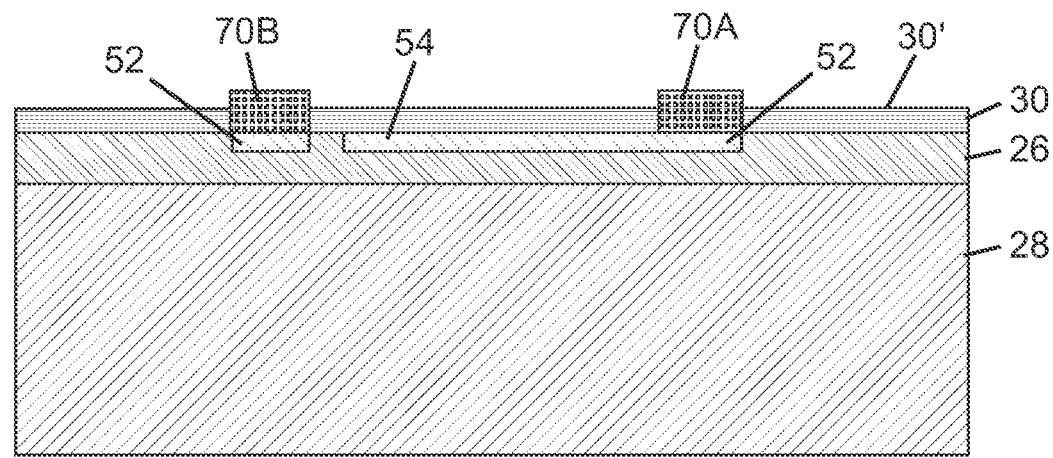
FIG._14D

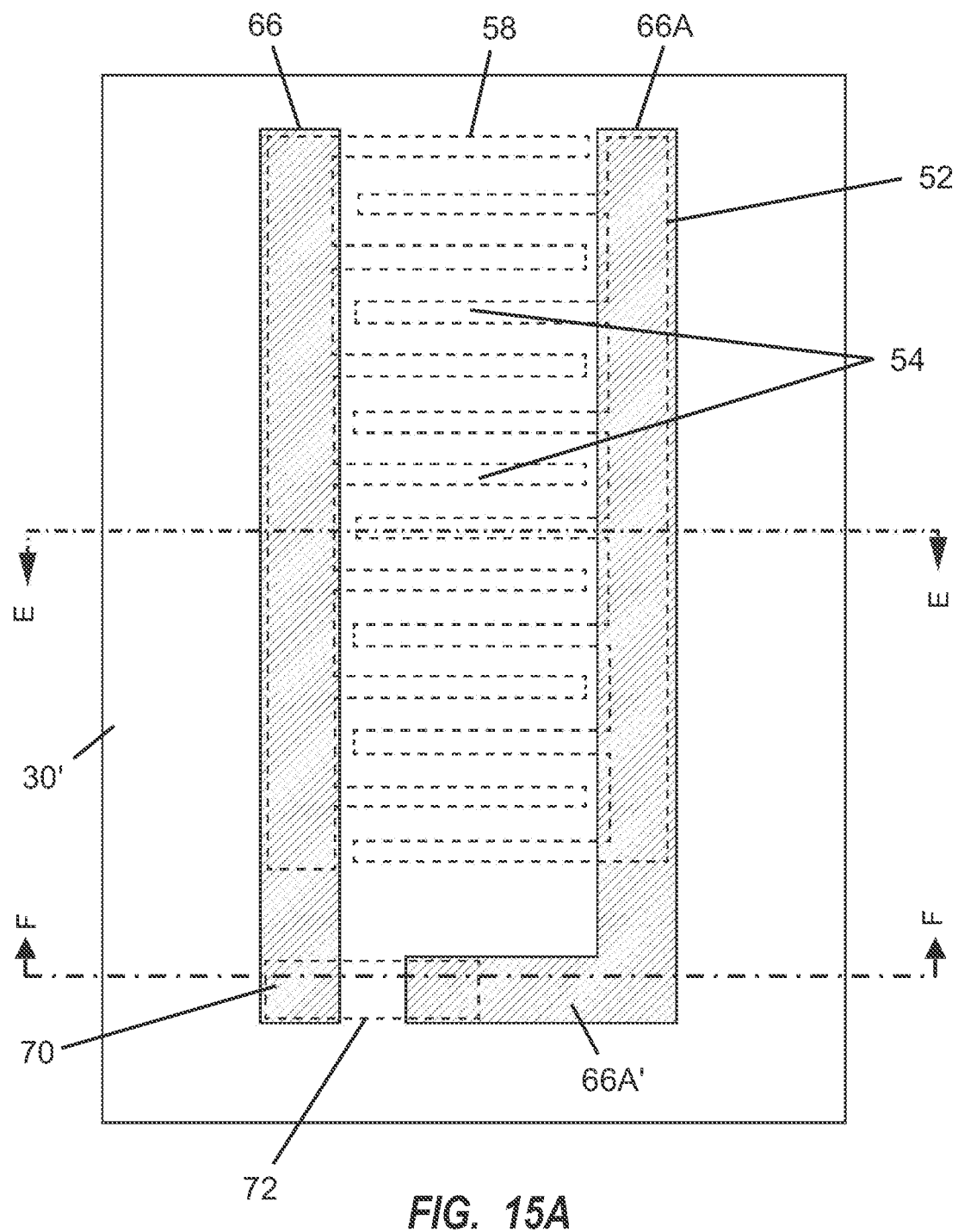
FIG._15A

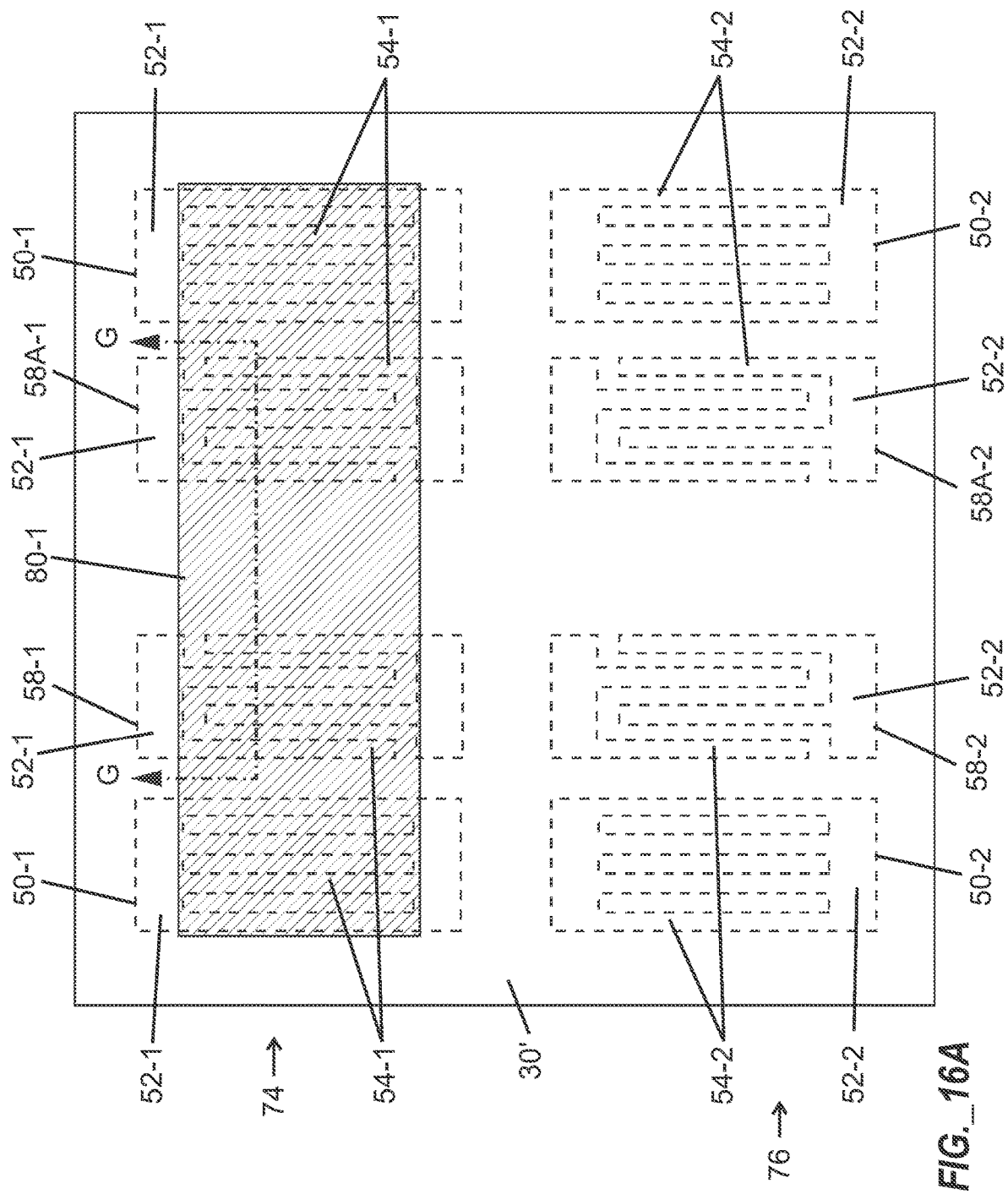
FIG._16A

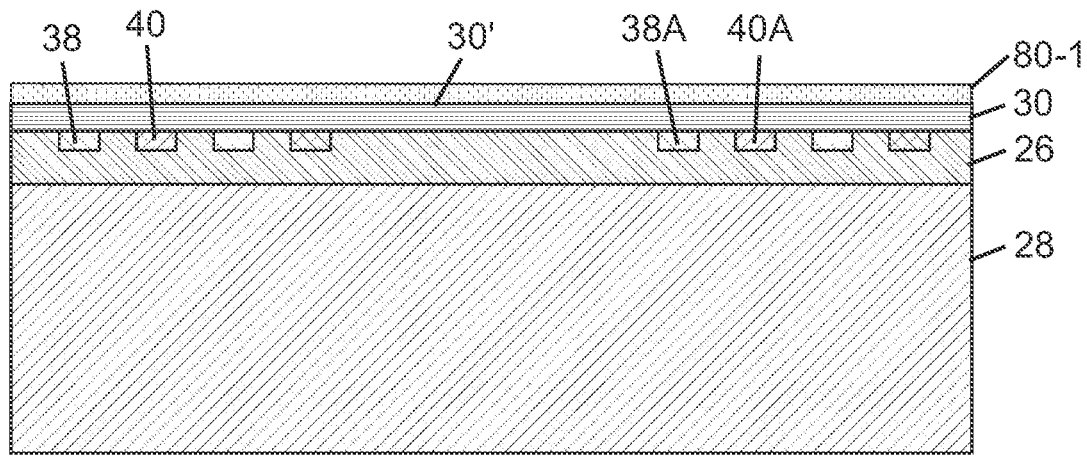
FIG._16B

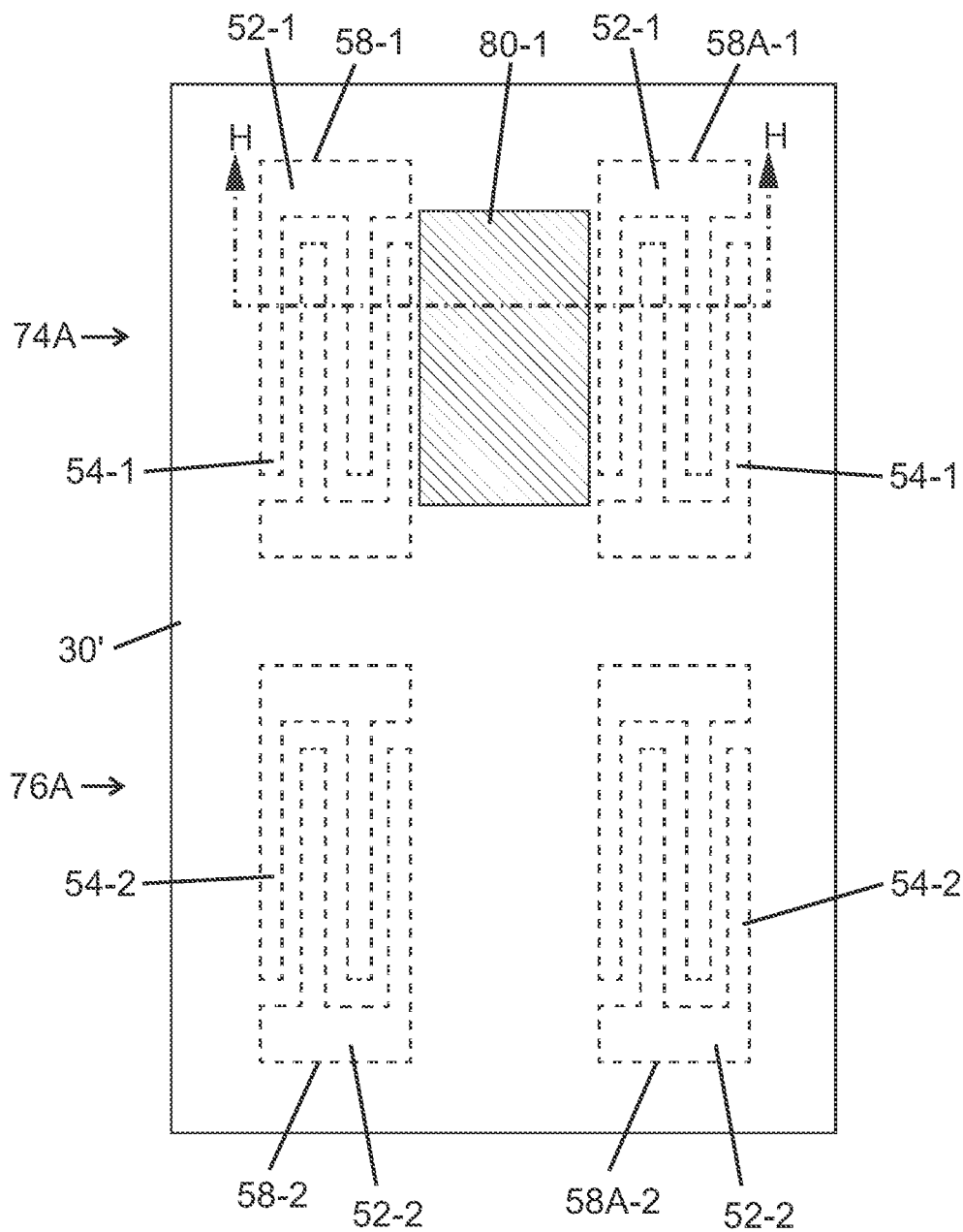
FIG._17A

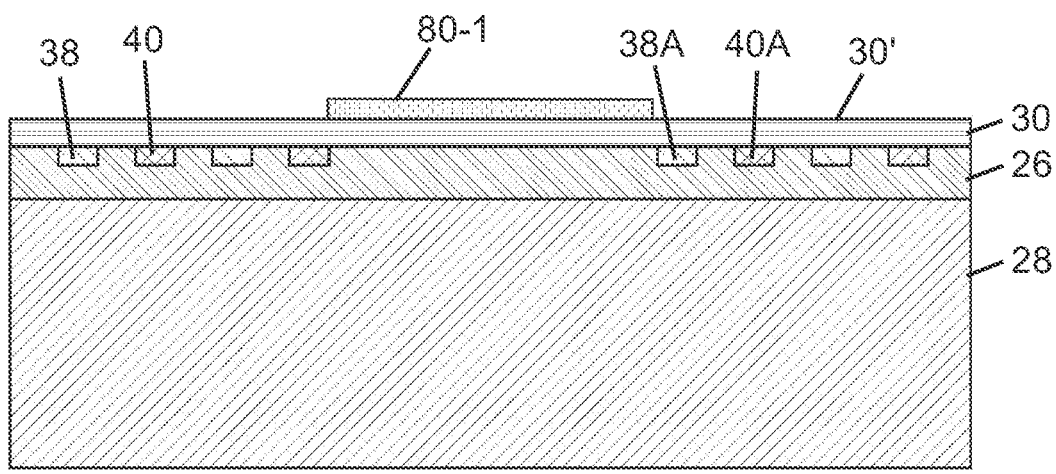
FIG._17B

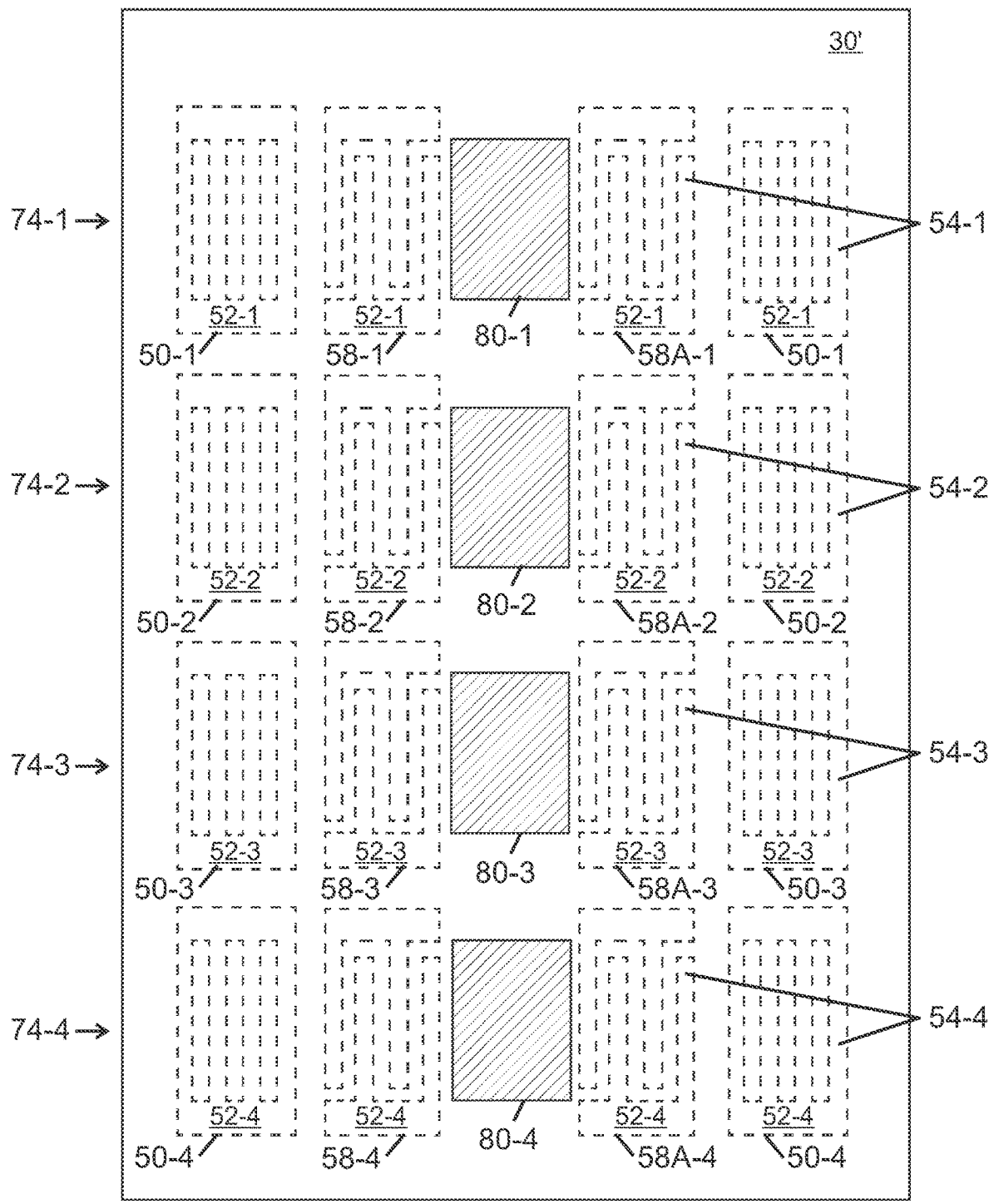
FIG._18

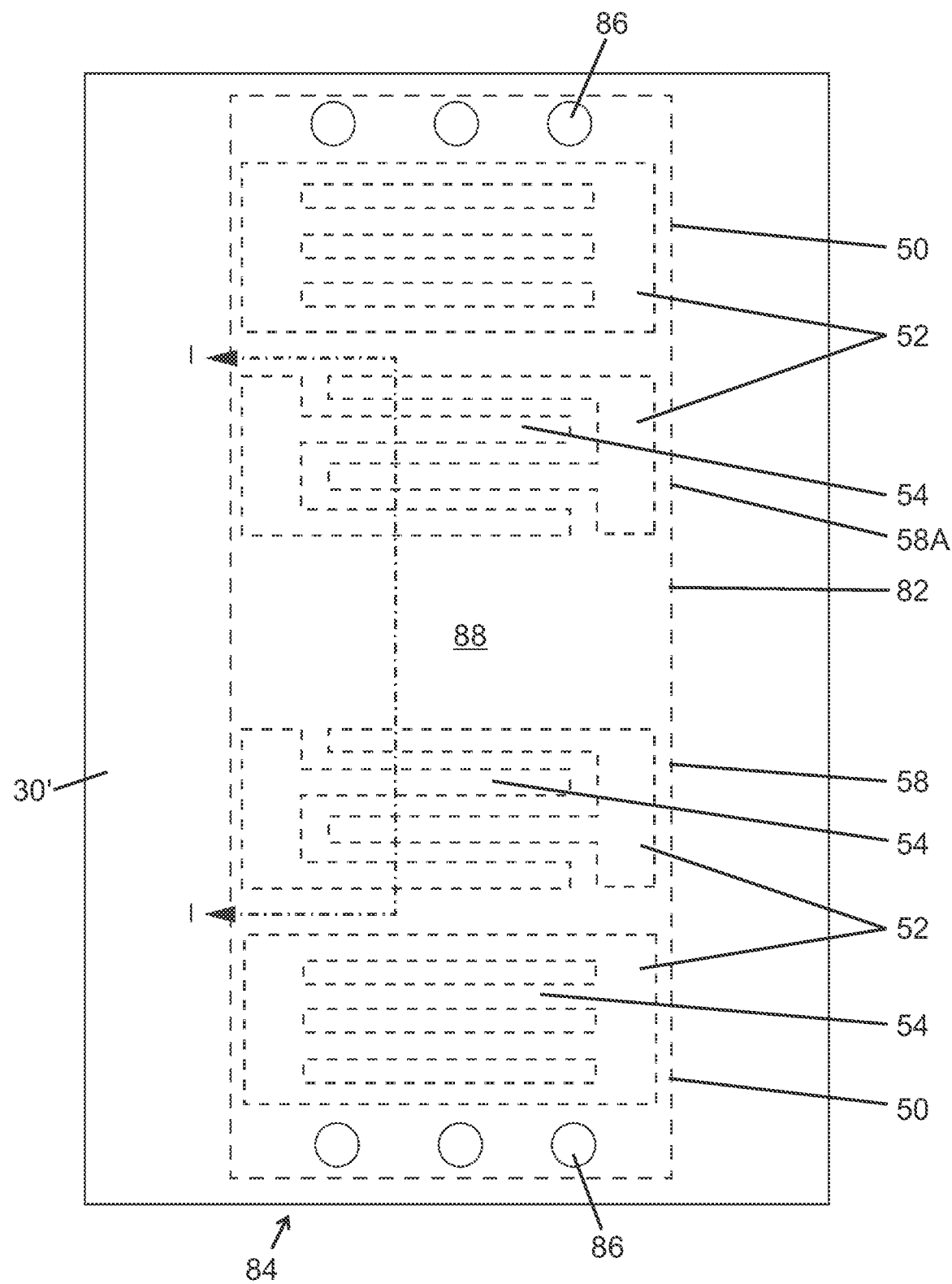
FIG._19A

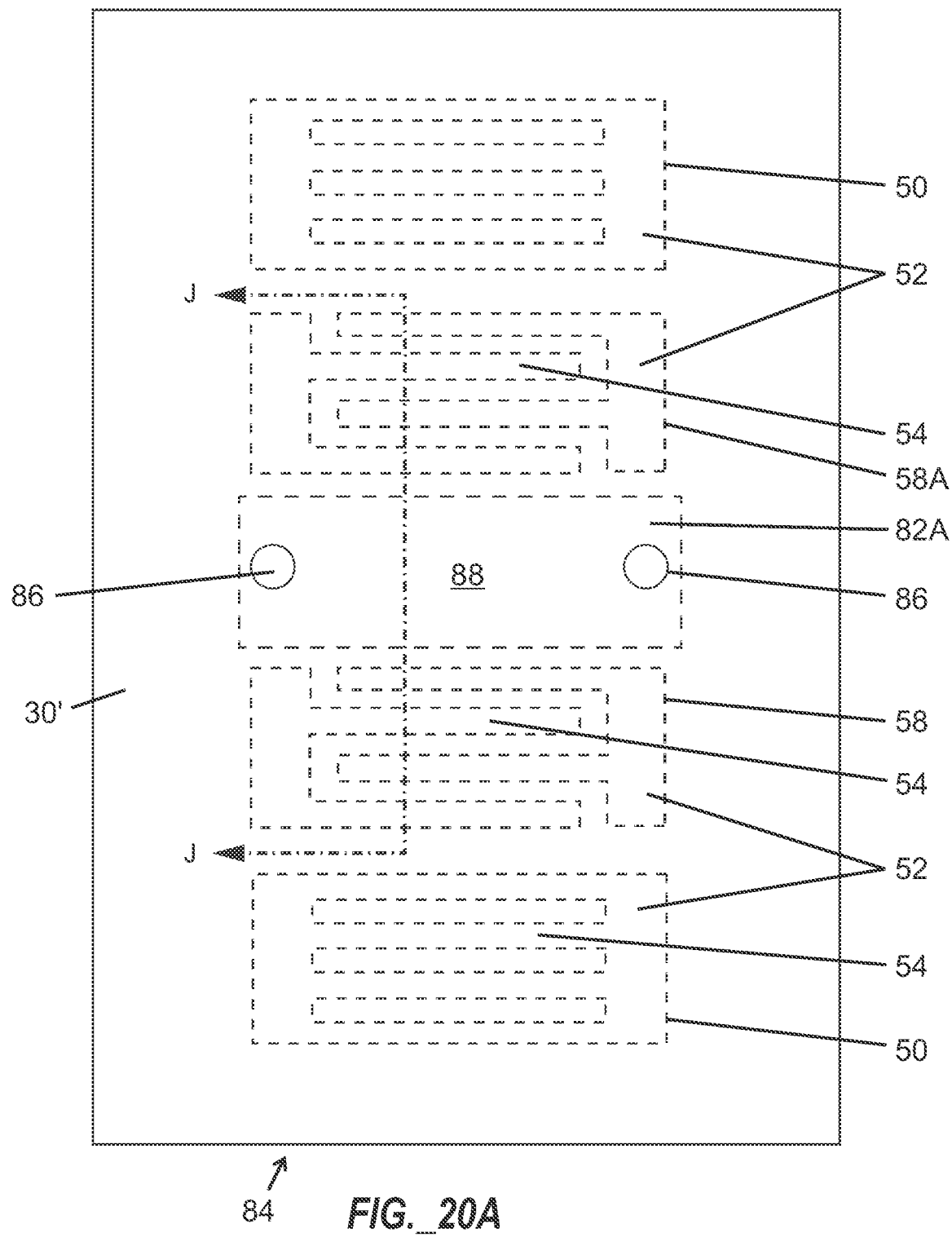

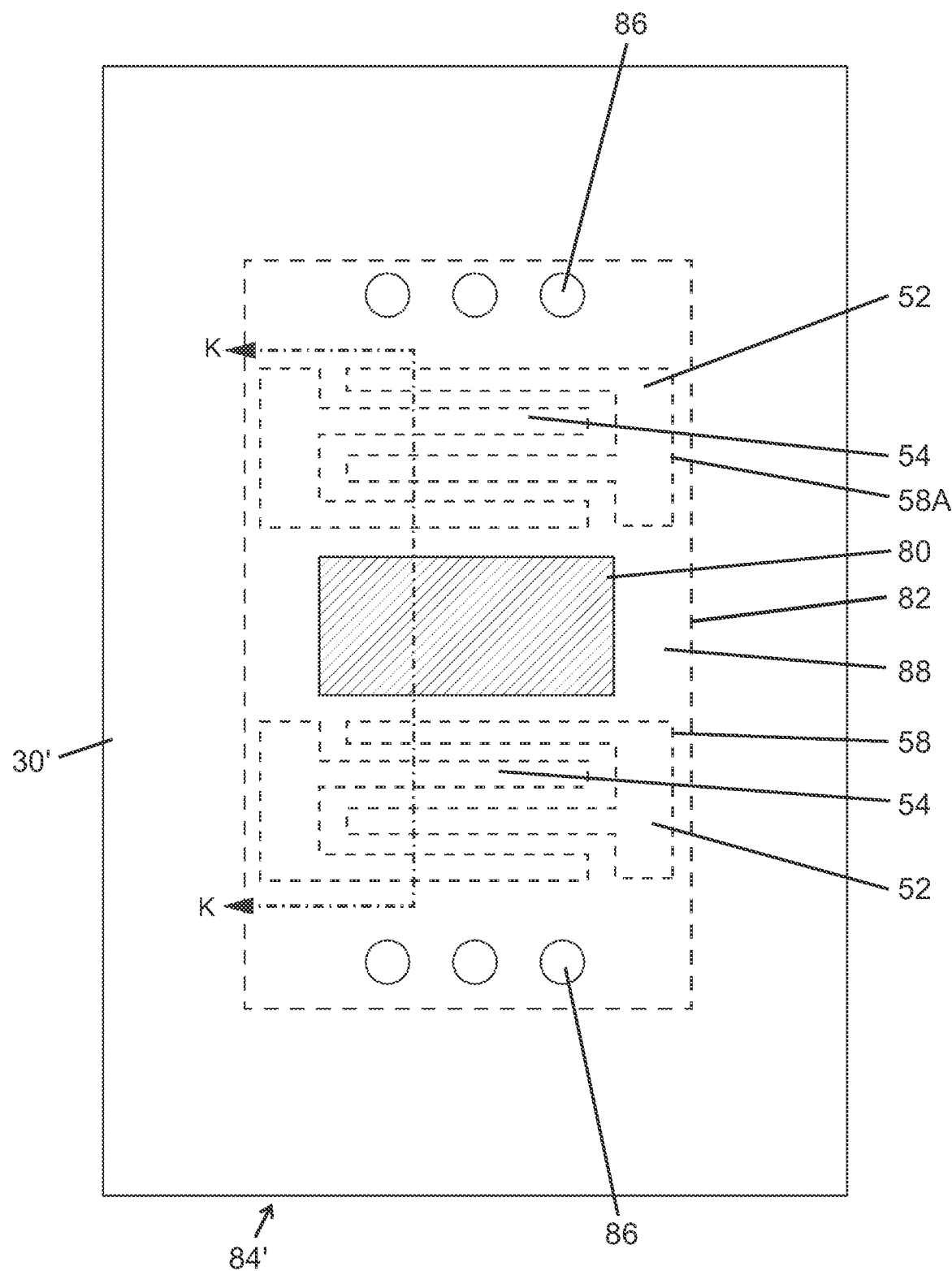
FIG._21A

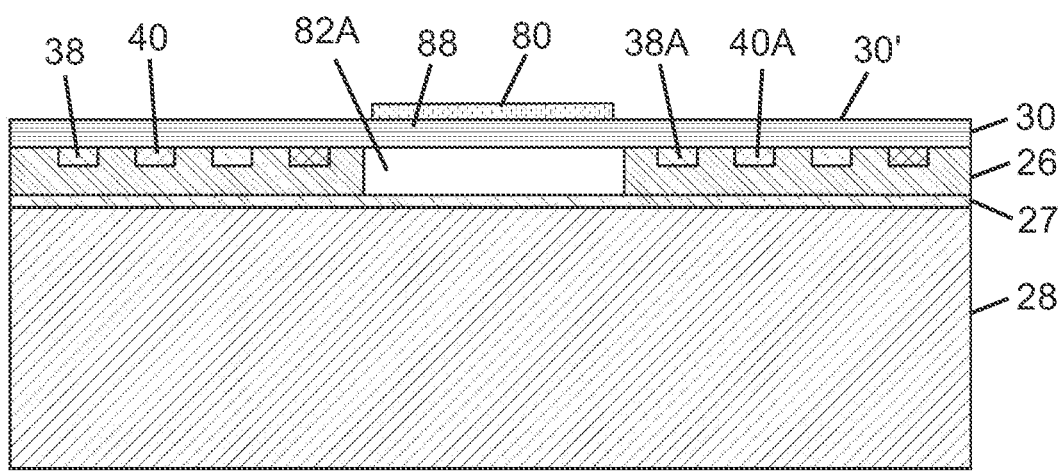
FIG._22B

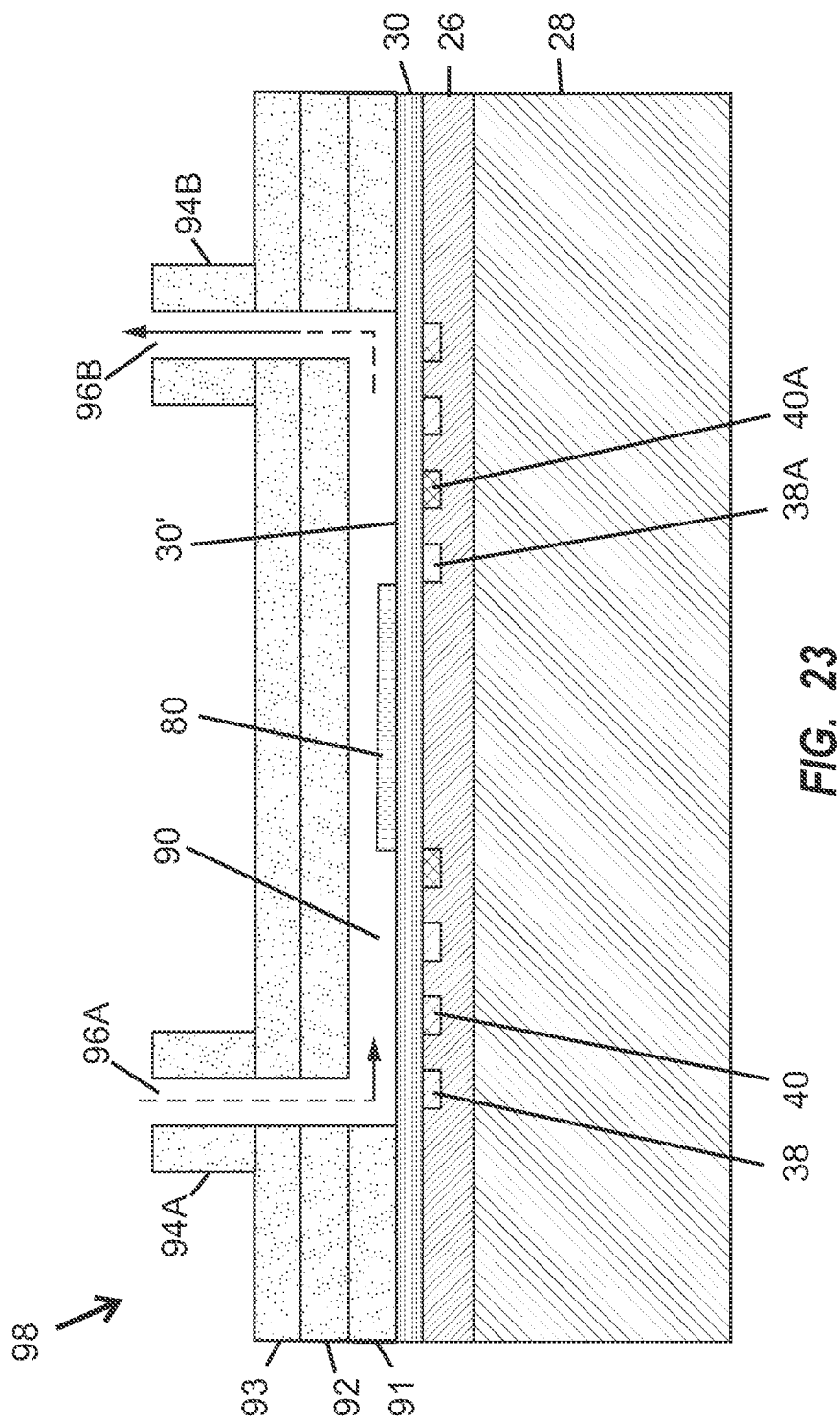
FIG._23

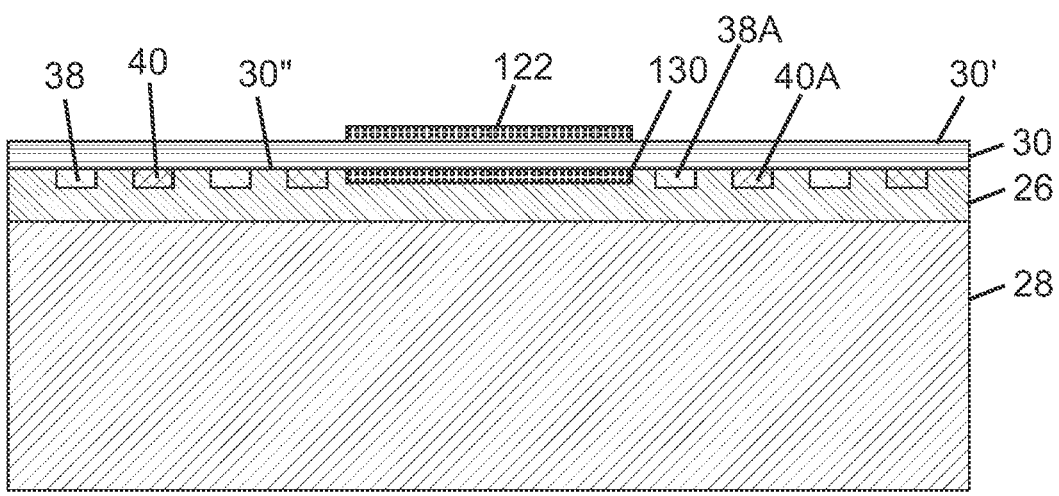
FIG._24A
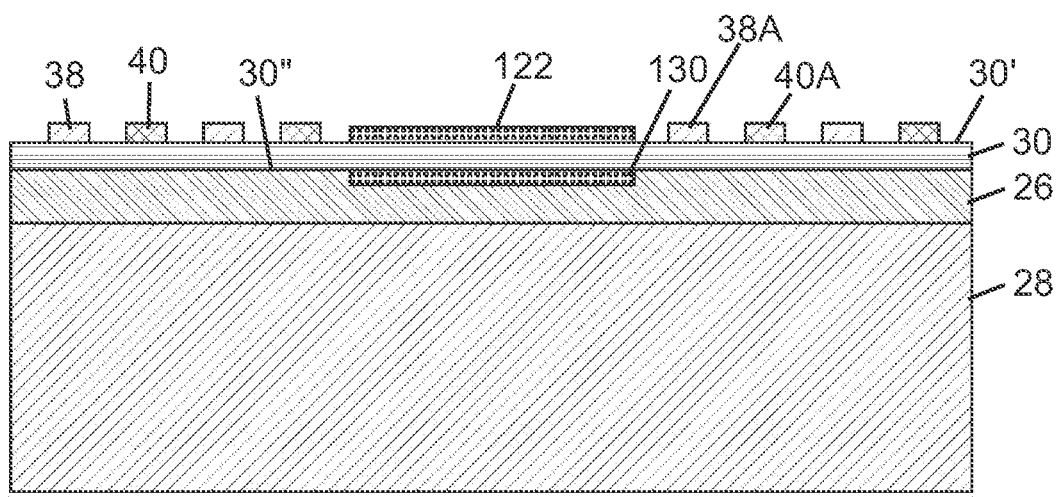
FIG._24B

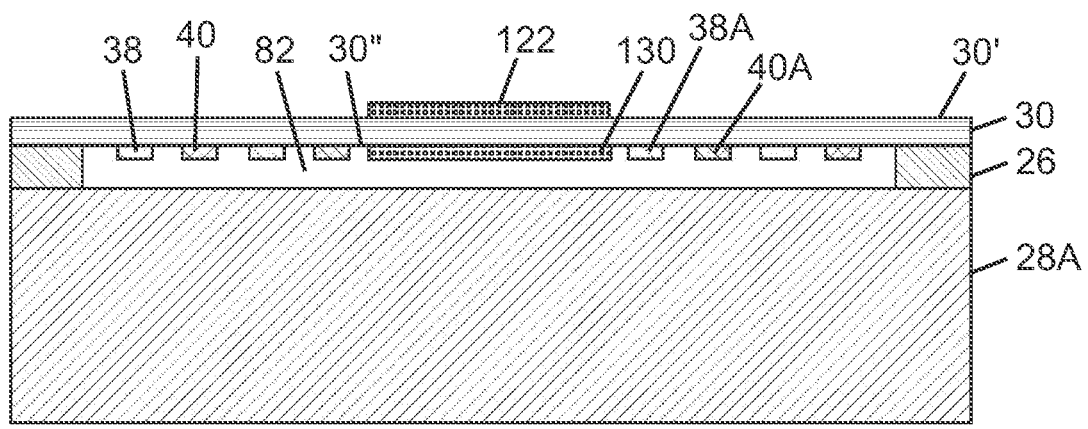
FIG._25A
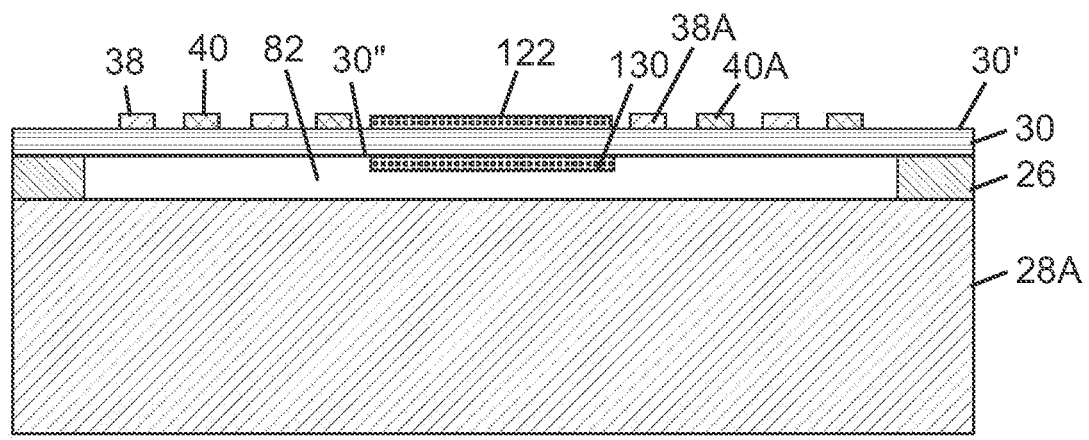
FIG._25B

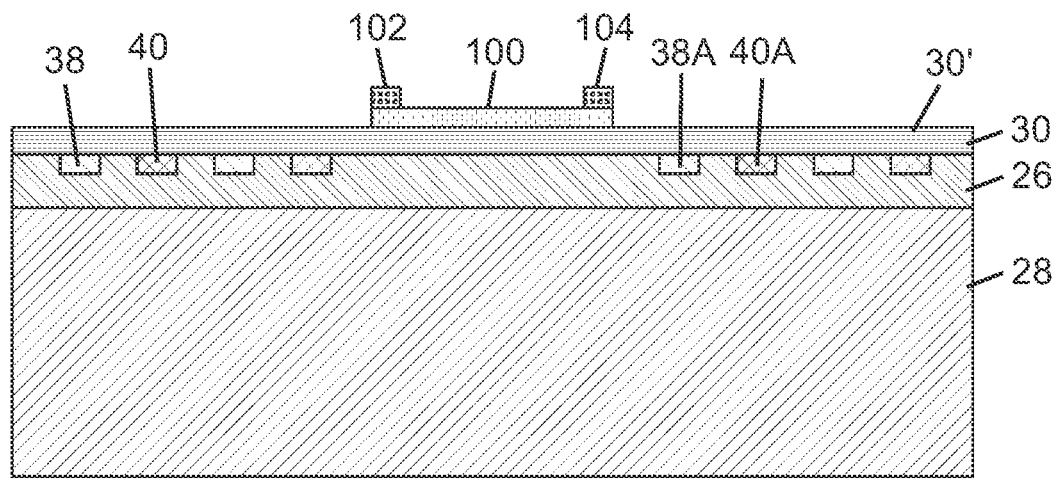
FIG._26
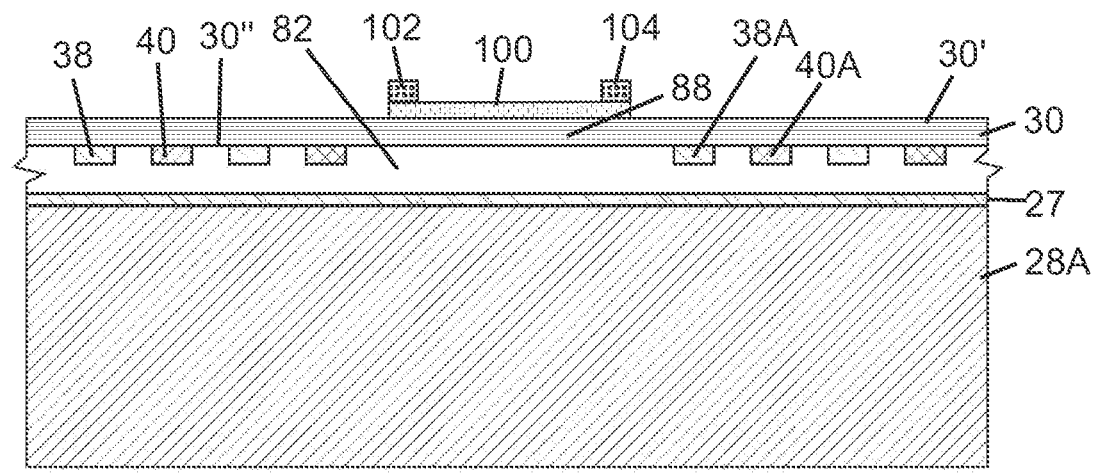
FIG._27

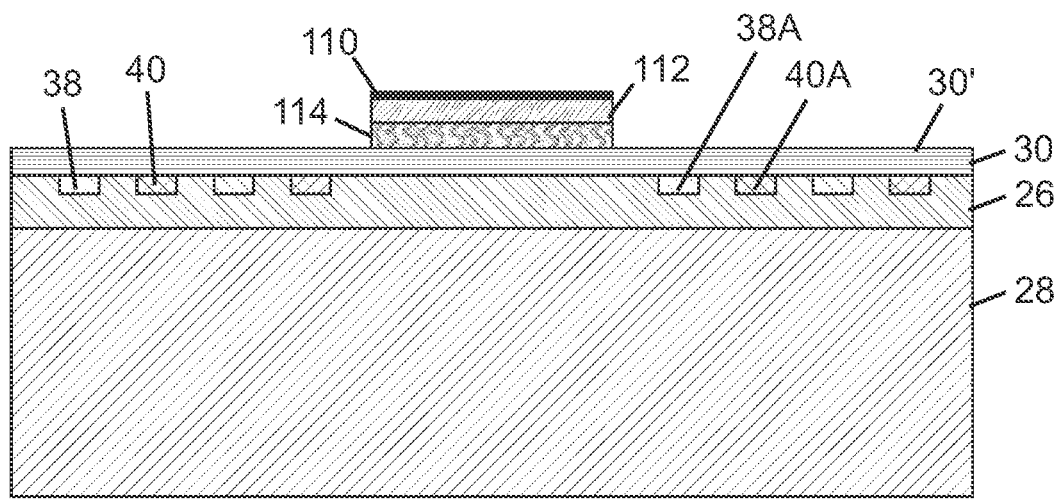
FIG._28
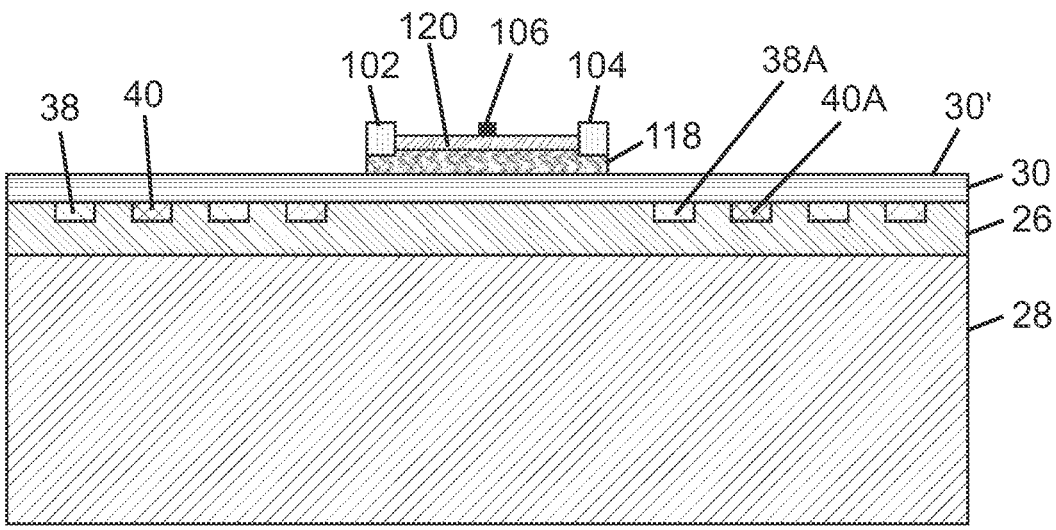
FIG._29

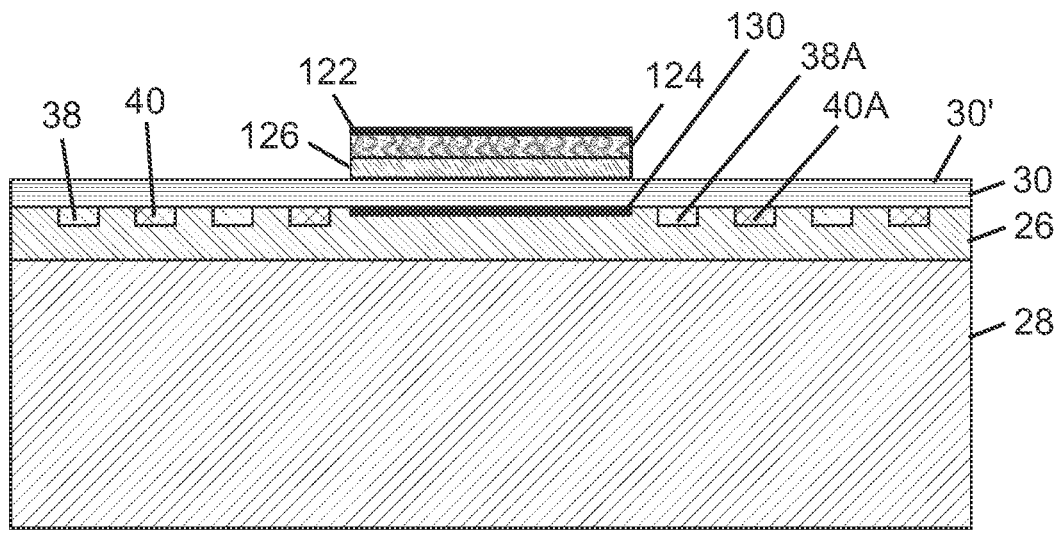
FIG._30
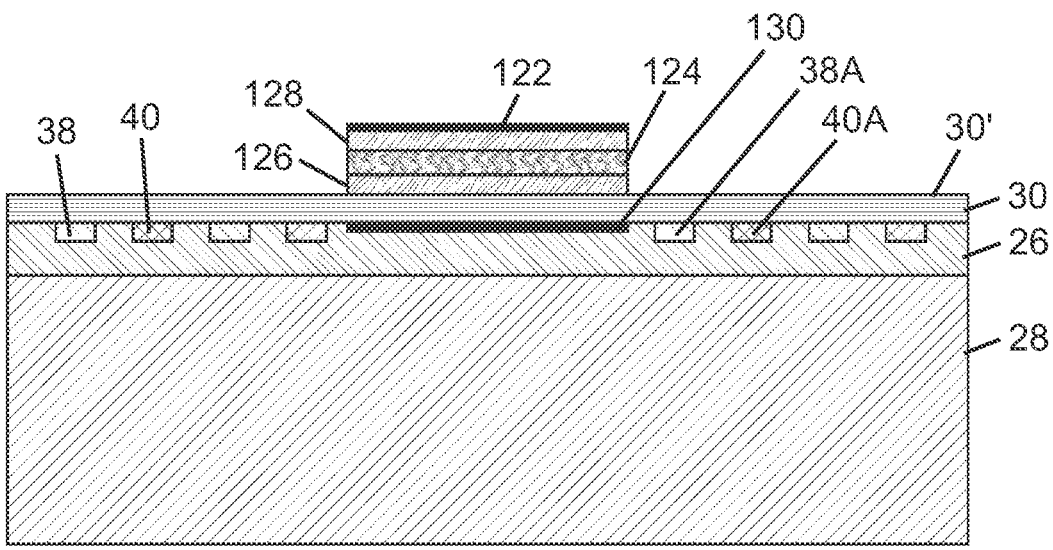
FIG._31

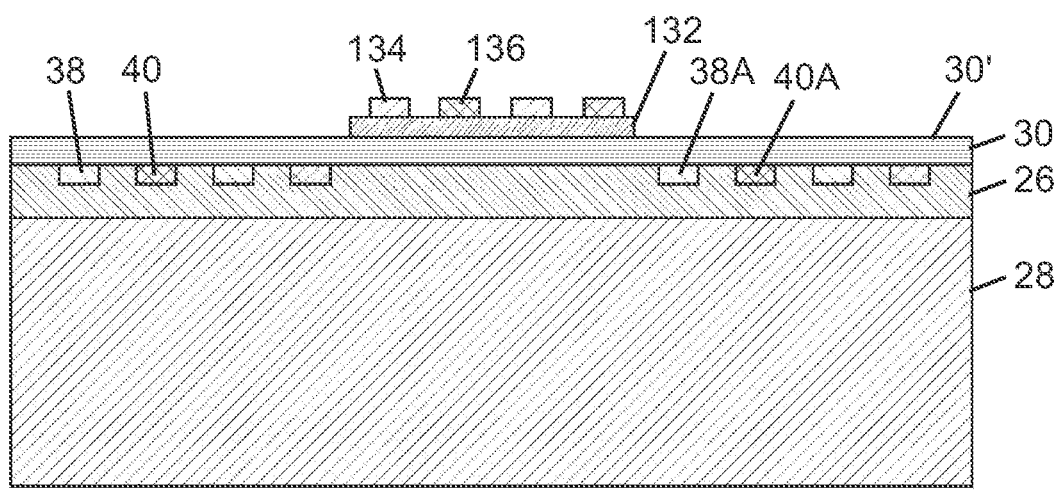
FIG._32

GUIDED WAVE DEVICES WITH SELECTIVELY LOADED PIEZOELECTRIC LAYERS

STATEMENT OF RELATED APPLICATIONS

This application is a continuation of U.S. patent application Ser. No. 15/087,277 filed on Mar. 3, 2016, which is a non-provisional of U.S. Provisional Patent Application No. 62/281,805 filed on Jan. 22, 2016. The entire contents of the foregoing application are hereby incorporated by reference as if set forth fully herein.

TECHNICAL FIELD

The present disclosure relates to electromechanical components utilizing acoustic wave propagation in piezoelectric layers, and in particular to thin film guided wave structures and methods for making such structures. Such structures may be used, for example, in radio frequency transmission circuits, sensor systems, signal processing systems, and the like.

BACKGROUND

Micro-electrical-mechanical system (MEMS) devices come in a variety of types and are utilized across a broad range of applications. One type of MEMS device that may be used in applications such as radio frequency (RF) circuitry is a MEMS vibrating device (also known as a resonator). A MEMS resonator generally includes a vibrating body in which a piezoelectric layer is in contact with one or more conductive layers. Piezoelectric materials acquire a charge when compressed, twisted, or distorted. This property provides a transducer effect between electrical and mechanical oscillations or vibrations. In a MEMS resonator, an acoustic wave may be excited in a piezoelectric layer in the presence of an alternating electrical signal, or propagation of an elastic wave in a piezoelectric material may lead to generation of an electrical signal. Changes in the electrical characteristics of the piezoelectric layer may be utilized by circuitry connected to a MEMS resonator device to perform one or more functions.

Guided wave resonators include MEMS resonator devices in which an acoustic wave is confined in part of a structure, such as in the piezoelectric layer. Confinement may be provided on at least one surface, such as by reflection at a solid/air interface, or by way of an acoustic mirror (e.g., a stack of layers referred to as a Bragg mirror) capable of reflecting acoustic waves. Such confinement may significantly reduce or avoid dissipation of acoustic radiation in a substrate or other carrier structure.

Various types of MEMS resonator devices are known, including devices incorporating interdigital transducer (IDT) electrodes and periodically poled transducers (PPTs) for lateral excitation. Examples of such devices are disclosed in U.S. Pat. Nos. 7,586,239 and 7,898,158 assigned to RF Micro Devices, Inc. (Greensboro, N.C., USA), wherein the contents of the foregoing patents are hereby incorporated by reference herein. Devices of these types are structurally similar to film bulk acoustic resonator (FBAR) devices, in that they each embody a suspended piezoelectric membrane. Suspended piezoelectric membrane devices, and particularly IDT-type membrane devices, are subject to limitations of finger resistivity and power handling due to poor thermal conduction in the structures. Additionally, IDT-type and PPT-type membrane devices may require stringent encapsulation, such as hermetic packaging with a near-vacuum environment.

Plate wave (also known as lamb wave) resonator devices are also known, such as described in U.S. Patent Application Publication No. 2010-0327995 A1 to Reinhardt et al. ("Reinhardt"). Compared to surface acoustic wave (SAW) devices, plate wave resonators may be fabricated atop silicon or other substrates and may be more easily integrated into radio frequency circuits. Reinhardt discloses a multi-frequency plate wave type resonator device including a silicon substrate, a stack of deposited layers (e.g., SiOC, SiN, $SiO_2$, and Mo) constituting a Bragg mirror, a deposited AlN piezoelectric layer, and a SiN passivation layer. At least one resonator includes a differentiation layer underlying a piezoelectric layer and arranged to modify the coupling coefficient of the resonator so as to have a determined useful bandwidth.

A representative MEMS guided wave device 10 of a conventional type known in the art is shown in FIG. 1. The device 10 includes a piezoelectric layer 12 arranged over a substrate 14, with top side electrodes in the form of an IDT 18 bounded laterally on two ends by a pair of reflector gratings 20. The IDT 18 includes electrodes with a first conducting section and a second conducting section that are inter-digitally dispersed on a top surface of the piezoelectric layer 12. The IDT 18 and the reflector gratings 20 include a number of fingers 24 that are connected to respective bus bars 22. For the reflector gratings 20, all fingers 24 connect to each bus bar 22. For the IDT 18, alternating fingers 24 connect to different bus bars 22, as depicted. (Actual reflector gratings 20 and IDT 18 may include larger numbers of fingers 24 than illustrated.) For the IDT 18, the fingers 24 are parallel to one another and aligned in an acoustic region that encompasses the area in which the IDT 18 and its corresponding reflector gratings 20 reside. At least one wave is generated when the IDT 18 is excited with electrical signals (e.g., supplied via bus bars 22). Acoustic waves essentially travel perpendicular to the length of the fingers 24 and essentially reside in the acoustic region encompassing the area including the IDT 18 and the reflector gratings 20. The operating frequency of the MEMS guided wave device 10 is a function of the pitch (P) representing the spacing between fingers 24 of the respective IDT 18. The wavelength λ of an acoustic wave transduced by the IDT 18 equals two times the pitch or separation distance between adjacent electrodes (fingers 24) of opposite polarity, and the wavelength λ also equals the separation distance between closest electrodes (e.g., fingers 24) of the same polarity.

In any of the above-described devices, access to exposed portions of an active region of a piezoelectric layer is limited, since an active region is typically obscured by presence of electrodes such as IDTs.

Additionally, it may be difficult to adjust one or more properties of a guided wave device, such as frequency, coupling coefficient, temperature compensation characteristics, velocity, phase, capacitance, or propagative wave mode, over portions or an entirety of a guided wave device. It may also be difficult to integrate one or more functional structures with a guided wave device without interfering with placement of electrodes such as IDTs.

Accordingly, there is a need for guided wave devices that can be efficiently manufactured, and that enable production of devices with enhanced utility.

SUMMARY

The present disclosure provides a micro-electrical-mechanical system (MEMS) guided wave device in which a plurality of electrodes is arranged below a piezoelectric layer and configured for transduction of a lateral acoustic wave in the piezoelectric layer. In certain implementations, the plurality of electrodes is embedded in a slow wave propagation layer arranged below the piezoelectric layer. In certain implementations, the piezoelectric layer embodies a single crystal piezoelectric material. In certain implementations, at least one guided wave confinement structure, such as a fast wave propagation material and/or a Bragg mirror, is arranged proximate to (e.g., below) the slow wave propagation layer and is configured to confine a lateral acoustic wave in the piezoelectric layer and the slow wave propagation layer. In certain implementations, at least one guided wave confinement structure includes a cavity or recess arranged below a piezoelectric layer, such that a portion of the piezoelectric layer is suspended. By arranging electrodes below the piezoelectric layer, a surface of the piezoelectric layer is available to permit one or more additions or modifications to be made to the piezoelectric layer, thereby enabling production of devices with enhanced utility.

Various additions or modifications to a piezoelectric layer may be made. In certain implementations, selective areas of piezoelectric layers may be trimmed (e.g., by ion milling and/or etching) to provide different thickness regions, thereby permitting adjustment of frequency and/or coupling strength, and enabling formation of multi-frequency devices (e.g., when electrodes of different periodicities are provided). In certain implementations, one or more loading materials are arranged in contact with one or more portions of a piezoelectric layer to locally alter a property of a lateral acoustic wave transduced in the piezoelectric layer, such as frequency, coupling coefficient, temperature compensation characteristics, velocity, capacitance, or propagative wave mode. In certain implementations, one or more regions of a piezoelectric layer are sandwiched between one or more embedded electrodes and one or more top side electrodes to yield one or more capacitive elements, such as may be optionally arranged in series or arranged in parallel with at least some embedded electrodes that are configured for transduction of a lateral acoustic wave in the piezoelectric layer. In certain implementations, at least one sensing material is arranged over at least a portion of the piezoelectric layer, wherein at least one property of the at least one sensing material is configured to change in exposure to an environment proximate to the at least one sensing material, and at least one wave propagation property of the piezoelectric layer may be altered in response to such change. In certain implementations, at least one functional layer is arranged on or over at least a portion of the piezoelectric layer, and configured to interact with the piezoelectric layer to provide mixed domain signal processing utility (such as, but not limited to, acousto-semiconductor, acousto-magnetic, or acousto-optic signal processing utility). In certain implementations, two or more of the preceding features may be combined.

In one aspect, a micro-electrical-mechanical system (MEMS) guided wave device includes a piezoelectric layer, a plurality of electrodes arranged in a slow wave propagation layer disposed below the piezoelectric layer and configured for transduction of a lateral acoustic wave in the piezoelectric layer; and a guided wave confinement structure arranged proximate to the slow wave propagation layer and configured to confine the lateral acoustic wave in the piezoelectric layer and the slow wave propagation layer; wherein the piezoelectric layer includes a first thickness region and a second thickness region, and a thickness of the first thickness region differs from a thickness of the second thickness region.

In certain embodiments, the piezoelectric layer includes a single crystal piezoelectric material. In certain embodiments, the MEMS guided wave device further includes a bonded interface between the piezoelectric layer and at least one underlying layer of the MEMS guided wave device.

In certain embodiments, the plurality of electrodes includes a first plurality of electrodes arranged against or adjacent to the first thickness region and configured for transduction of a first lateral acoustic wave having a wavelength $\lambda_1$ in the first thickness region, and includes a second plurality of electrodes arranged against or adjacent to the second thickness region and configured for transduction of a second lateral acoustic wave having a wavelength $\lambda_2$ in the second thickness region, wherein $\lambda_2$ differs from $\lambda_1$.

In certain embodiments, the first plurality of electrodes includes a first interdigital transducer (IDT) including a first two groups of electrodes of opposing polarity and including a first spacing between adjacent electrodes of opposing polarity of the first two groups of electrodes of opposing polarity; the second plurality of electrodes includes a second interdigital transducer (IDT) including a second two groups of electrodes of opposing polarity and including a second spacing between adjacent electrodes of opposing polarity of the second two groups of electrodes of opposing polarity; and the second spacing differs from the first spacing.

In certain embodiments, one or more electrodes or electrode groups configured for transduction of a lateral acoustic wave in a piezoelectric layer include one or more periodically poled transducers (PPTs).

In certain embodiments, the guided wave confinement structure includes a fast wave propagation layer or a Bragg mirror. In certain embodiments, the plurality of electrodes is arranged in contact with the piezoelectric layer. In certain embodiments, the MEMS guided wave device further includes a substrate underlying the guided wave confinement structure.

In certain embodiments, the MEMS guided wave device further includes at least one functional layer at least partially covering the piezoelectric layer. In certain embodiments, the MEMS guided wave device further includes a first functional layer at least partially covering the first thickness region, and a second functional layer at least partially covering the second thickness region, wherein the second functional layer differs from the first functional layer in at least one of material composition, thickness, or material concentration.

In certain embodiments, the MEMS guided wave device further includes at least one loading material arranged on or proximate to the piezoelectric layer and configured to locally alter a property of the lateral acoustic wave in the piezoelectric layer.

In another aspect, a method of fabricating a MEMS guided wave device includes defining a plurality of electrodes on a piezoelectric layer; depositing a slow wave propagation layer over the plurality of electrodes and at least a portion of the piezoelectric layer; providing a guided wave confinement structure on or adjacent to the slow wave propagation layer, wherein the guided wave confinement structure is configured to confine a lateral acoustic wave in the piezoelectric layer and the slow wave propagation layer; and locally thinning the piezoelectric layer to define a first thickness region and a second thickness region, wherein a thickness of the first thickness region differs from a thickness of the second thickness region.

In certain embodiments, the method further includes planarizing a surface of the slow wave propagation layer prior to said providing of the guided wave confinement structure on or adjacent to the slow wave propagation layer. In certain embodiments, said local thinning of the piezoelectric layer includes etching. In certain embodiments, the method further includes depositing at least one of a functional material or a loading material at least partially covering the piezoelectric layer after said local thinning of the piezoelectric layer.

In another aspect, a method of fabricating a MEMS guided wave device includes defining a plurality of electrodes in a slow wave propagation layer; bonding or depositing a piezoelectric layer on or over the slow wave propagation layer; and locally thinning the piezoelectric layer to define a first thickness region and a second thickness region, wherein a thickness of the first thickness region differs from a thickness of the second thickness region.

In certain embodiments, said defining of the plurality of electrodes in the slow wave propagation layer includes defining a plurality of recesses in the slow wave propagation layer; and depositing electrode material in the plurality of recesses. In certain embodiments, the method further includes planarizing a surface of the slow wave propagation layer prior to said bonding or depositing of the piezoelectric layer on or over the slow wave propagation layer.

In another aspect, a micro-electrical-mechanical system (MEMS) guided wave device includes a piezoelectric layer, a slow wave propagation layer disposed below the piezoelectric layer, a plurality of electrodes configured for transduction of a lateral acoustic wave in the piezoelectric layer, a guided wave confinement structure arranged proximate to the slow wave propagation layer and configured to confine the lateral acoustic wave in the piezoelectric layer and the slow wave propagation layer; and at least one loading material configured to locally alter a property of the lateral acoustic wave in the piezoelectric layer, wherein one of (i) the plurality of electrodes or (ii) the at least one loading material is arranged in the slow wave propagation layer, and the other one of (i) the plurality of electrodes or (ii) the at least one loading material is arranged over the piezoelectric layer. In certain embodiments, the plurality of electrodes is arranged in the slow wave propagation layer, and the at least one loading material is arranged over the piezoelectric layer. In certain embodiments, the plurality of electrodes is arranged over the piezoelectric layer, and the at least one loading material is arranged in the slow wave propagation layer.

In certain embodiments, the piezoelectric layer defines a first thickness region and a second thickness region, wherein a thickness of the first thickness region differs from a thickness of the second thickness region.

In certain embodiments, the at least one loading material includes a metal, a fast wave propagation material, a dielectric material, a magnetic material or a magnetically responsive material, or an epitaxial film grown on at least one portion of the piezoelectric layer.

In certain embodiments, the at least one loading material is arranged in contact with an active region of the piezoelectric layer. In certain embodiments, the at least one loading material is arranged in contact with a non-active region of the piezoelectric layer. In certain embodiments, the MEMS guided wave device further includes at least one functional layer arranged over at least a portion of the piezoelectric layer.

In another aspect, a method of fabricating a MEMS guided wave device includes: arranging one of (i) a plurality of electrodes or (ii) at least one loading material in a slow wave propagation layer; arranging the other one of (i) the plurality of electrodes or (ii) the at least one loading material over a piezoelectric layer; and providing a guided wave confinement structure proximate to the slow wave propagation layer; wherein the plurality of electrodes is configured for transduction of a lateral acoustic wave in the piezoelectric layer; wherein the guided wave confinement structure is configured to confine the lateral acoustic wave in the piezoelectric layer and the slow wave propagation layer; and wherein the at least one loading material is configured to locally alter a property of the lateral acoustic wave transduced in the piezoelectric layer.

In certain embodiments, the method further includes locally thinning the piezoelectric layer to define a first thickness region and a second thickness region, wherein a thickness of the first thickness region differs from a thickness of the second thickness region.

In another aspect, a micro-electrical-mechanical system (MEMS) guided wave device includes a single crystal piezoelectric layer; a slow wave propagation layer disposed below the single crystal piezoelectric layer; at least one embedded electrode arranged in the slow wave propagation layer; at least one top side electrode arranged over the single crystal piezoelectric layer; and a guided wave confinement structure arranged proximate to the slow wave propagation layer; wherein either (i) the at least one embedded electrode or (ii) the at least one top side electrode includes a plurality of electrodes configured for transduction of at least one lateral acoustic wave in the single crystal piezoelectric layer; wherein the guided wave confinement structure is configured to confine the at least one lateral acoustic wave in the single crystal piezoelectric layer and the slow wave propagation layer; and wherein at least one region of the single crystal piezoelectric layer is sandwiched between an embedded electrode of the at least one embedded electrode and a top side electrode of the at least one top side electrode.

In certain embodiments, the MEMS guided wave device further includes a conductive via or trace defined through the single crystal piezoelectric layer and providing an electrically conductive path between the at least one top side electrode and the at least one embedded electrode.

In certain embodiments, said at least one region of the single crystal piezoelectric layer sandwiched between the embedded electrode of the at least one embedded electrode and the top side electrode of the at least one top side electrode forms at least one capacitive element.

In certain embodiments, the at least one capacitive element is electrically coupled in series with the at least one embedded electrode. In certain embodiments, the at least one capacitive element is electrically coupled in parallel with the at least one embedded electrode.

In certain embodiments, the at least one embedded electrode includes first and second embedded electrodes that are electrically isolated relative to one another, and the at least one top side electrode includes first and second top side electrodes that are electrically isolated relative to one another and arranged to interact with the first and second embedded electrodes to provide non-contact sensing utility.

In certain embodiments, the plurality of electrodes configured for transduction of the at least one lateral acoustic wave in the single crystal piezoelectric layer includes an interdigital transducer (IDT) including two groups of electrodes of opposing polarity.

In certain embodiments, the single crystal piezoelectric layer includes a first thickness region and a second thickness region, and a thickness of the first thickness region differs from a thickness of the second thickness region.

In certain embodiments, the at least one top side electrode is non-coincident with an active region of the single crystal piezoelectric layer. In certain embodiments, at least one of a functional material or a loading material is arranged over at least a portion of the single crystal piezoelectric layer.

In certain embodiments, the plurality of electrodes configured for transduction of the at least one lateral acoustic wave in the single crystal piezoelectric layer includes a first group of input electrodes configured for transduction of a first lateral acoustic wave in the single crystal piezoelectric layer and includes a second group of input electrodes configured for transduction of a second lateral acoustic wave in the single crystal piezoelectric layer; the embedded electrode and the top side electrode sandwiching the at least one region of the single crystal piezoelectric layer in combination form an output electrode, with the output electrode being positioned laterally between the first group of input electrodes and the second group of input electrodes; and the first group of input electrodes, the second group of input electrodes, and the output electrode are configured to interact with the single crystal piezoelectric layer to provide non-linear elastic convolver utility.

In certain embodiments, the at least one embedded electrode includes the first group of input electrodes and the second group of input electrodes. In certain embodiments, the at least one top side electrode includes the first group of input electrodes and the second group of input electrodes. In certain embodiments, the first group of input electrodes includes a first interdigital transducer, and the second group of input electrodes includes a second interdigital transducer.

In another aspect, a method of fabricating a MEMS guided wave device includes: providing at least one embedded electrode in a slow wave propagation layer; arranging a single crystal piezoelectric layer over the slow wave propagation layer; providing at least one top side electrode over the single crystal piezoelectric layer; and providing a guided wave confinement structure proximate to the slow wave propagation layer; wherein either (i) the at least one embedded electrode or (ii) the at least one top side electrode includes a plurality of electrodes configured for transduction of a lateral acoustic wave in the single crystal piezoelectric layer; wherein the guided wave confinement structure is configured to confine the lateral acoustic wave in the single crystal piezoelectric layer and the slow wave propagation layer; and wherein one or more regions of the single crystal piezoelectric layer are sandwiched between (i) one or more embedded electrodes of the at least one embedded electrode and (ii) one or more top side electrodes of the at least one top side electrode.

In another aspect, a micro-electrical-mechanical system (MEMS) guided wave device includes a single crystal piezoelectric layer; a substrate; a cavity or recess arranged between the substrate and a suspended portion of the single crystal piezoelectric layer; a first group of input electrodes configured for transduction of a first lateral acoustic wave in the suspended portion of the single crystal piezoelectric layer; a second group of input electrodes configured for transduction of a second lateral acoustic wave in the suspended portion of the single crystal piezoelectric layer; and an output electrode including a first plate arranged over the suspended portion of the single crystal piezoelectric layer and a second plate arranged under the suspended portion of the single crystal piezoelectric layer; wherein the first group of input electrodes, the second group of input electrodes, and the output electrode are configured to interact with the single crystal piezoelectric layer to provide non-linear elastic convolver utility.

In certain embodiments, the first group of input electrodes and the second group of input electrodes are arranged over the suspended portion of the single crystal piezoelectric layer. In certain embodiments, the first group of input electrodes and the second group of input electrodes are arranged under the suspended portion of the single crystal piezoelectric layer In another aspect, a micro-electrical-mechanical system (MEMS) guided wave device includes a piezoelectric layer; a plurality of electrodes disposed below the piezoelectric layer and configured for transduction of at least one lateral acoustic wave in the piezoelectric layer; a guided wave confinement structure configured to confine the at least one lateral acoustic wave in the piezoelectric layer; and at least one sensing material arranged over at least a portion of the piezoelectric layer; wherein at least one property of the at least one sensing material is configured to change in exposure to an environment proximate to the at least one sensing material.

In certain embodiments, a wave propagation property of the piezoelectric layer is configured to be altered in response to the change of the at least one property of the at least one sensing material.

In certain embodiments, the MEMS guided wave device further includes a slow wave propagation layer disposed between the piezoelectric layer and the guided wave confinement structure, wherein the plurality of electrodes is arranged in the slow wave propagation layer.

In certain embodiments, the at least one property of the at least one sensing material is configured to change responsive to: a change of presence or concentration of one or more chemical species in the environment; a change of presence or concentration of one or more biological species in the environment; a change of presence or strength of an electric or magnetic field in the environment; a change of temperature in the environment; or a change of presence, type, or amount of radiation in the environment.

In certain embodiments, the plurality of electrodes includes an interdigital transducer (IDT) including two groups of electrodes of opposing polarity.

In certain embodiments, the at least one sensing material includes a first sensing material and a second sensing material; wherein the first sensing material differs from the second sensing material in at least one of composition, concentration, area, amount, or position.

In certain embodiments, the guided wave confinement structure includes a cavity or recess, a portion of the piezoelectric layer is disposed over the cavity or recess to define a suspended portion of the piezoelectric layer, and the at least one sensing material is arranged on or over the suspended portion of the piezoelectric layer.

In another aspect, a micro-electrical-mechanical system (MEMS) guided wave device includes: a piezoelectric layer; a plurality of electrodes disposed below the piezoelectric layer and configured for transduction of at least one lateral acoustic wave in the piezoelectric layer; and at least one underlying layer arranged proximate to the piezoelectric layer and defining a sealed cavity or recess bounded by a suspended portion of the piezoelectric layer; wherein a wave propagation property of the piezoelectric layer is configured to change in response to exposure of the piezoelectric layer to a change in pressure of an environment proximate to the piezoelectric layer.

In certain embodiments, the at least one underlying layer includes a slow wave propagation layer disposed below a portion of the piezoelectric layer, wherein the plurality of electrodes is arranged in the slow wave propagation layer.

In certain embodiments, the plurality of electrodes is supported by the suspended portion of the piezoelectric layer.

In certain embodiments, the underlying layer includes a guided wave confinement structure configured to confine the at least one lateral acoustic wave in the piezoelectric layer.

In another aspect, a method of fabricating a MEMS guided wave device includes: defining a plurality of electrodes on a first surface of a piezoelectric layer; depositing a slow wave propagation layer over the plurality of electrodes and at least a portion of the first surface of the piezoelectric layer; providing a guided wave confinement structure on or adjacent to the slow wave propagation layer; and depositing at least one sensing material arranged over at least a portion of a second surface of the piezoelectric layer; wherein the plurality of electrodes is configured for transduction of at least one lateral acoustic wave in the piezoelectric layer; wherein the guided wave confinement structure is configured to confine the at least one lateral acoustic wave in the piezoelectric layer and the slow wave propagation layer; and wherein at least one property of the at least one sensing material is configured to change in exposure to an environment proximate to the at least one sensing material.

In one aspect, a micro-electrical-mechanical system (MEMS) mixed domain guided wave device includes: a piezoelectric layer; a plurality of electrodes disposed below the piezoelectric layer and configured for transduction of at least one lateral acoustic wave in the piezoelectric layer; a guided wave confinement structure configured to confine the at least one lateral acoustic wave in the piezoelectric layer; and at least one functional layer arranged on or over at least a portion of the piezoelectric layer, and configured to interact with the at least one lateral acoustic wave in the piezoelectric layer to provide mixed domain signal processing utility.

In certain embodiments, the MEMS mixed domain guided wave device further includes a slow wave propagation layer disposed below the piezoelectric layer, wherein the plurality of electrodes is arranged in the slow wave propagation layer.

In certain embodiments, the mixed domain signal processing utility includes acousto-semiconductor, acousto-magnetic, or acousto-optic signal processing utility.

In certain embodiments, the at least one functional layer includes one or more of a conductive material, a semiconducting material, or a dielectric material. In certain embodiments, the at least one functional layer includes one or more of a piezoelectric material, a ferroelectric material, a ferromagnetic material, or a magnetostrictive material. In certain embodiments, the at least one functional layer includes one or more of an optically responsive material, a pyroelectric material, or an organic material.

In certain embodiments, the guided wave confinement structure includes a cavity or recess, a portion of the piezoelectric layer is disposed over the cavity or recess to define a suspended portion of the piezoelectric layer, and the at least one functional layer is arranged on or over the suspended portion of the piezoelectric layer.

In certain embodiments, the at least one functional layer includes at least one semiconducting layer, a first electrical contact arranged over a first portion of the at least one semiconducting layer, and a second electrical contact arranged over a second portion of the at least one semiconducting layer; and the at least one semiconducting layer is configured to interact with the piezoelectric layer to provide acoustic amplification utility.

In certain embodiments, the at least one functional layer includes a first semiconducting layer having a first bandgap and a second semiconducting layer having a second bandgap that differs from the first bandgap, at least one electrical contact is in electrical communication with at least one of the first semiconducting layer or the second semiconducting layer; and the first semiconducting layer and the second semiconducting layer form a heterostructure configured to form a two-dimensional electron gas at an interface between the first semiconducting layer and the second semiconducting layer. In certain embodiments, the at least one functional layer includes at least one semiconducting layer; and a source contact, a gate contact, and a drain contact are operatively arranged with the at least one semiconducting layer to serve as a transistor.

In certain embodiments, the at least one functional layer includes at least one semiconducting layer; the plurality of electrodes includes a first group of input electrodes configured for transduction of a first lateral acoustic wave in the piezoelectric layer and a second group of input electrodes configured for transduction of a second lateral acoustic wave in the piezoelectric layer; an outer conductive layer is arranged over the at least one semiconducting layer, and an inner conductive layer is arranged under a portion of the piezoelectric layer, whereby an output electrode is formed including the outer conductive layer, the at least one semiconducting layer, the portion of the piezoelectric layer, and the inner conductive layer; the output electrode is positioned laterally between the first group of input electrodes and the second group of input electrodes; and the first group of input electrodes, the second group of input electrodes, and the output electrode are configured to interact with the piezoelectric layer to provide acoustoelectric convolver utility.

In certain embodiments, the at least one functional layer includes at least one semiconducting layer; the plurality of electrodes includes a first group of input electrodes configured for transduction of a first lateral acoustic wave in the piezoelectric layer and a second group of input electrodes configured for transduction of a second lateral acoustic wave in the piezoelectric layer; output electrodes of opposing polarity are provided in ohmic contact with the at least one semiconducting layer; and the first group of input electrodes, the second group of input electrodes, and the output electrodes are configured to interact with the piezoelectric layer to provide acoustic wave convolver with bidirectional amplification utility.

In certain embodiments, the piezoelectric layer comprises a single crystal piezoelectric material.

In certain embodiments, at least some electrodes of the plurality of electrodes include an interdigital transducer (IDT) including two groups of electrodes of opposing polarity. In certain embodiments, the plurality of electrodes includes a first interdigital transducer (IDT) including a first two groups of electrodes of opposing polarity, and a second interdigital transducer (IDT) including a second two groups of electrodes of opposing polarity, and the at least a portion of the piezoelectric layer bearing the at least one functional layer is arranged generally between the first IDT and the second IDT. In certain embodiments, the MEMS mixed domain guided wave device further includes a substrate underlying the guided wave confinement structure.

In another aspect, a method of fabricating a MEMS mixed domain guided wave device includes: defining a plurality of electrodes in or on a slow wave propagation layer; bonding or depositing a piezoelectric layer on or over the slow wave propagation layer; and providing at least one functional layer arranged on or over at least a portion of the piezoelectric layer; wherein the plurality of electrodes is configured for transduction of at least one lateral acoustic wave in the piezoelectric layer; and wherein the at least one functional layer is configured to interact with the piezoelectric layer to provide mixed domain signal processing utility.

In certain embodiments, the at least one functional layer includes one or more of a conductive material, a semiconducting material, a dielectric material, a piezoelectric material, a ferroelectric material, a ferromagnetic material, a magnetic material, a magnetostrictive material, an optically responsive material, a pyroelectric material, or an organic material.

In certain embodiments, said providing the at least one functional layer includes depositing, growing, or bonding the at least one functional layer on or over at least a portion of the piezoelectric layer.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present invention and realize additional aspects thereof after reading the following detailed description in association with the accompanying drawings.

BRIEF DESCRIPTION OF THE DRAWINGS

The accompanying drawings illustrate several aspects of the invention, and together with the description serve to explain the principles of the invention. Features in the drawings are not to scale unless specifically indicated to the contrary herein.

FIGS. 2A-2D are cross-sectional views of portions of a MEMS guided wave device during various steps of fabrication utilizing a first fabrication method, with the resulting MEMS guided wave device (shown in FIG. 2D) including an exposed piezoelectric layer and electrodes embedded in an underlying layer, useable as a building block for devices according to various embodiments of the present disclosure.

FIGS. 3A-3D are cross-sectional views of portions of a MEMS guided wave device during various steps of fabrication utilizing a second fabrication method, with the resulting MEMS guided wave device (shown in FIG. 3D) including an exposed piezoelectric layer and electrodes embedded in an underlying layer, useable as a building block for devices according to various embodiments of the present disclosure.

FIG. 4 is a cross-sectional view of another MEMS guided wave device including an exposed piezoelectric layer and electrodes embedded in an underlying layer, useable as a building block for devices according to various embodiments of the present disclosure.

FIG. 5 is a cross-sectional view of yet another MEMS guided wave device including an exposed piezoelectric layer and electrodes embedded in an underlying layer, useable as a building block for devices according to various embodiments of the present disclosure.

FIG. 7B is a cross-sectional view of the multi-frequency MEMS guided wave device of FIG. 7A taken along section line "A"-"A".

FIG. 8 is a cross-sectional view of a MEMS guided wave device including an exposed piezoelectric layer and electrodes embedded in an underlying layer, with a loading material arranged over the piezoelectric layer and overlying the group of embedded electrodes, according to one embodiment of the present disclosure.

FIG. 9 is a cross-sectional view of a MEMS guided wave device including an exposed piezoelectric layer and electrodes embedded in an underlying layer, with a loading material arranged over the piezoelectric layer between two groups of embedded electrodes, according to one embodiment of the present disclosure.

FIG. 10 is a cross-sectional view of a MEMS guided wave device including an exposed piezoelectric layer and electrodes embedded in an underlying layer, with a first loading material arranged over the piezoelectric layer over a first group of embedded electrodes, and a second loading material arranged over the piezoelectric layer over a second group of embedded electrodes, according to one embodiment of the present disclosure.

FIGS. 11A-11D are cross-sectional views of portions of a MEMS guided wave device during various steps of fabrication, with the resulting MEMS guided wave device (shown in FIG. 11D) including two groups of electrodes arranged over a piezoelectric layer, with loading materials embedded in a slow wave propagation material arranged below the piezoelectric layer below each group of electrodes, according to one embodiment of the present disclosure.

FIG. 12A is a top plan view of a multi-frequency MEMS guided wave device including an exposed piezoelectric layer, a first group of embedded electrodes arranged below a first thickness region of the piezoelectric layer, a first loading material region arranged over a portion of the first thickness region, a second group of embedded electrodes arranged below a second thickness region of the piezoelectric layer, and second loading material regions arranged over portions of the second thickness region, according to one embodiment of the present disclosure.

FIG. 13A is a top plan view of a MEMS guided wave device including an exposed piezoelectric layer and electrodes embedded in an underlying layer, with first and second top side electrodes overlying portions of the piezoelectric layer as well as embedded electrodes to provide non-contact capacitive sensing utility, according to one embodiment of the present disclosure.

FIG. 13B is a cross-sectional view of the MEMS guided wave device of FIG. 13A taken along section line "C"-"C".

FIG. 14A is a top plan view of a MEMS guided wave device including an exposed piezoelectric layer and electrodes embedded in an underlying layer, with one exposed top side electrode overlying the piezoelectric layer as well as an embedded electrode, and with an opening in the piezoelectric layer to expose an embedded electrode, thereby yielding a capacitor in series with an interdigital transducer, according to one embodiment of the present disclosure.

FIG. 14B is a cross-sectional view of the MEMS guided wave device of FIG. 14A taken along section line "D"-"D".

FIG. 14C is a cross-sectional view of a MEMS guided wave device similar to that of FIGS. 14A and 14B, following addition of contact material extending through the opening to make an ohmic contact with the piezoelectric layer.

FIG. 14D is a cross-sectional view of an alternative MEMS guided wave device similar to that of FIG. 14C, but wherein first and second openings are made through the piezoelectric layer, following addition of contact material extending through each opening to make first and second ohmic contacts with the piezoelectric layer without formation of a capacitor element, according to one embodiment of the present disclosure.

FIG. 15A is a top plan view of a MEMS guided wave device including an exposed piezoelectric layer and electrodes embedded in an underlying layer, with exposed top side electrodes overlying the piezoelectric layer as well as embedded electrodes, yielding a capacitor in parallel with an interdigital transducer, according to one embodiment of the present disclosure.

FIG. 16A is a top plan view of a MEMS guided wave device including an exposed piezoelectric layer arranged over electrodes of two resonators (including interdigital transducers and gratings) embedded in an underlying layer, with sensing material arranged on the piezoelectric layer over a sensing resonator to provide sensing utility, and with a reference resonator being devoid of sensing material arranged over the piezoelectric layer, according to one embodiment of the present disclosure.

FIG. 16B is a cross-sectional view of the MEMS guided wave device of FIG. 16A taken along section line "G"-"G".

FIG. 17A is a top plan view of a MEMS guided wave device including an exposed piezoelectric layer arranged over electrodes forming two delay lines (each including two interdigital transducers (IDTs)) embedded in an underlying layer, including a sensor delay line having sensing material overlying the piezoelectric layer and arranged between a first pair of IDTs, and including a reference delay line being devoid of sensing material arranged between a second pair of IDTs, according to one embodiment of the present disclosure.

FIG. 17B is a cross-sectional view of the MEMS guided wave device of FIG. 17A taken along section line "H"-"H".

FIG. 18 is a top plan view of a MEMS guided wave device including an exposed piezoelectric layer arranged over electrodes forming four resonators (each including interdigital transducers and gratings) embedded in an underlying layer, with each resonator including a different sensing material arranged over the piezoelectric layer between paired interdigital transducers to provide sensing utility, according to one embodiment of the present disclosure.

FIG. 19A is a top plan view of a MEMS guided wave device including an exposed piezoelectric layer with internal electrodes supported by the piezoelectric layer and forming a resonator (including a pair of interdigital transducers arranged between reflector gratings), with a portion of the piezoelectric layer supporting the internal electrodes being suspended over a cavity or recess defined in an underlying layer to provide pressure sensing utility, according to one embodiment of the present disclosure.

FIG. 20A is a top plan view of a MEMS guided wave device including an exposed piezoelectric layer with internal electrodes embedded in an underlying layer and forming a resonator (including a pair of interdigital transducers arranged between reflector gratings), with a central portion of the piezoelectric layer not in contact with the electrodes being suspended over a cavity or recess defined in the underlying layer to provide pressure sensing utility, according to one embodiment of the present disclosure.

FIG. 21A is a top plan view of a MEMS guided wave device including an exposed piezoelectric layer with internal electrodes supported by the piezoelectric layer and forming a delay line (including a pair of laterally spaced interdigital transducers), with a portion of the piezoelectric layer supporting the internal electrodes being suspended over a cavity or recess defined in an underlying layer, and with a functional material or sensing material arranged over the suspended portion of the piezoelectric layer, according to one embodiment of the present disclosure.

FIG. 22B is a cross-sectional view of the MEMS guided wave device of FIG. 22A taken along section line "L"-"L".

FIG. 23 is a cross-sectional view of a microfluidic device incorporating a MEMS guided wave device including an exposed piezoelectric layer and electrodes embedded in an underlying layer, with sensing material arranged over the piezoelectric layer in an area between two interdigital transducers to provide sensing utility, according to one embodiment of the present disclosure.

FIG. 24A is a cross-sectional view of a MEMS guided wave device including an exposed piezoelectric layer with an internal pair of laterally spaced interdigital transducers serving as input electrodes and including an output electrode including an internal plate electrode and an external plate electrode sandwiching a central portion of the piezoelectric layer, with the MEMS guided wave device suitable for providing non-linear elastic convolver utility, according to one embodiment of the present disclosure.

FIG. 24B is a cross-sectional view of a MEMS guided wave device including a piezoelectric layer with an external pair of laterally spaced interdigital transducers serving as input electrodes and including an output electrode including an internal plate electrode and an external plate electrode sandwiching a central portion of the piezoelectric layer, with the MEMS guided wave device suitable for providing non-linear elastic convolver utility, according to one embodiment of the present disclosure.

FIG. 25A is a cross-sectional view of a MEMS guided wave device including an exposed piezoelectric layer, with a portion of the piezoelectric layer being suspended over a cavity or recess in an underlying layer, including internal electrodes supported by the suspended portion of piezoelectric layer and forming an internal pair of laterally spaced interdigital transducers serving as input electrodes, and including an output electrode including an internal plate electrode and an external plate electrode sandwiching a central portion of the piezoelectric layer, wherein the MEMS guided wave device is suitable for providing non-linear elastic convolver utility, according to one embodiment of the present disclosure.

FIG. 25B is a cross-sectional view of a MEMS guided wave device including a piezoelectric layer having a portion that is suspended over a cavity or recess in an underlying layer, external electrodes supported by the suspended portion of piezoelectric layer and forming an external pair of laterally spaced interdigital transducers serving as input electrodes, and an output electrode including an internal plate electrode and an external plate electrode sandwiching a central portion of the piezoelectric layer, wherein the MEMS guided wave device is suitable for providing non-linear elastic convolver utility, according to one embodiment of the present disclosure.

FIG. 26 is a cross-sectional view of a MEMS mixed domain guided wave device including an exposed piezoelectric layer, electrodes forming a pair of laterally spaced interdigital transducers embedded in an underlying layer, a semiconducting layer arranged on a central portion of the piezoelectric layer, and first and second ohmic contacts arranged over portions of the semiconductor layer to provide acoustic amplification utility, according to one embodiment of the present disclosure.

FIG. 27 is a cross-sectional view of a MEMS mixed domain guided wave device including an exposed piezoelectric layer having a portion that is suspended over a cavity or recess in an underlying layer, internal electrodes supported by the suspended portion of the piezoelectric layer and forming a pair of interdigital transducers, a semiconducting layer arranged on a central portion of the piezoelectric layer, and with first and second ohmic contacts arranged over portions of the semiconductor layer to provide acoustic amplification utility, according to one embodiment of the present disclosure.

FIG. 28 is a cross-sectional view of a MEMS mixed domain guided wave device including an exposed piezoelectric layer, internal electrodes forming a pair of laterally spaced interdigital transducers embedded in an underlying layer, and first and second semiconducting layers with a top side electrical contact arranged over a portion of the piezoelectric layer and configured to form a two-dimensional electron gas at an interface between the first and second semiconducting layers, according to one embodiment of the present disclosure.

FIG. 29 is a cross-sectional view of a MEMS mixed domain guided wave device including an exposed piezoelectric layer, internal electrodes forming a pair of laterally spaced interdigital transducers embedded in an underlying layer, and at least one semiconducting layer arranged over a portion of the piezoelectric layer, wherein a source contact, a gate contact, and a drain contact are operatively arranged with the at least one semiconducting layer to serve as a transistor, according to one embodiment of the present disclosure.

FIG. 30 is a cross-sectional view of a MEMS mixed domain guided wave device including an exposed piezoelectric layer, internal electrodes forming a pair of laterally spaced interdigital transducers embedded in an underlying layer, an inner conductive layer embedded in the underlying layer, and multiple layers (including an outer conductive layer) overlying a portion of the piezoelectric layer to provide acoustoelectric convolver utility, according to one embodiment of the present disclosure.

FIG. 31 is a cross-sectional view of a MEMS mixed domain guided wave device including an exposed piezoelectric layer, internal electrodes forming a pair of laterally spaced interdigital transducers embedded in an underlying layer, an inner conductive layer embedded in the underlying layer, and multiple layers (including an outer conductive layer) overlying a portion of the piezoelectric layer to provide acoustoelectric convolver utility, according to one embodiment of the present disclosure.

FIG. 32 is a cross-sectional view of a MEMS mixed domain guided wave device including an exposed piezoelectric layer, internal electrodes forming a pair of laterally spaced interdigital transducers embedded in an underlying layer and serving as input electrodes, and a semiconducting layer with top side output electrodes of opposing polarity overlying a portion of the piezoelectric layer to provide acoustic wave convolver with bidirectional amplification utility, according to one embodiment of the present disclosure.

DETAILED DESCRIPTION

Figure 1:
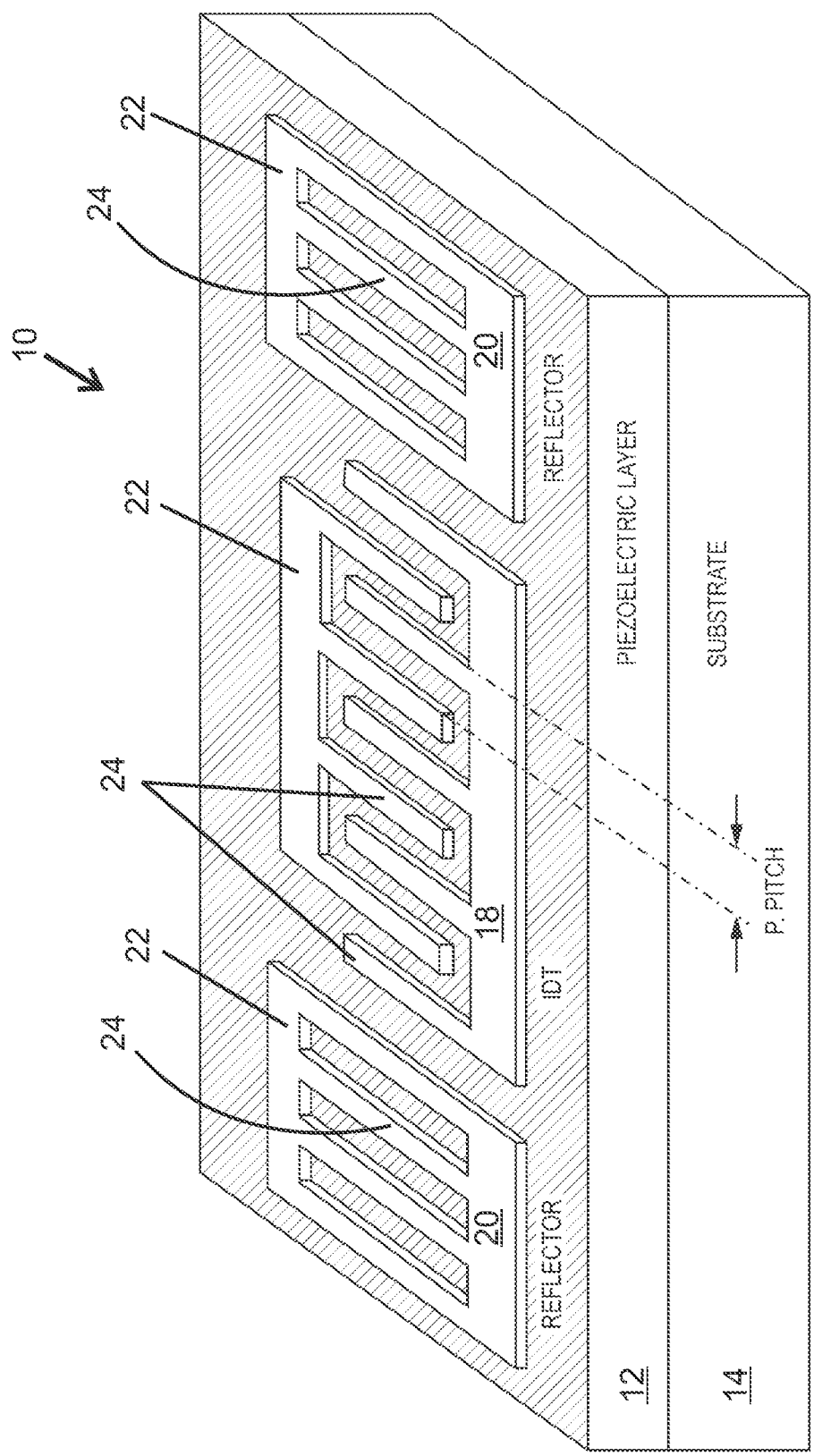
FIG. 1 is a top plan view of a conventional MEMS guided wave device including an IDT and corresponding reflector gratings arranged over a piezoelectric layer that overlies a substrate.

Embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof. As used herein, the terms "proximate" and "adjacent" as applied to a specified layer or element refer to a state of being close or near to another layer or element, and encompass the possible presence of one or more intervening layers or elements without necessarily requiring the specified layer or element to be directly on or directly in contact with the other layer or element unless specified to the contrary herein.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Certain aspects of the present disclosure relate to a micro-electrical-mechanical system (MEMS) guided wave device in which a plurality of electrodes are provided (e.g., embedded or otherwise provided) below a piezoelectric layer and are configured for transduction of a lateral acoustic wave in the piezoelectric layer. In certain embodiments, electrodes are embedded in a slow wave propagation material underlying a piezoelectric layer. In certain embodiments, electrode are supported by a suspended portion of a piezoelectric layer. At least one guided wave confinement structure, such as a fast wave propagation material, a Bragg mirror, or a cavity or recess, is arranged proximate to (e.g., below) the slow wave propagation layer and is configured to confine the lateral acoustic wave in the piezoelectric layer and (if provided) the slow wave propagation layer. An optional substrate may be provided below the guided wave confinement structure.

By arranging electrodes below the piezoelectric layer and thereby exposing at least a portion of the piezoelectric layer, a "building block" structure is formed in which a surface of the piezoelectric layer is available to permit one or more additions or modifications to be made thereto, thereby enabling production of devices with enhanced utility, as detailed herein. As one example, one or more regions of a piezoelectric layer may be selectively thinned (or "trimmed"). As another example, one or more loading materials may be arranged in contact with one or more portions of a piezoelectric layer to locally alter a property of a lateral acoustic wave transduced in the piezoelectric layer. As another example, one or more regions of a piezoelectric layer may be sandwiched between one or more embedded electrodes and one or more top side electrodes to yield one or more capacitive elements. As another example, at least one sensing material may be arranged over at least a portion of the piezoelectric layer, wherein at least one property of at least one sensing material is configured to change in exposure to an environment proximate to the at least one sensing material, and at least one wave propagation property of the piezoelectric layer may be altered in response to such change. As another example, at least one functional layer may be arranged on or over at least a portion of the piezoelectric layer, and configured to interact with the piezoelectric layer to provide mixed domain signal processing utility (such as, but not limited to, acousto-semiconductor, acousto-magnetic, or acousto-optic signal processing utility).

While certain embodiments utilize internal electrodes that are either embedded in a layer underlying a piezoelectric layer or are supported by a suspended portion of a piezoelectric layer, in other embodiments, at least some electrodes may be externally arranged over a piezoelectric layer. In certain embodiments, first and second electrode groups (e.g., interdigital transducers) may be externally arranged over a piezoelectric layer, and at least one additional electrode may be embedded below or otherwise provided below the piezoelectric layer.

In certain embodiments, MEMS guided wave devices described herein may have dominant lateral vibrations. Such devices may desirably use single crystal piezoelectric layer materials, such as lithium tantalate or lithium niobate. Such devices may also provide vibrating structures with precise sizes and shapes, which may provide high accuracy, and enable fabrication of multiple resonators having different resonant frequencies on a single substrate. Although lithium niobate and lithium tantalate are particularly preferred piezoelectric materials, in certain embodiments any suitable piezoelectric materials may be used, such as quartz, a piezoceramic, or a deposited piezoelectric material (such as aluminum nitride or zinc oxide). When provided, substrates of any suitable materials may be used, such as silicon, glass, ceramic, etc. In certain embodiments, a substrate may additionally or alternatively comprise a piezoelectric material, which may be of the same or different composition in comparison to the piezoelectric layer against which electrodes are provided for transduction of one or more acoustic waves.

Vibrating structures of preferred MEMS guided wave devices described herein are formed of single crystal piezoelectric material and use mechanically efficient MEMS construction. Such vibrating structures may be high-Q, low loss, stable, have a high electromechanical coupling coefficient, have high repeatability, and have a low motional impedance. In certain embodiments, a nonstandard (e.g., offcut) crystalline orientation of the single crystal piezoelectric material may be used to provide specific vibrational characteristics, such as a low temperature coefficient of frequency, a high electromechanical coupling coefficient, or both. Since it is extremely difficult to grow single crystal piezoelectric material (e.g., via epitaxy) over non-lattice-matched materials, in certain embodiments, single crystal piezoelectric materials are prefabricated (e.g., by growth of a boule followed by formation of thin wafers), surface finished (e.g., via chemical mechanical planarization (CMP) and polishing to provide near-atomic flatness), and bonded to one or more underlying layers. Any suitable wafer bonding technique known in the art may be used, such as may rely on van der Waals bonds, hydrogen bonds, covalent bond, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. Such bonding results in formation of a bonded interface between the piezoelectric layer and at least one underlying layer. In certain embodiments, the bonded interface may include at least one intervening layer arranged on at least a portion of (or the entirety of) a surface of the substrate.

In certain embodiments, a composite including a single crystal piezoelectric layer, a slow wave propagation layer having embedded electrodes, and at least one guided wave confinement structure (optionally in combination with one or more additional layers providing slow wave propagation and/or temperature compensation utility as disclosed herein) is solidly mounted to a carrier substrate. In other embodiments, at least a portion of a composite may be suspended above a carrier substrate with a gap arranged therebetween. In certain embodiments, devices described herein may be used for propagation of quasi-shear horizontal waves, quasi-longitudinal waves, and/or thickness-extensional (FBAR-type) waves. In certain embodiments, at least one portion of a piezoelectric layer is suspended over one or more underlying layers, such as over at least one cavity or recess defined in one or more underlying layers.

The terms "fast wave propagation material" or "fast wave propagation layer" refers to a material or layer in which an acoustic wave of interest travels more quickly than in a proximate piezoelectric layer in which the acoustic wave is transduced. Similarly, the terms "slow wave propagation material" or "slow wave propagation layer" refers to a material or layer in which an acoustic wave of interest travels more slowly than in a proximate piezoelectric layer in which the acoustic wave is transduced. Examples of fast wave propagation materials that may be used according to certain embodiments include (but are not limited to) diamond, sapphire, aluminum nitride, silicon carbide, boron nitride, and silicon. An example of a slow wave propagation material that may be used according to certain embodiments includes (but is not limited to) silicon dioxide ($SiO_2$). Silicon dioxide may also be used as a sacrificial material in certain embodiments. In certain embodiments, fast wave propagation material may be provided below a slow wave propagation layer in contact with a piezoelectric layer to confine a lateral acoustic wave in the piezoelectric layer and the slow wave propagation layer, thereby serving as a guided wave confinement structure. Such confinement may significantly reduce or avoid dissipation of acoustic radiation in an optionally provided substrate or other carrier structure.

Certain embodiments disclosed herein utilize acoustic Bragg mirrors (also known as Bragg reflectors) to serve as a guided wave confinement structure. A Bragg mirror includes at least one group of at least one low impedance layer (e.g., silicon dioxide) and at least one high impedance layer (e.g., tungsten or hafnium dioxide), wherein the at least one low impedance layer is sequentially arranged with the at least one high impedance layer in the at least one group. The number of groups of alternating impedance layers used in a Bragg mirror depends on the total reflection coefficient required. In certain embodiments, a Bragg mirror may be provided below a slow wave propagation layer in contact with a piezoelectric layer to confine a lateral acoustic wave in the piezoelectric layer and the slow wave propagation layer, thereby serving as a guided wave confinement structure.

Certain embodiments disclosed herein utilize a cavity or recess defined in at least one layer underlying a piezoelectric layer to serve as a guided wave confinement structure. In certain embodiments, a composite including a piezoelectric layer and at least one underlying layer (e.g., a slow wave propagation layer and/or a fast wave propagation layer or Bragg mirror) is suspended over a cavity, recess, or void.

In certain embodiments, MEMS guided wave devices may include one or one or more delay lines, wherein each delay line includes first and second electrode groups (e.g., first and second IDTs) that are laterally spaced relative to one another. In certain embodiments, a first electrode group is arranged to generate at least one lateral acoustic wave in a piezoelectric layer, and a second electrode group is arranged to receive the lateral acoustic wave following transmission through the piezoelectric layer.

In certain embodiments, MEMS guided wave devices may include one or more resonators, wherein each resonator includes first and second electrode groups (e.g., first and second IDTs) that are laterally spaced relative to one another, and wherein the electrode groups are further arranged between reflectors (e.g., reflector gratings).

In certain embodiments, multiple resonators or delay lines of different wavelengths may be provided on a single wafer or substrate. Suitable electrodes may be defined on and/or in the piezoelectric layer for transduction of a first lateral acoustic wave in a first region of the piezoelectric material, and for transduction of a second lateral acoustic wave in a second region of the piezoelectric material. In certain embodiments, at least two different resonators or delay lines on a single wafer or substrate are configured to produce wavelengths at least one octave apart. In certain embodiments, at least one first resonator or delay line is configured to operate at or around 900 MHz, and at least one second resonator or delay line is configured to operate at or around 1800 MHz or 2.4 GHz.

In certain embodiments, vertical holes may be defined in a piezoelectric layer (preferably spaced apart from electrodes thereon or thereunder) to enable passage of one or more liquids suitable to promote removal of sacrificial material arranged below the piezoelectric material. Optionally, such vertical holes may be covered or plugged (e.g., with epoxy or another suitable material) after removal of sacrificial material is complete to promote formation of a sealed cavity or recess. In certain embodiments, lateral access may be provided to sacrificial material arranged within or below a piezoelectric layer, thereby obviating the need for vertical holes to enable removal of sacrificial material.

Guided wave devices as disclosed herein may incorporate various combinations of electrode configurations as illustrated in the drawings and described herein. Exemplary configurations disclosed herein include, but are not limited to, interdigital transducers (IDTs) or periodically poled transducers (PPTs) alone, and IDTs or PPTs in combination with electrodes of other types, such as plate electrodes, or continuous layer (e.g., floating) electrodes. An IDT includes electrodes with a first conducting section and a second conducting section that are inter-digitally dispersed in or on a surface or layer. IDTs are well known in the art, and may be defined by single-step or multi-step photolithographic patterning.

Although various figures herein include one or more input electrodes, output electrodes, IDTs, reflector gratings, resonators, delay lines, filters, sensors, capacitors, and/or mixed domain signal processing elements in discrete fashion, it is to be appreciated that any suitable combinations of input electrodes, output electrodes, IDTs, reflector gratings, resonators, delay lines, filters, sensors, capacitors, and/or mixed domain signal processing elements in series and/or in parallel may be provided on a single wafer or substrate. In certain embodiments, multiple delay lines, resonators, and/or filters arranged for transduction of acoustic waves of different wavelengths may be provided in a single wafer or substrate, optionally in conjunction with one or more other elements or features disclosed herein.

As noted previously, a "building block" structure according to certain embodiments may include electrodes arranged below a piezoelectric layer, whereby a surface of the piezoelectric layer is available to permit one or more additions or modifications to be made thereto.

FIGS. 2A-2D are cross-sectional views of portions of a MEMS guided wave device during various steps of fabrication utilizing a first fabrication method, with the device of FIG. 2D being useable as a "building block" structure. FIG. 2A illustrates formation of a first group of alternating electrodes 38, 40 (e.g., forming a first IDT) and a second group of alternating electrodes 38A, 40A (e.g., forming a second IDT) over a surface of a thick piezoelectric layer 30. Such electrodes 38, 40, 38A, 40A may be formed by conventional methods such as metal deposition followed by photolithographic patterning and etching. In certain embodiments, the piezoelectric layer 30 comprises a single crystal piezoelectric material. FIG. 2B illustrates the structure of FIG. 2A following deposition of a slow wave propagation layer 26 over the electrodes 38, 40, 38A, 40A and one surface of the thick piezoelectric layer 30. Thereafter, the structure of FIG. 2B may be inverted, and a guided wave confinement structure 28 may be provided in contact with the slow wave propagation layer 26, as shown in FIG. 2C. In certain embodiments, a surface of the slow wave propagation layer 26 may be planarized (e.g., via chemical mechanical planarization or another suitable process) before the guided wave confinement structure 28 is provided thereon. Any suitable process may be used for providing the guided wave confinement structure 28, such as deposition, direct bonding, adhesion, or other means. In certain embodiments, one or more surface activation steps may be applied to the slow wave propagation layer 26 and/or the guided wave confinement structure 28 prior to direct bonding or adhesion. One or more bonding layers may optionally be arranged between the respective layers 26, 28 to be bonded. Thereafter, the piezoelectric layer 30 may be thinned (e.g., via one or more of etching, lapping, grinding, planarization, polishing, etc.) to a desired thickness to yield an exposed upper surface 30', as shown in FIG. 2D. The exposed upper surface 30' is subject to one or more addition and/or modification steps as described herein. For example, in certain embodiments, the piezoelectric layer 30 may be locally thinned to define a first thickness region and a second thickness region, wherein a thickness of the first thickness region differs from a thickness of the second thickness region.

FIGS. 3A-3D are cross-sectional views of portions of a MEMS guided wave device during various steps of fabrication utilizing a second fabrication method, with the device of FIG. 3D being useable as such a "building block" structure. FIG. 3A illustrates a slow wave propagation layer 26 arranged (e.g., via deposition or bonding) on a guided wave confinement structure 28 (e.g., a fast wave propagation layer or a Bragg mirror). FIG. 3B illustrates the structure of FIG. 3A following formation of a photoresist layer 34 over the slow wave propagation layer 26, photolithographic patterning of the photoresist layer 34 to define windows 33, and etching to form recesses 32 in the slow wave propagation layer 26. FIG. 3C illustrates the structure of FIG. 3B following removal of the photoresist layer 34 and following deposition in the recesses 32 of alternating electrodes 38, 40 forming a first IDT and alternating electrodes 38A, 40A forming a second IDT. The electrodes 38, 40, 38A, 40A are recessed in the slow wave propagation layer 26. Thereafter, as shown in FIG. 3D, a piezoelectric layer 30 is provided over the slow wave propagation layer 26 and the electrodes 38, 40, 38A, 40A. In certain embodiments, the piezoelectric layer 30 may be deposited or grown over the slow wave propagation layer 26 and the electrodes 38, 40, 38A, 40A. In other embodiments, the piezoelectric layer 30 (preferably embodying a single crystal piezoelectric material) may be prefabricated. Adjacent surfaces of the piezoelectric layer 30 and the slow wave propagation layer 26 may be planarized and polished, and then attached to one another via a conventional direct bonding (e.g., wafer bonding) process or other process. One or more bonding promoting layers may optionally be arranged between the respective layers 26, 30 to be bonded. Following bonding, the piezoelectric layer 30 includes an exposed upper surface 30' that may be planarized and polished, and that is subject to one or more addition and/or modification steps as described herein.

FIG. 4 is a cross-sectional view of another MEMS guided wave device including a piezoelectric layer 30 having an exposed upper surface 30', and electrodes 38, 40, 38A, 40A embedded in an underlying slow wave propagation layer 26. A guided wave confinement structure 28 (e.g., a fast wave propagation layer) is provided below the slow wave propagation layer 26, and a substrate 36 underlies the guided wave confinement structure 28. The structure shown in FIG. 4 is useable as a building block for devices according to various embodiments of the present disclosure.

FIG. 5 is a cross-sectional view of a MEMS guided wave device similar to that shown in FIG. 4, but utilizing a guided wave confinement structure 28 in the form of a Bragg mirror instead of a fast wave propagation layer. The Bragg mirror includes alternating low and high impedance layers 28A-28C. A piezoelectric layer 30 has an exposed upper surface 30', and electrodes 38, 40, 38A, 40A are embedded in an underlying slow wave propagation layer 26. The guided wave confinement structure 28 is provided below the slow wave propagation layer 26, and a substrate 36 underlies the guided wave confinement structure 28. The structure shown in FIG. 5 is useable as a building block for devices according to various embodiments of the present disclosure.

In certain embodiments, selective areas of piezoelectric layers may be trimmed (via one or more appropriate techniques such as, but not limited to, ion milling and/or etching) to provide different thickness regions, thereby permitting adjustment of frequency and/or coupling strength, and enabling formation of multi-frequency devices (e.g., when electrodes of different periodicities are provided over a single wafer or substrate). In certain embodiments, two, three, four or more different thickness regions of a single piezoelectric layer may be provided. In certain embodiments, multiple regions of a first thickness of a piezoelectric layer may be continuous or discontinuous.

In certain embodiments, a micro-electrical-mechanical system (MEMS) guided wave device includes a piezoelectric layer, a plurality of electrodes arranged in a slow wave propagation layer disposed below the piezoelectric layer and configured for transduction of a lateral acoustic wave in the piezoelectric layer; and a guided wave confinement structure arranged proximate to the slow wave propagation layer and configured to confine the lateral acoustic wave in the piezoelectric layer and the slow wave propagation layer; wherein the piezoelectric layer includes a first thickness region and a second thickness region, and a thickness of the first thickness region differs from a thickness of the second thickness region.

Figure 6A:
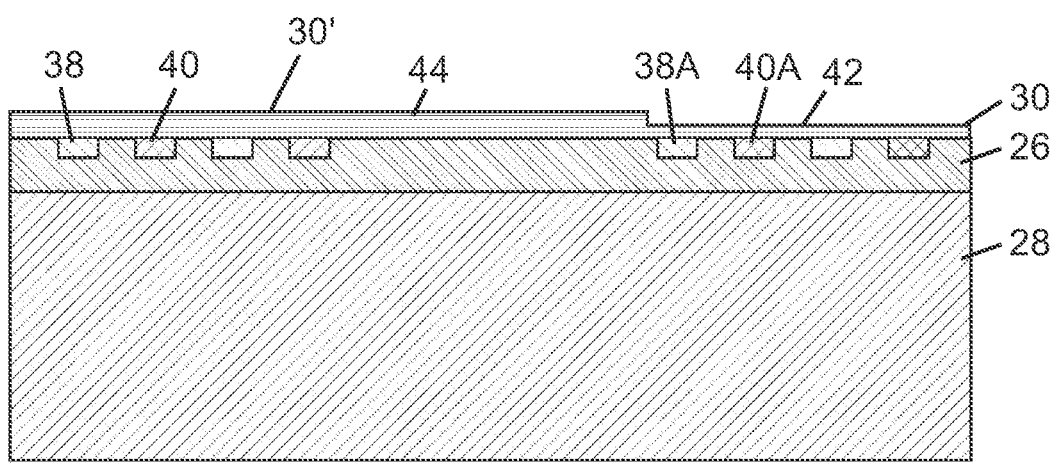
FIGS. 6A-6C are cross-sectional views of MEMS guided wave devices, each including an exposed piezoelectric layer and electrodes embedded in an underlying layer, following selective trimming of each piezoelectric layer to provide regions of different thicknesses, according to various embodiments of the present disclosure.

FIG. 6A illustrates a MEMS guided wave device including a piezoelectric layer 30 overlying electrodes 38, 40, 38A, 40A embedded in an underlying slow wave propagation layer 26 that overlies a guided wave confinement structure 28. The piezoelectric layer 30 includes an exposed upper surface 30'. Following local thinning (or trimming) of the piezoelectric layer 30 (e.g., via etching, ion milling, and/or another suitable technique), the piezoelectric layer 30 includes a first thickness region 42 and a second thickness region 44, wherein a thickness of the first thickness region 42 differs from (i.e., is smaller than) a thickness of the second thickness region 44. As shown in FIG. 6A, the first thickness region 42 overlies a first group of embedded electrodes 38A, 40A as well as a central region of the piezoelectric layer 30, and the second thickness region 44 overlies a second group of embedded electrodes 38, 40.

Figure 6B:
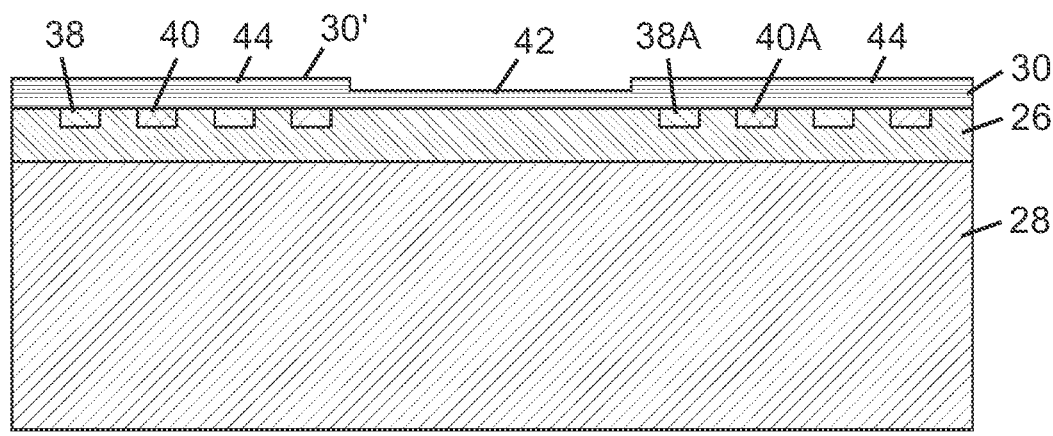

FIG. 6B illustrates another MEMS guided wave device including a piezoelectric layer 30 having an exposed upper surface 30', wherein the piezoelectric layer 30 overlies electrodes 38, 40, 38A, 40A embedded in an underlying slow wave propagation layer 26 that overlies a guided wave confinement structure 28. Following local thinning (or trimming) of the piezoelectric layer 30 (e.g., via etching, ion milling, and/or another suitable technique), the piezoelectric layer 30 includes a first thickness region 42 and a second thickness region 44, wherein a thickness of the first thickness region 42 differs from (i.e., is smaller than) a thickness of the second thickness region 44. As shown in FIG. 6B, the second thickness region 44 overlies a first group of embedded electrodes 38A, 40A and a second group of embedded electrodes 38, 40, and the first thickness region 42 overlies a central region of the piezoelectric layer 30 between the respective groups of electrodes 38, 40, 38A, 40A.

Figure 6C:
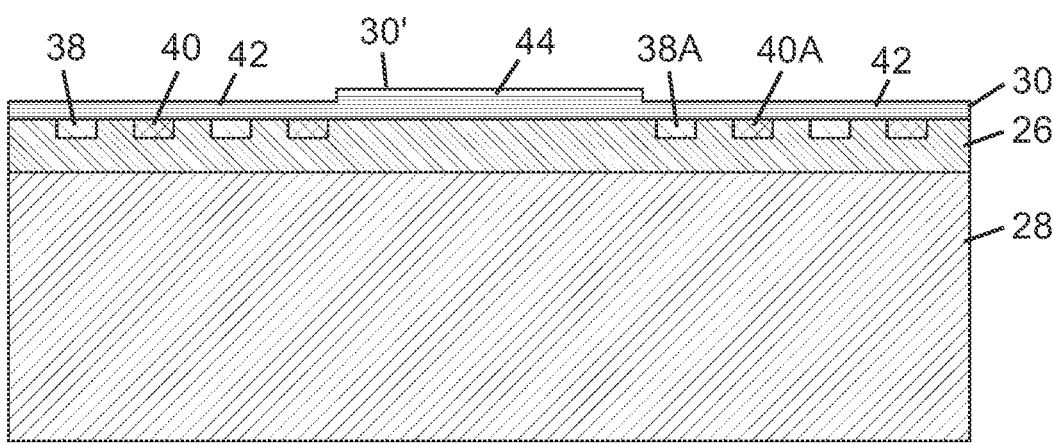

FIG. 6C illustrates another MEMS guided wave device including a piezoelectric layer 30 having an exposed upper surface 30', wherein the piezoelectric layer 30 overlies electrodes 38, 40, 38A, 40A embedded in an underlying slow wave propagation layer 26 that overlies a guided wave confinement structure 28. Following local thinning (or trimming) of the piezoelectric layer 30 (e.g., via etching, ion milling, and/or another suitable technique), the piezoelectric layer 30 includes a first thickness region 42 and a second thickness region 44, wherein a thickness of the first thickness region 42 differs from (i.e., is smaller than) a thickness of the second thickness region 44. As shown in FIG. 6C, the second thickness region 44 overlies a central region of the piezoelectric layer 30 between the respective groups of electrodes 38, 40, 38A, 40A, and the first thickness region 42 overlies a first group of embedded electrodes 38A, 40A and well as a second group of embedded electrodes 38, 40.

In certain embodiments, selective thinning (or trimming) of a piezoelectric layer may be performed over one or more bus bars arranged below the piezoelectric layer (e.g., embedded in an underlying slow wave propagation layer or supported by a suspended portion of the piezoelectric layer).

Figure 7A:
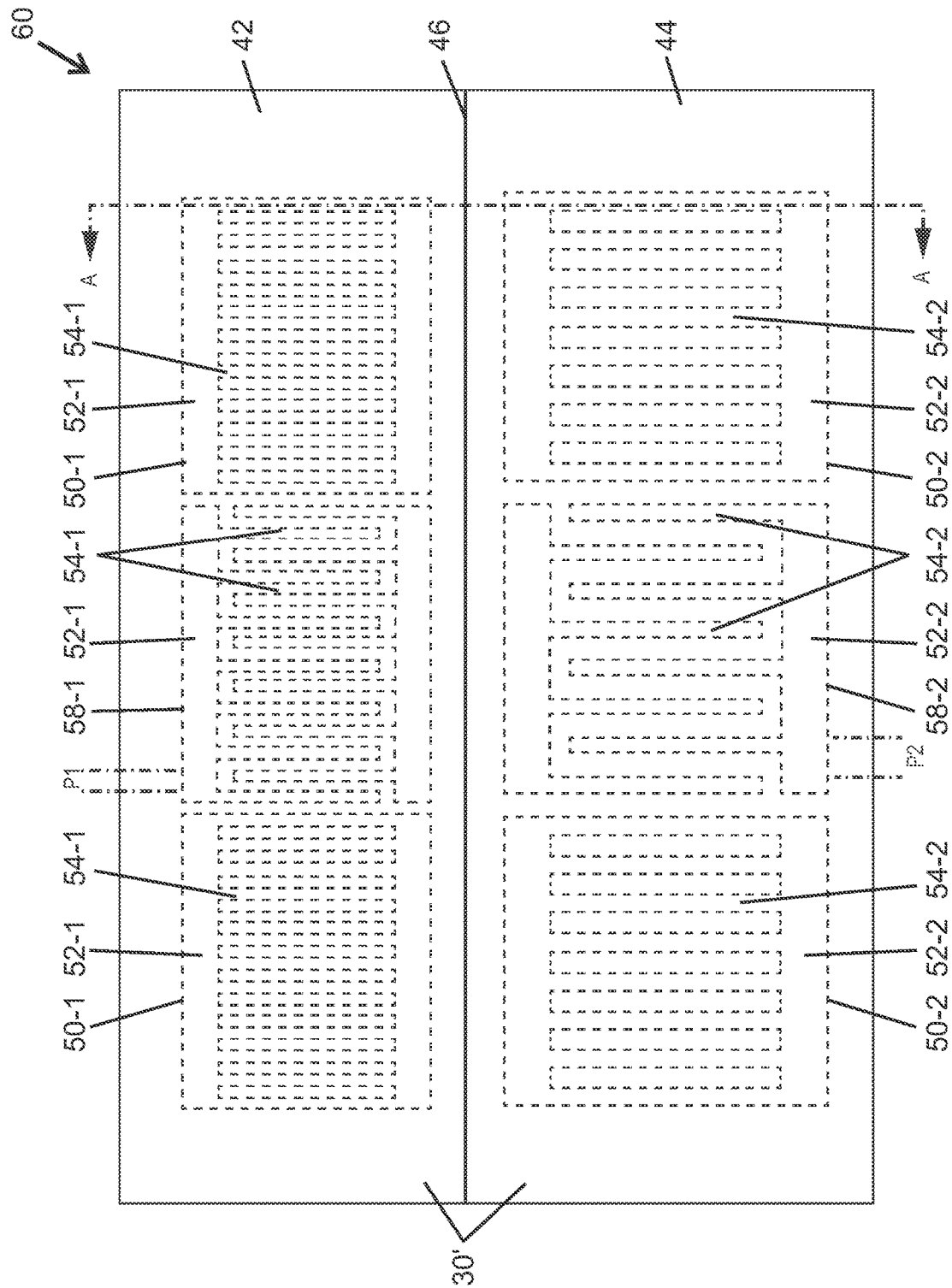
FIG. 7A is a top plan view of a multi-frequency MEMS guided wave device including an exposed piezoelectric layer, a first group of embedded electrodes arranged below a first thickness region of the piezoelectric layer, and a second group of embedded electrodes arranged below a second thickness region of the piezoelectric layer, according to one embodiment of the present disclosure.

FIG. 7A provides a top plan view, and FIG. 7B provides a cross-sectional view, of a multi-frequency MEMS guided wave device 60 including a piezoelectric layer 30 having an exposed upper surface 30' and first and second thickness regions 42, 44 separated by a step 46. The piezoelectric layer 30 (which may preferably be a single crystal piezoelectric material) overlies a slow wave propagation layer 26 having electrodes embedded therein, with the slow wave propagation layer overlying a guided wave confinement structure 28 (e.g., a fast wave propagation layer or a Bragg mirror). A first group of embedded electrodes forms a resonator including a first IDT 58-1 and two first reflectors 50-1 (each including bus bars 52-1 and fingers 54-1) embedded in the slow wave propagation layer 26 below the first thickness region 42. A second group of embedded electrodes forms a resonator including a second IDT 58-2 and two second reflectors 50-2 (each including bus bars 52-2 and fingers 54-2) embedded in the slow wave propagation layer 26 below the second thickness region 44. The operating frequency of each resonator of the MEMS guided wave device 60 is a function of the pitch representing the spacing between fingers 54-1, 54-2 of each respective IDT 58-1, 58-2. A first pitch (P1) represents the spacing between fingers 54-1 of the first IDT 58-1. A second pitch (P2) represents the spacing between fingers 54-2 of the second IDT 58-2. The wavelength λ of an acoustic wave transduced by an IDT equals two times the pitch or separation distance between adjacent electrodes (fingers) of opposite polarity, and the wavelength λ also equals the separation distance between closest electrodes (fingers) of the same polarity. Lateral mode devices have preferred thickness ranges for a piezoelectric layer to promote efficient excitation of lateral waves, such that trimming of one or more portions of a piezoelectric layer may be used to alter device performance. Since the first and second IDTs 58-1, 58-2 are intended for transduction of lateral acoustic waves having wavelengths that differ from one another, the IDTs 58-1, 58-2 are provided under first and second thickness regions 42, 44 of the piezoelectric layer 30, respectively.

In certain embodiments, performance of a MEMS guided wave device including a piezoelectric layer may be altered by providing one or more loading materials arranged in contact with one or more portions of a piezoelectric layer to locally alter a property of a lateral acoustic wave transduced in the piezoelectric layer. In certain embodiments, one or more loading materials are arranged in contact with an active region of the piezoelectric layer (e.g., over or between electrodes or electrode groups). In other embodiments, one or more loading materials are arranged in contact with a non-active region of the piezoelectric layer, such as in one or more regions outside intended propagation of lateral acoustic waves. In certain embodiments, loading may be employed without trimming, or in combination with trimming. In certain instances, large wavelength adjustments may be accomplished via trimming, and smaller wavelength adjustments may be accomplished via loading. Examples of properties that may be affected by addition of one or more loading materials include frequency, coupling coefficient, temperature compensation characteristics, velocity, capacitance, or propagative wave mode. In certain embodiments, trimming and loading may be used in combination in a single MEMS guided wave device. Examples of loading materials that may be used include, but are not limited to: metals (e.g., not serving as electrodes), fast wave propagation materials, dielectric materials, magnetic materials, magnetically responsive materials, and epitaxial films. Loading materials may be applied by any suitable methods, such as direct bonding, deposition, coating, sputtering, adhering, etc. In certain embodiments, multiple loading materials and/or multiple loading material regions may be provided over a piezoelectric layer. In certain embodiments, loading material regions may differ in one or more of the following respects: material composition, material density, thickness, volume, top area, patterning, and/or placement.

The terms "loading material" or "loading layer" as used herein refer to a material or layer configured to change at least one property of an acoustic wave in a manner that is not subject to substantial change with time, and that preferably undergo only minimal change with exposure to an environment. In contrast, the terms "functional material" or "functional layer" as used herein refer to a material or layer capable of dynamically changing at least one property of an acoustic wave. The terms "sensing material" or "sensing layer" as used herein refer to a material or layer having at least one property that is configured to change in exposure to a specified environment or environmental condition.

In certain embodiments, a MEMS guided wave device includes a piezoelectric layer; a slow wave propagation layer disposed below the piezoelectric layer; a plurality of electrodes configured for transduction of a lateral acoustic wave in the piezoelectric layer; a guided wave confinement structure arranged proximate to the slow wave propagation layer and configured to confine the lateral acoustic wave in the piezoelectric layer and the slow wave propagation layer; and at least one loading material configured to locally alter a property of the lateral acoustic wave in the piezoelectric layer. In certain embodiments, the plurality of electrodes is arranged in the slow wave propagation layer, and at least one loading material is arranged over the piezoelectric layer. Such a device may utilize a "building block" having an exposed piezoelectric layer such as disclosed in FIG. 2D, 3D, 4, or 5. In alternative embodiments, at least one loading material is arranged in the slow wave propagation layer, and the plurality of electrodes is arranged over the piezoelectric layer (such that at least a portion of the piezoelectric layer is covered with electrodes).

FIGS. 8-10 depict embodiments in which at least one loading material region is provided over an exposed surface of a piezoelectric layer that is arranged over electrodes embedded in an underlying layer.

FIG. 8 illustrates a MEMS guided wave device including a piezoelectric layer 30 having an exposed upper surface 30', with the piezoelectric layer 30 overlying electrodes 38, 40, 38A, 40A embedded in a slow wave propagation layer 26. A guided wave confinement structure 28 (e.g., a fast wave propagation layer) is provided below the slow wave propagation layer 26. A loading material 62 is arranged over and in contact with a portion of the piezoelectric layer 30, generally overlying the electrodes 38A, 40A.

FIG. 9 illustrates a MEMS guided wave device including a piezoelectric layer 30 having an exposed upper surface 30', with the piezoelectric layer 30 overlying electrodes 38, 40, 38A, 40A embedded in a slow wave propagation layer 26 that overlies a guided wave confinement structure 28 (e.g., a fast wave propagation layer). A loading material 62 is arranged over and in contact with a central portion of the piezoelectric layer 30, arranged generally between groups of electrodes 38, 40, 38A, 40A.

Although FIGS. 8 and 9 illustrate a loading material 62 arranged over an electrode group or between electrode groups, it is to be appreciated that in certain embodiments, one or more loading materials may be arranged in a substantially continuous manner over and between electrode groups, such as to cover substantially an entire resonator or delay line. In certain embodiments, one or more loading materials may be symmetrically arranged over one or more portions of a resonator or delay line. In certain embodiments, one or more loading materials may be arranged solely over bus bar portions or finger portions of a resonator or delay line.

In certain embodiments, multiple loading material regions may be provided. FIG. 10 illustrates a MEMS guided wave device including a piezoelectric layer 30 having an exposed upper surface 30', with the piezoelectric layer 30 overlying electrodes 38, 40, 38A, 40A embedded in a slow wave propagation layer 26 that overlies a guided wave confinement structure 28 (e.g., a fast wave propagation layer). A first loading material region 62A is arranged over and in contact with a first portion of the piezoelectric layer 30 overlying a first group of electrodes 38, 40, and a second loading material region 62B is arranged over and in contact with a second portion of the piezoelectric layer 30 overlying a second group of electrodes 38A, 40A. In this matter, a property of a lateral acoustic wave transduced in the piezoelectric layer 30 may be altered at different locations. As shown in FIG. 10, thickness of different loading material regions 62A, 62B may differ (e.g., with the first loading material region 62A being thicker than the second loading material region 62B). In certain embodiments, loading material regions 62A, 62B may differ with respect to one or more suitable characteristics, such as thickness, concentration, area, patterning, placement, or the like.

FIGS. 8-10 illustrate embodiments in which at least one loading material region is provided over an exposed surface of a piezoelectric layer that is arranged over electrodes embedded in an underlying layer.

In certain embodiments, at least one loading material may be arranged (e.g., embedded) in a slow wave propagation layer, and a plurality of electrodes may be arranged over a piezoelectric layer of a MEMS guided wave device. FIGS. 11A-11D are cross-sectional views of portions of an "internally loaded" MEMS guided wave device during various steps of fabrication.

FIG. 11A illustrates a slow wave propagation layer 26 arranged (e.g., via deposition or bonding) on a guided wave confinement structure 28 (e.g., a fast wave propagation layer or a Bragg mirror), following application of a photoresist layer 34 over the slow wave propagation layer 26, photolithographic patterning of the photoresist layer 34 to define windows 33, 33A and etching to form recesses 32, 32A in the slow wave propagation layer 26. FIG. 11B illustrates the structure of FIG. 11A following addition of loading materials 62, 62A to the recesses 32, 32A, and following removal of the photoresist layer 34. Thereafter, as shown in FIG. 11C, a piezoelectric layer 30 is provided over the slow wave propagation layer 26 and the loading materials 62, 62A. In certain embodiments, the piezoelectric layer 30 may be deposited or grown over the slow wave propagation layer 26 and the loading materials 62, 62A. In other embodiments, the piezoelectric layer 30 (preferably embodying a single crystal piezoelectric material) may be prefabricated. Adjacent surfaces of the piezoelectric layer 30 and a composite including the slow wave propagation layer 26 and the loading materials 62, 62A may be planarized and polished, and then attached to one another via a conventional direct bonding (e.g., wafer bonding) process or other process. One or more bonding promoting layers may optionally be arranged between the layers to be bonded. Following bonding, the piezoelectric layer 30 includes an exposed upper surface 30' on which electrodes 38, 40, 38A, 40A are provided, as shown in FIG. 11D. A first group of electrodes 38, 40 is arranged in contact with the piezoelectric layer 30 generally above the first embedded loading material 62, and a second group of electrodes 38A, 40A is arranged in contact with the piezoelectric layer 30 generally above the second embedded loading material 62A, with each loading material 62, 62A being in contact with a lower surface 30" of the piezoelectric layer 30.

Figure 12B:
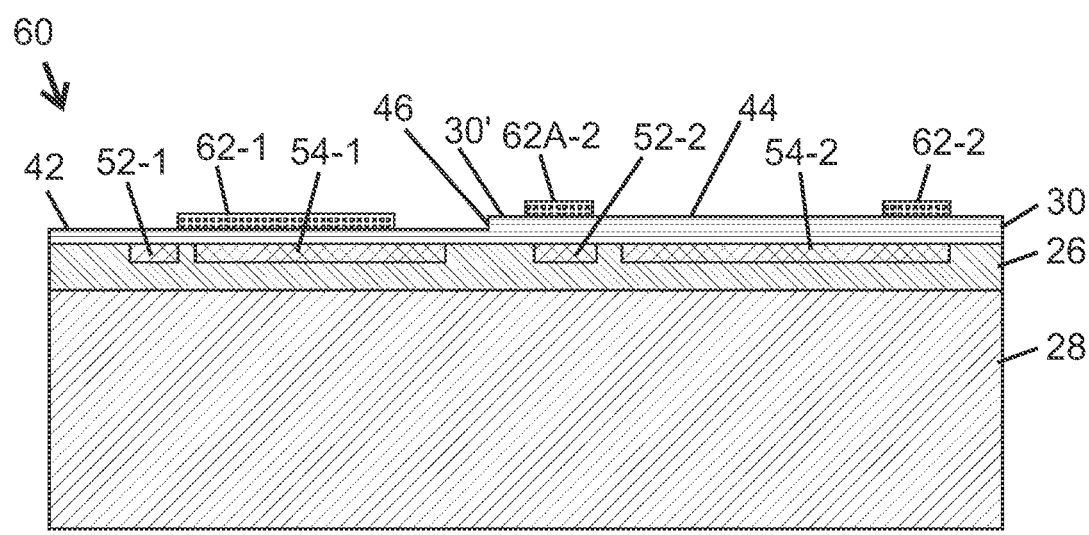
FIG. 12B is a cross-sectional view of the multi-frequency MEMS guided wave device of FIG. 12A taken along section line "B"-"B".

FIG. 12A is a top plan view, and FIG. 12B is a cross-sectional view, of a multi-frequency MEMS guided wave device 60' including a piezoelectric layer 30 having an exposed upper surface 30', first and second thickness regions 42, 44 separated by a step 46, and being overlaid with multiple loading materials 62-1, 62-2, 62A-2. The piezoelectric layer 30 (which may preferably be a single crystal piezoelectric material) overlies a slow wave propagation layer 26 having electrodes embedded therein, with the slow wave propagation layer 26 overlying a guided wave confinement structure 28 (e.g., a fast wave propagation layer or a Bragg mirror). A first group of embedded electrodes forms a resonator including a first IDT 58-1 and two first reflectors 50-1 (each including bus bars 52-1 and fingers 54-1) embedded in the slow wave propagation layer 26 below the first thickness region 42 and in contact with the piezoelectric layer 30. A second group of embedded electrodes forms a resonator including a second IDT 58-2 and two second reflectors 50-2 (each including bus bars 52-2 and fingers 54-2) embedded in the slow wave propagation layer 26 below the second thickness region 44 and in contact with the piezoelectric layer 30. A first pitch (P1) represents the spacing between fingers 54-1 of the first IDT 58-1, and a second pitch (P2) represents the spacing between fingers 54-2 of the second IDT 58-2.

Relative to the first thickness region 42 of the piezoelectric layer 30, a first loading material 62-1 is arranged over fingers 54-1 of the first IDT 58-1 and fingers 54-1 of the reflectors 50-1, without overlapping the bus bars 52-1 thereof. Although FIG. 12A shows the first loading material 62-1 as spanning the fingers 54-1 of the first IDT 58-1 and fingers 54-1 of the reflectors 50-1 in a substantially continuous fashion, it is to be appreciated that in certain embodiments, the first loading material 62-1 may be altered in size or shape, or may be separated into multiple discrete (non-connected) loading materials, such as one loading material covering fingers 54-1 of the first IDT 58-1, and separate loading materials covering fingers 54-1 of the reflectors 50-1. Relative to the second thickness region 44 of the piezoelectric layer 30, additional loading materials 62-2, 62A-2 are arranged over bus bars 52-2 of the second IDT 58-2 and bus bars 52-2 of the reflectors 50-2, without overlapping the fingers 54-2 thereof. Although FIG. 12A shows the additional loading materials 62-2, 62A-2 as spanning the bus bars 52-2 of the second IDT 58-2 and bus bars 52-2 of the reflectors 50-2 in a substantially continuous fashion, it is to be appreciated that in certain embodiments, the additional loading materials 62-2, 62A-2 may be altered in size or shape, or may be separated into multiple discrete (non-connected) loading materials, wherein each may include one loading material covering bus bars 52-2 of the second IDT 58-2, and separate loading materials covering bus bars 52-2 of the reflectors 50-2. A first acoustic wave having a first wavelength may be transduced by the first IDT 58-1 in the first thickness region 42, and presence of the first loading material 62-1 may alter at least one characteristic of such wave. A second acoustic wave having a second wavelength may be transduced by the second IDT 58-2 in the second thickness region 44, and presence of the loading materials 62-2, 62A-2 may alter at least one characteristic of such wave. As will be appreciated by one skilled in the art, any suitable number, placement, patterning, and combination of loading materials may be used.

Thus, consistent with the preceding figures directed to selectively loaded piezoelectric layers, a MEMS guided wave device according to certain embodiments includes: a piezoelectric layer; a slow wave propagation layer disposed below the piezoelectric layer; a plurality of electrodes configured for transduction of a lateral acoustic wave in the piezoelectric layer; a guided wave confinement structure arranged proximate to the slow wave propagation layer and configured to confine the lateral acoustic wave in the piezoelectric layer and the slow wave propagation layer; and at least one loading material configured to locally alter a property of the lateral acoustic wave in the piezoelectric layer. One of (i) the plurality of electrodes or (ii) the at least one loading material is arranged in the slow wave propagation layer, and the other one of (i) the plurality of electrodes or (ii) the at least one loading material is arranged over the piezoelectric layer. In certain embodiments, the plurality of electrodes is arranged in the slow wave propagation layer, and the at least one loading material is arranged over the piezoelectric layer. In other embodiments, the plurality of electrodes is arranged over the piezoelectric layer, and the at least one loading material is arranged in the slow wave propagation layer.

In certain embodiments, a micro-electrical-mechanical system (MEMS) guided wave device includes: a single crystal piezoelectric layer; a slow wave propagation layer disposed below the single crystal piezoelectric layer; at least one embedded electrode arranged in the slow wave propagation layer; at least one top side electrode arranged over the single crystal piezoelectric layer; and a guided wave confinement structure arranged proximate to the slow wave propagation layer; wherein either (i) the at least one embedded electrode or (ii) the at least one top side electrode, includes a plurality of electrodes configured for transduction of at least one lateral acoustic wave in the single crystal piezoelectric layer; wherein the guided wave confinement structure is configured to confine the at least one lateral acoustic wave in the single crystal piezoelectric layer and the slow wave propagation layer; and wherein at least one region of the single crystal piezoelectric layer is sandwiched between an embedded electrode of the at least one embedded electrode and a top side electrode of the at least one top side electrode. In certain embodiments, the plurality of electrodes configured for transduction of the at least one lateral acoustic wave in the single crystal piezoelectric layer includes an interdigital transducer (IDT) including two groups of electrodes of opposing polarity.

In certain embodiments, one or more regions of a piezoelectric layer may be sandwiched between one or more embedded electrodes and one or more top side electrodes. Such piezoelectric layer may preferably include single crystal piezoelectric material. The resulting structure may provide various utilities. In one implementation, at least one conductive trace or via may be defined through the single crystal piezoelectric layer to provide ohmic contact to an embedded electrode, thereby providing an electrically conductive path including the embedded electrode. In another implementation, a region of a single crystal piezoelectric layer may be sandwiched between an embedded electrode and a top side electrode to form at least one capacitive element. In another implementation, an embedded electrode in combination with a top side electrode form an output electrode, and are used together with first and second groups of input electrodes to interact with a single crystal piezoelectric layer to provide non-linear elastic convolver utility.

In certain embodiments, one or more regions of a single crystal piezoelectric layer are sandwiched between an embedded electrode and a top side electrode to yield one or more capacitive elements. In certain embodiments, patterning and/or trimming of top side contact material (e.g., metal) may be employed to realize different capacitance values. In situations in which single crystal piezoelectric materials such as lithium niobate or lithium tantalate are used, the very high dielectric constant and the small thickness (e.g., ranging from sub-micron to a few microns) renders the capacitive sensing very efficient, thereby enabling size efficient capacitors integrated with MEMS guided wave (e.g., resonator) devices. In certain embodiments, one or more capacitive elements may be optionally arranged in series or arranged in parallel with at least some embedded electrodes that are configured for transduction of a lateral acoustic wave in the piezoelectric layer. In certain embodiments, one or more capacitive elements may be used for non-contact sensing of signals.

In certain embodiments, at least one capacitive element may be electrically coupled in series, or in parallel, with at least one embedded electrode. In certain embodiments, one or more capacitive elements may include bus bars of an IDT. In certain embodiments, at least two top side electrodes are arranged to interact with at least two embedded electrodes to provide non-contact sensing utility. In a sensor application utilizing capacitive elements, it may be desirable to sense a signal without disturbing an embedded structure, such as in a situation where the environment being sensed may be detrimental to buried electrode material. In such a case, top sensing electrodes may be made of a non-corrosive metal such as gold, platinum, nickel, or the like. In certain embodiments, the at least one top side electrode is non-coincident with an active region of the piezoelectric layer.

In certain embodiments, a method of fabricating a MEMS guided wave device including one or more embedded electrodes and one or more top side electrodes includes multiple steps. Such steps may include providing at least one embedded electrode in a slow wave propagation layer; arranging a single crystal piezoelectric layer over the slow wave propagation layer; and providing at least one top side electrode arranged over the single crystal piezoelectric layer. Either (i) the at least one embedded electrode or (ii) the at least one top side electrode includes a plurality of electrodes configured for transduction of a lateral acoustic wave in the piezoelectric layer. The guided wave confinement structure is configured to confine the lateral acoustic wave in the single crystal piezoelectric layer and the slow wave propagation layer, and one or more regions of the single crystal piezoelectric layer are sandwiched between (i) one or more embedded electrodes of the at least one embedded electrode and (ii) one or more top side electrodes of the at least one top side electrode. In certain embodiments, providing a plurality of embedded electrodes in the slow wave propagation layer includes defining a plurality of recesses in the slow wave propagation layer, and depositing electrode material in the plurality of recesses. In certain embodiments, the piezoelectric layer may be locally thinned to define a first thickness region and a second thickness region, wherein a thickness of the first thickness region differs from a thickness of the second thickness region.

FIG. 13A is a top plan view, and FIG. 13B is a cross-sectional view, of a MEMS guided wave device suitable for providing non-contact capacitive sensing utility. Transduction of an input stimulus to the acoustic wave device allows the acoustic wave device to respond by changing its resonant frequency. The device includes a piezoelectric layer 30 overlying a slow wave propagation layer 26 having first and second electrodes (that are electrically isolated relative to one another) embedded therein to form an IDT 58 composed of bus bars 52 and fingers 54, with the IDT 58 being in contact with the piezoelectric layer 30. The slow wave propagation layer 26 overlies a guided wave confinement structure 28 (e.g., a fast wave propagation layer or Bragg mirror). First and second top side electrodes 66, 66A are formed over the exposed upper surface 30' of the piezoelectric layer 30 and generally overlap the bus bars 52 (which also embody electrodes) embedded in the slow wave propagation layer 26. As shown in FIG. 13B, two portions of the piezoelectric layer 30 are sandwiched between top side electrode/embedded electrode pairs 66, 52 and 66A, 52, thereby forming capacitor elements. The resulting MEMS guided wave device is suitable for providing non-contact capacitive sensing utility. In certain embodiments, multiple capacitors may be integrated in a MEMS guided wave device, wherein such capacitors may be connected in series, in parallel, or in a series-parallel configuration relative to one another, and/or may be connected in series, in parallel, or in a series-parallel configuration relative to one or more IDTs or other electrodes.

In certain embodiments, a capacitor may be arranged in series with an IDT (or other electrodes). FIG. 14A is a top plan view, and FIGS. 14B and 14C are cross-sectional views, of a MEMS guided wave device including embedded electrodes that is suitable for producing an IDT in series with a capacitor. The device includes a piezoelectric layer 30 overlying a slow wave propagation layer 26 having electrodes embedded therein to form an IDT 58 composed of bus bars 52 and fingers 54, with the IDT 58 being in contact with the piezoelectric layer 30. The slow wave propagation layer 26 overlies a guided wave confinement structure 28 (e.g., a fast wave propagation layer or Bragg mirror). A top side electrode 66 is arranged over the exposed top surface 30' of the piezoelectric layer 30 and generally overlaps one bus bar 52 embedded in the slow wave propagation layer 26. An opening 68 is defined (e.g., via etching) through the piezoelectric layer 30 to expose an embedded electrode in the form of a bus bar 52, as shown in FIG. 14B. Such opening 68 is preferably defined prior to application of the top side electrode 66. Referring to FIG. 14C, a conductive contact material 70 may be deposited in the opening 68 to form a raised ohmic contact extending through the piezoelectric layer 30, thereby providing an externally accessible conductive connection to the bus bar 52 embedded in the slow wave propagation layer 26. As shown at left in FIG. 14C, a portion of the piezoelectric layer 30 is sandwiched between one top side electrode 66 and a recessed contact (i.e., bus bar 52) to form a capacitor. Such capacitor is arranged in series with the IDT 58 (as shown in FIG. 14A).

Although FIG. 14A shows the top side electrode 66 as overlapping substantially the entirety of one bus bar 52, it is to be appreciated that in alternative embodiments, one or more top side electrodes may be arranged to overlap only a portion of a bus bar, or to overlap one or more embedded electrodes that are laterally displaced from a bus bar. Providing series and/or parallel capacitive elements that are displaced from (outside) a bus bar area may avoid potentially detrimental asymmetric loading of a symmetric waveguide structure.

FIG. 14D is a cross-sectional view of an alternative MEMS guided wave device similar to that of FIG. 14C, but in which electrical conduction with embedded electrodes is provided without formation of any capacitive element formed by one or more sandwiched portions of the piezoelectric layer. The device includes a piezoelectric layer 30 overlying a slow wave propagation layer 26 having electrodes embedded therein to form an IDT composed of bus bars 52 and fingers 54, with the IDT being in contact with the piezoelectric layer 30. The slow wave propagation layer 26 overlies a guided wave confinement structure 28. Conductive contact materials 70A, 70B are deposited in openings defined through the piezoelectric layer 30, to form raised ohmic contacts to the bus bars 52 embedded in the slow wave propagation layer 26. As will be apparent to one skilled in the art, ohmic contacts may be made with bus bars or other electrodes at any suitable location, either within an active region or outside of an active region of a MEMS guided wave device.

Figure 15B:
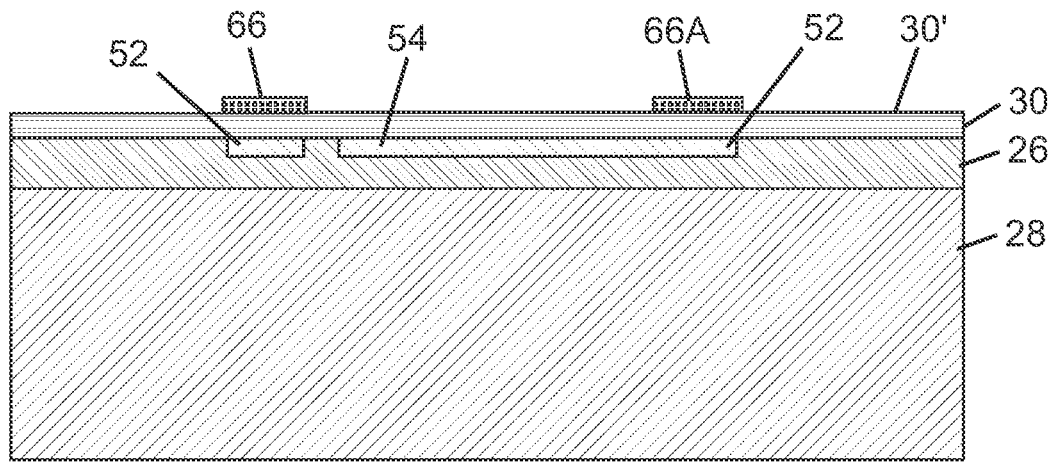
FIG. 15B is a cross-sectional view of the MEMS guided wave device of FIG. 15A taken along section line "E"-"E".
Figure 15C:
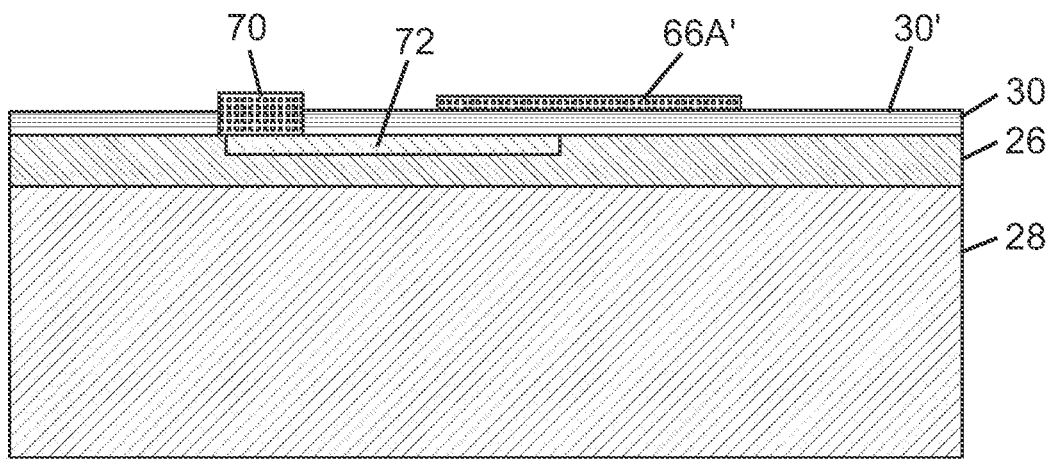
FIG. 15C is a cross-sectional view of the MEMS guided wave device of FIG. 15A taken along section line "F"-"F".

In certain embodiments, a capacitor may be arranged in parallel with an IDT (or other electrodes). FIG. 15A is a top plan view, and FIGS. 15B and 15C are cross-sectional views, of a MEMS guided wave device including embedded electrodes, two capacitors in series with an IDT, and another capacitor in parallel with the IDT. The device includes a piezoelectric layer 30 overlying a slow wave propagation layer 26 having electrodes embedded therein to form an IDT 58 composed of bus bars 52 and fingers 54, with the IDT 58 being in contact with the piezoelectric layer 30. An additional embedded electrode 72 is arranged in parallel with the IDT 58. The slow wave propagation layer 26 overlies a guided wave confinement structure 28 (e.g., a fast wave propagation layer or Bragg mirror). First and second top side electrodes 66, 66A are arranged over the exposed top surface 30' of the piezoelectric layer 30. The first top side electrode 66 overlaps the piezoelectric layer 30 and one bus bar 52 embedded in the slow wave propagation layer 26 to form a capacitor in series with the IDT 58, and further extends to an ohmic (conductive) contact material 70 that extends through the piezoelectric layer 30 into contact with the additional embedded electrode 72. The second top side electrode 66A overlaps the piezoelectric layer 30 and another bus bar 52 embedded in the slow wave propagation layer 26 to form another capacitor in series with the IDT 58, and includes an L-shaped extension 66A' that covers the piezoelectric layer 30 and another portion of the additional embedded electrode 72. As shown in FIG. 15C, a portion of the piezoelectric layer 30 is sandwiched between a (rightmost) portion of the additional embedded electrode 72 and the L-shaped extension 66A' of the second top side electrode 66A to form a capacitor coupled in parallel with the IDT 58 and the two capacitors in series with the IDT (referenced above).

As noted previously, in certain embodiments, an embedded electrode in combination with a top side electrode may form an output electrode to be used together with first and second groups of input electrodes to interact with a single crystal piezoelectric layer to provide non-linear elastic convolver utility. An acoustic wave convolver may be used between an incoming signal message bit and a locally provided time-reversed reference replica of coding applied to the message signal. Acoustic convolvers are useful in spread-spectrum wireless applications for packet-data and packet-voice communications, and are also suited to reduce multipath interference. Examples of structures suitable for providing non-linear elastic convolver utility are illustrated in FIGS. 24A, 24B, 25A, and 25B.

FIG. 24A is a cross-sectional view of a MEMS guided wave device including an exposed piezoelectric layer 30 (preferably consisting of single crystal piezoelectric material) having internal electrodes 38, 40, 38A, 40A embedded in a slow wave propagation layer 26 underlying the piezoelectric layer 30, and including a guided wave confinement structure 28 underlying the slow wave propagation layer 26. A first group of electrodes 38, 40 of opposing polarity form a first interdigital transducer, and a second group of electrodes 38A, 40A of opposing polarity form a second interdigital transducer that is laterally spaced from the first interdigital transducer, with the first and second interdigital transducers serving as input electrode groups. An external (or top side) plate electrode 122 is arranged in contact with an exposed upper surface 30' of the piezoelectric layer 30, and an embedded plate electrode 130 is arranged in contact with a lower surface 30" of the piezoelectric layer 30 and embedded within the slow wave propagation layer 26 to sandwich a central portion of the piezoelectric layer 30, with the sandwich structure forming an output electrode. The output electrode is positioned laterally between the first and second interdigital transducers, whereby the first interdigital transducer, the second interdigital transducer, and the output electrode are configured to interact with the piezoelectric layer 30 to provide non-linear elastic convolver utility. Such a device utilizes nonlinearity of the piezoelectric medium to perform signal processing.

In operation of the device of FIG. 24A, a coded input signal having a frequency f1 is supplied to alternating electrodes 38, 40 of the first IDT, a coded input signal having a frequency f1 is supplied to alternating electrodes 38A, 40A of the second IDT, and acoustic waves generated in the piezoelectric layer 30 by the IDTs are received by the output electrode, providing an autocorrelated output signal.

FIG. 24B is a cross-sectional view of a MEMS guided wave device similar to the device of FIG. 24A, but including externally arranged (or top side) input electrodes 38, 40, 38A, 40A arranged over an exposed upper surface 30' of a piezoelectric layer 30. The piezoelectric layer 30 (preferably consisting of single crystal piezoelectric material) overlies a slow wave propagation layer 26, which overlies a guided wave confinement structure 28. A first group of top side electrodes 38, 40 of opposing polarity form a first interdigital transducer, and a second group of top side electrodes 38A, 40A of opposing polarity form a second interdigital transducer that is laterally spaced from the first interdigital transducer, with the first and second interdigital transducers serving as input electrode groups. An external (or top side) plate electrode 122 is arranged in contact with an exposed upper surface 30' of the piezoelectric layer 30, and an embedded plate electrode 130 is arranged in contact with a lower surface 30" of the piezoelectric layer 30 that is embedded within the slow wave propagation layer 26 to sandwich a central portion of the piezoelectric layer 30, with the sandwich structure forming an output electrode. The output electrode is positioned laterally between the first and second interdigital transducers, whereby the first interdigital transducer, the second interdigital transducer, and the output electrode are configured to interact with the piezoelectric layer 30 to provide non-linear elastic convolver utility. Operation of the device of FIG. 24B is substantially similar to the above-described operation of the device of FIG. 24A.

In certain embodiments, non-linear elastic convolver utility may be provided with devices utilizing a guided wave confinement structure including a cavity or recess arranged below a piezoelectric layer, such that a portion of the piezoelectric layer is suspended. Such a device may include either internal or top side interdigital transducers as input electrodes in combination with an output electrode that includes an external (or top side) plate electrode and an internal (or embedded) plate electrode arranged to sandwich a central portion of a piezoelectric layer. In certain embodiments, an enclosed cavity or recess may be produced by selective removal of material from one or more precursor layers to form a recess, addition of sacrificial material to the recess, and subsequent removal of the sacrificial material (e.g., using a liquid etchant) to yield a partially or fully enclosed cavity or recess. The use of sacrificial material during fabrication, followed by selective removal of sacrificial material, beneficially permits microstructures to be formed without distortion that would otherwise be likely during processing steps such as planarization/polishing, interlayer bonding, or the like.

FIG. 25A is a cross-sectional view of a MEMS guided wave device including a piezoelectric layer 30 (preferably consisting of single crystal piezoelectric material) arranged over a cavity or recess 82 defined in a slow wave propagation layer 26 underlying the piezoelectric layer 30. A substrate 28A (optionally embodying fast wave propagation material) underlies the slow wave propagation layer 26. A portion of the piezoelectric layer 30 is suspended over the cavity or recess 82, which serves as a guided wave confinement structure to confine a lateral acoustic wave in the piezoelectric layer 30. Internal electrodes 38, 40, 38A, 40A are supported by a lower surface 30" of the suspended portion of the piezoelectric layer 30. A first group of electrodes 38, 40 of opposing polarity form a first interdigital transducer, and a second group of electrodes 38A, 40A of opposing polarity form a second interdigital transducer that is laterally spaced from the first interdigital transducer, with the first and second interdigital transducers serving as input electrode groups. An external (or top side) plate electrode 122 is arranged in contact with an upper surface 30' of the piezoelectric layer 30, and an embedded plate electrode 130 is arranged in contact with the lower surface 30" of the suspended portion of the piezoelectric layer 30, with the sandwich structure forming an output electrode. The output electrode is positioned laterally between the first and second interdigital transducers, whereby the first interdigital transducer, the second interdigital transducer, and the output electrode are configured to interact with the piezoelectric layer 30 to provide non-linear elastic convolver utility. Such a device utilizes nonlinearity of the piezoelectric medium to perform signal processing. Operation of the device of FIG. 25A is substantially similar to the above-described operation of the device of FIG. 24A.

FIG. 25B is a cross-sectional view of a MEMS guided wave device similar to the device of FIG. 25A, but including external (or top side) input electrodes 38, 40, 38A, 40A arranged over an upper surface 30' of the suspended portion of a piezoelectric layer 30. The piezoelectric layer 30 (preferably consisting of single crystal piezoelectric material) is arranged over a cavity or recess 82 defined in a slow wave propagation layer 26 underlying the piezoelectric layer 30, and a substrate 28A (optionally including fast wave propagation material) underlies the slow wave propagation layer 26. A portion of the piezoelectric layer 30 is suspended over the cavity or recess 82, which serves as a guided wave confinement structure. External (or top side) input electrodes 38, 40, 38A, 40A are supported by the upper surface 30' of the suspended portion of the piezoelectric layer 30. A first group of electrodes 38, 40 of opposing polarity form a first interdigital transducer, and a second group of electrodes 38A, 40A of opposing polarity form a second interdigital transducer that is laterally spaced from the first interdigital transducer, with the first and second interdigital transducers serving as input electrode groups. An external (or top side) plate electrode 122 is arranged in contact with the upper surface 30' of the piezoelectric layer 30, and an embedded plate electrode 130 is arranged in contact with a lower surface 30" of the suspended portion of the piezoelectric layer 30, with the sandwich structure forming an output electrode. The output electrode is positioned laterally between the first and second interdigital transducers, whereby the first interdigital transducer, the second interdigital transducer, and the output electrode are configured to interact with the piezoelectric layer 30 to provide non-linear elastic convolver utility. Operation of the device of FIG. 25B is substantially similar to the above-described operation of the device of FIG. 24A.

Consistent with FIGS. 25A and 25B, in certain embodiments a micro-electrical-mechanical system (MEMS) guided wave device includes: a single crystal piezoelectric layer; a substrate; a cavity or recess arranged between the substrate and a suspended portion of the single crystal piezoelectric layer; a first group of input electrodes configured for transduction of a first lateral acoustic wave in the suspended portion of the single crystal piezoelectric layer; a second group of input electrodes configured for transduction of a second lateral acoustic wave in the suspended portion of the single crystal piezoelectric layer; and an output electrode including a first plate arranged over the suspended portion of the single crystal piezoelectric layer and a second plate arranged under the suspended portion of the single crystal piezoelectric layer; wherein the first group of input electrodes, the second group of input electrodes, and the output electrode are configured to interact with the single crystal piezoelectric layer to provide non-linear elastic convolver utility. In certain embodiments, at least one sensing material is arranged over at least a portion of the piezoelectric layer, wherein at least one property of at least one sensing material is configured to change in exposure to an environment proximate to the at least one sensing material, and at least one wave propagation property of the piezoelectric layer may be altered in response to such change. In preferred embodiments, at least one sensing material is provided in direct contact with a piezoelectric layer to promote increased sensitivity due to direct interaction between an acoustic wave and the at least one sensing material; however, in alternative embodiments, one or more intervening layers (e.g., interface and/or adhesion promoting layers) may be provided between a piezoelectric layer and one or more sensing materials.

In certain embodiments, a micro-electrical-mechanical system (MEMS) guided wave device includes a piezoelectric layer; a plurality of electrodes disposed below the piezoelectric layer and configured for transduction of at least one lateral acoustic wave in the piezoelectric layer; a guided wave confinement structure configured to confine the at least one lateral acoustic wave in the piezoelectric layer; and at least one sensing material arranged over at least a portion of the piezoelectric layer; wherein at least one property of the at least one sensing material is configured to change in exposure to an environment proximate to the at least one sensing material.

In certain embodiments, a MEMS guided wave device includes a delay line with an input IDT or PPT, an output IDT or PPT, and a delay path (including a piezoelectric layer) between the input and output IDTs or PPTs, wherein at least one sensing material is arranged to modify a propagation property of a wave traveling in or through the delay path. In certain embodiments, a MEMS guided wave device includes a resonator with first and second IDTs or PPTs arranged between reflector gratings, wherein at least one sensing material is arranged over at least a portion of the resonator and arranged to alter a signal transduced by at least one of the IDTs or PPTs.

MEMS guided wave devices are sensitive to mechanical and electrical properties occurring on their surfaces. With respect to mechanical properties, such devices are sensitive to mass loading and viscoelastic changes like stiffening and softening. For example, mass loading as a target material is absorbed or otherwise bound to the surface of a sensing material will result in a decrease in oscillation frequency. As another example, changes in a sensing film as a material target diffuses into the bulk of the sensing film can result in elastic stiffening or softening. Elastic stiffening will result in an increase in oscillation frequency, whereas elastic softening or swelling of a sensing film will result in a decrease in oscillation frequency. With respect to electrical properties, such devices may be sensitive to properties that interact with an electrical field coupled to the propagating acoustic wave. For example, conductivity changes in a sensing film as it is exposed to a concentration of target material can result in an increase or decrease in oscillation frequency depending on whether the target material causes the conductivity of a sensing material to increase or decrease. The preceding effects may be termed electro-acoustic interactions. In certain embodiments, properties of sensing materials that may be subject to change upon exposure to target materials may include adsorption, reaction rates, curing, phase change, reactivity, or the like.

In certain embodiments, at least one sensing material may be arranged to interact with a gas. In other embodiments, at least one sensing material may be arranged to interact with a liquid.

In certain embodiments, at least one property of at least one sensing material is configured to change responsive to a change of presence or concentration of one or more chemical species in an environment proximate to the at least one sensing material. In certain embodiments, a sensing material may comprise a chemical-specific sensing film. Upon exposure of the sensing film to a chemical species, mechanical and electrical perturbations in the sensing film will cause a corresponding change in the oscillation frequency of the acoustic wave transduced in an underlying piezoelectric layer. Examples of sensing films may include metals, metal oxides, metal nitrides, or polymers. In certain embodiments, at least one sensing material is configured to undergo a reversible change in exposure to one or more chemical species; in other embodiments, at least one sensing material may be configured to undergo an irreversible change in exposure to one or more chemical species.

In certain embodiments, at least one property of at least one sensing material is configured to change responsive to a change of presence or concentration of one or more biological species in an environment proximate to the at least one sensing material. For example, at least one sensing material may be configured for specific binding to one or more biological moieties. In certain embodiments, at least one sensing material may be configured to interact with pathogens, cells, cell constituents, bacteria, proteins, ligands, and/or antibodies. In certain embodiments, a sensing material may comprise a biological moiety-specific material, such as antigens, bacterial biofilms, cell cultures, or the like.

In certain embodiments, at least one property of at least one sensing material is configured to change responsive to a change of presence or strength of a magnetic field and/or an electrical field in an environment proximate to the sensing material. For example, a sensing material may include a magnetically responsive material (e.g., InSb, InAs, NiSb, ferromagnetic materials, and/or antiferromagnetic materials). In certain embodiments, at least one property of at least one sensing material is configured to change responsive to a change of temperature in an environment proximate to the sensing material. For example, a sensing material may include a shape-memory material (e.g., a metal alloy such as NiTi alloy, or a shape memory polymer such as programmed poly(methyl methacrylate) (PMMA), ethylene vinyl acetate (EVA) or polylactide (PLA)) or a pyrometric element (e.g., lithium tantalate). In certain embodiments, the at least one sensing material may comprise a semiconductor material.

In certain embodiments, at least one property of at least one sensing material is configured to change responsive to stress applied to a sensing material. In certain embodiments, at least one property of at least one sensing material is configured to change responsive to acceleration applied to a sensing material. In certain embodiments, at least one property of at least one sensing material is configured to change responsive to change of humidity experienced by the sensing material.

In certain embodiments, at least one property of at least one sensing material is configured to change responsive to receipt of radiation. In certain embodiments, at least one sensing material may be responsive to infrared radiation, visible light, ultraviolet radiation, or any other spectral range. For example, a polymer-containing sensing material may have viscoelastic properties that are subject to change in exposure to radiation, such as by crosslinking. Other physical interactions between radiation and at least one sensing material may be employed.

In certain embodiments, at least one sensing material is coated over the entirety (or substantially the entirety) of a piezoelectric layer. In other embodiments, one or more sensing materials may be selectively applied and/or patterned over different regions of a piezoelectric layer. In certain embodiments, multiple sensing materials may be provided over different regions of a piezoelectric layer.

In certain embodiments, a MEMS guided wave device includes a sensor delay line with a first pair of IDTs or PPTs separated by a first delay path in a piezoelectric material coated or otherwise covered with at least one sensing material, and includes a reference delay line with a second pair of IDTs or PPTs separated by a second delay path in the piezoelectric material that is not coated or otherwise covered with a sensing material.

In certain embodiments, a MEMS guided wave device includes a sensor resonator with a first pair of IDTs or PPTs arranged between reflector gratings with at least a portion of a piezoelectric material of the sensor resonator coated or otherwise covered with at least one sensing material, and includes a reference resonator with a second pair of IDTs or PPTs arranged between reflector gratings with the reference resonator being devoid of any coating or covering of sensing material.

FIG. 16A is a top plan view, and FIG. 16B is a cross-sectional view, of a MEMS guided wave device including a piezoelectric layer 30 arranged over electrodes (i.e., interdigital transducers 58-1, 58A-1, 58-2, 58A-2 and reflector gratings 50-1, 50-2 forming first and second resonators 74, 76) embedded in a slow wave propagation layer 26 underlying the piezoelectric layer 30. A guided wave confinement structure 28 further underlies the slow wave propagation layer 26. Sensing material 80-1 is arranged over an upper surface 30' of the piezoelectric layer 30 over the first resonator 74 (including the first pair of IDTs 58-1, 58A-1 and reflector gratings 50-1) to provide sensing utility. The first pair of IDTs 58-1, 58A-1 and the reflector gratings 50-1 include bus bars 52-1 and fingers 54-1. The second resonator 76 includes a second pair of IDTs 58-2, 58A-2 arranged between a second pair of reflector gratings 50-2, with the second resonator 76 being devoid of any sensing material, to serve as a reference against which signals generated by the first resonator 74 can be compared. The second pair of IDTs 58-2, 58A-2 and the reflector gratings 50-2 include bus bars 52-2 and fingers 54-2. In the first pair of IDTs 58-1, 58A-1, one IDT 58-1 includes one group of alternating electrodes 38, 40, and the other IDT 58A-1 includes another group of alternating electrodes 38A, 40A. In operation of the MEMS guided wave device of FIGS. 16A and 16B, voltage is applied across bus bars 52-1, 52-2 of a transmitting IDT 58-1, 58-2 in each of the first resonator 74 and the second resonator 76. An acoustic wave transduced by each transmitting IDT 58-1, 58-2 is propagated through the piezoelectric layer 30 to a corresponding receiving IDT 58A-1, 58A-2. The first resonator 74 includes the sensing material 80-1, whereas the second resonator 76 lacks any sensing material. By comparing signals received by the receiving IDT 58A-1 of the first resonator 74 and the receiving IDT 58A-2 of the second resonator 76, any changes in one or more wave propagation properties between the resonators 74, 76 may be used to detect interaction between the sensing material 80-1 and a surrounding environment.

FIG. 17A is a top plan view, and FIG. 17B is a cross-sectional view, of a MEMS guided wave device including a piezoelectric layer 30 arranged over electrodes (i.e., interdigital transducers 58-1, 58A-1, 58-2, 58A-2 forming first and second delay lines 74A, 76A) embedded in a slow wave propagation layer 26 underlying the piezoelectric layer 30. A guided wave confinement structure 28 (e.g., a fast wave propagation layer or Bragg mirror) further underlies the slow wave propagation layer 26. A sensor delay line 74A includes sensing material 80-1 arranged over the upper surface 30' of the piezoelectric layer 30 between a first pair of IDTs 58-1, 58A-1 to provide sensing utility. The sensing material 80-1 overlies the piezoelectric layer 30 solely in an area between the first pair of IDTs 58-1, 58A-1, but in alternative embodiments may be extended to additionally cover the first pair of IDTs 58-1, 58A-1. The first pair of IDTs 58-1, 58A-1 includes bus bars 52-1 and fingers 54-1. A reference delay line 76A includes a second pair of IDTs 58-2, 58A-2, with the area therebetween being devoid of any sensing material, to serve as a reference against which signals generated by the sensor delay line 74A can be compared. The second pair of IDTs 58-2, 58A-2 includes bus bars 52-2 and fingers 54-2. In the first pair of IDTs 58-1, 58A-1, one IDT 58-1 includes one group of alternating electrodes 38, 40, and the other IDT 58A-1 includes another group of alternating electrodes 38A, 40A, as shown in FIG. 17B.

In certain embodiments, multiple sensing materials and multiple sensor resonators may be provided in a single MEMS guided wave device. FIG. 18 illustrates a MEMS guided wave device including a piezoelectric layer having an exposed upper surface 30' and being arranged over electrodes (i.e., interdigital transducers 58-1, 58A-1, 58-2, 58A-2, 58-3, 58A-3, 58-4, 58A-4 and reflector gratings 50-1, 50-2, 50-3, 50-4 forming resonators 74-1 to 74-4) embedded in a slow wave propagation layer underlying the piezoelectric layer. First through fourth resonators 74-1, 74-2, 74-3, 74-4 each include a different sensing material 80-1, 80-2, 80-3, 80-4 arranged over the upper surface 30' of the piezoelectric layer between respective pairs of IDTs 58-1, 58A-1, 58-2, 58A-2, 58-3, 58A-3, 58-4, 58A-4 to provide sensing utility. Each pair of IDTs 58-1, 58A-1, 58-2, 58A-2, 58-3, 58A-3, 58-4, 58A-4 is arranged between a pair of laterally spaced reflector gratings 50-1, 50-2, 50-3, 50-4. Within each resonator 74-1, 74-2, 74-3, 74-4, the IDTs 58-1, 58A-1, 58-2, 58A-2, 58-3, 58A-3, 58-4, 58A-4 and the reflector gratings 50-1, 50-2, 50-3, 50-4 include bus bars 52-1, 52-2, 52-3, 52-4 and fingers 54-1, 54-2, 54-3, 54-4. In operation of the MEMS guided wave device of FIG. 18, voltage is applied across bus bars of a transmitting IDT 58-1, 58-2, 58-3, 58-4 in each resonator 74-1, 74-2, 74-3, 74-4. An acoustic wave transduced by each transmitting IDT 58-1, 58-2, 58-3, 58-4 is propagated through the piezoelectric layer 30 to a corresponding receiving IDT 58A-1, 58A-2, 58A-3, 58A-4, and changes in wave propagation properties for each resonator 74-1, 74-2, 74-3, 74-4 may be used to detect interaction between the sensing material 80-1, 80-2, 80-3, 80-4 and a surrounding environment.

In certain embodiments, MEMS guided wave devices may be configured to detect changes in pressure, such as by providing a portion of a piezoelectric layer that is suspended over a sealed cavity or recess, whereby deflection of the suspended portion in exposure to pressure changes may result in detectable alteration of a wave propagation property of the piezoelectric layer. In certain embodiments, a MEMS guided wave device includes: a piezoelectric layer; a plurality of electrodes disposed below the piezoelectric layer and configured for transduction of at least one lateral acoustic wave in the piezoelectric layer; and at least one underlying layer arranged proximate to the piezoelectric layer and defining a sealed cavity or recess bounded by a suspended portion of the piezoelectric layer; wherein a wave propagation property of the piezoelectric layer is configured to change in response to exposure of the piezoelectric layer to a change in pressure of an environment proximate to the piezoelectric layer. In certain embodiments, the at least one underlying layer comprises a slow wave propagation layer disposed below a portion of the piezoelectric layer, wherein the plurality of electrodes is arranged in the slow wave propagation layer. In certain embodiments, the plurality of electrodes is supported by the suspended portion of the piezoelectric layer. In certain embodiments, the underlying layer comprises a guided wave confinement structure configured to confine the at least one lateral acoustic wave in the piezoelectric layer and (if present) the slow wave propagation layer. In certain embodiments, at least one functional layer (e.g., a sensing material, a temperature compensation material, a slow wave propagation material, a semiconducting material, and/or layer(s) conferring mixed domain signal processing utility) may be arranged over at least a portion of the piezoelectric layer, including the suspended portion thereof.

Figure 19B:
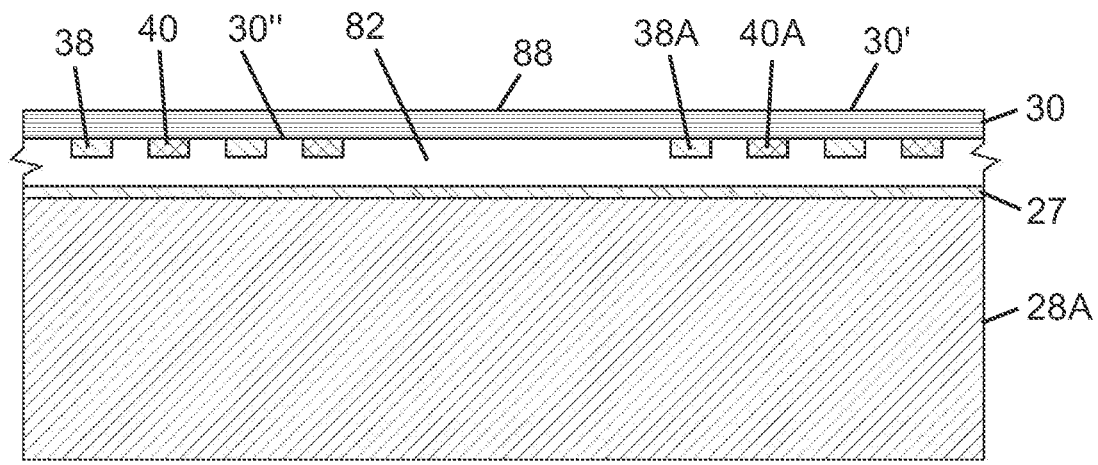
FIG. 19B is a cross-sectional view of the MEMS guided wave device of FIG. 19A taken along section line "I"-"I".

FIG. 19A is a top view, and FIG. 19B is a cross-sectional view, of a MEMS guided wave device configured to detect changes in pressure. The MEMS guided wave device includes an piezoelectric layer 30 (preferably consisting of single crystal piezoelectric material) having an exposed upper surface 30' and being arranged over a cavity or recess 82 defined in a slow wave propagation layer or sacrificial material layer underlying the piezoelectric layer 30 to define a suspended portion 88 of the piezoelectric layer 30. An optional intermediate layer 27 (which may serve as an etch stop, bonding, or interface layer) and an underlying substrate 28A are provided below the cavity or recess 82, which serves as a guided wave confinement structure to confine a lateral acoustic wave in the piezoelectric layer 30. Internal electrodes (i.e., interdigital transducers 58, 58A and reflector gratings 50 forming a resonator 84) are supported by a lower surface 30" of the suspended portion 88 of the piezoelectric layer 30. A first group of electrodes 38, 40 of opposing polarity form a first interdigital transducer 58, and a second group of electrodes 38A, 40A of opposing polarity form a second interdigital transducer 58A that is laterally spaced from the first interdigital transducer. In certain embodiments, optional vertical openings 86 (shown in FIG. 19A) may be provided during manufacture to enable an etchant to be supplied through the piezoelectric layer 30 to an underlying (sacrificial or slow wave propagation layer) to define the cavity or recess 82, while the intermediate layer 27 may prevent interaction between etchant and the substrate 28A; however, such openings 86 are preferably sealed (e.g., with epoxy or another suitable material) after fabrication to avoid equalization of pressure between the cavity or recess 82 and a surrounding environment (which would interfere with pressure detection). In less preferred embodiments, the cavity or recess 82 may be defined in one or more layers (e.g., via etching) before attachment of the piezoelectric layer 30 (e.g., via direct bonding). The IDTs 58, 58A and the reflector gratings 50 include bus bars 52 and fingers 54. In operation of the MEMS guided wave device of FIGS. 19A and 19B, voltage is applied across bus bars 52 of a transmitting IDT 58, and an acoustic wave is propagated through the suspended portion 88 of the piezoelectric layer 30 to a receiving IDT 58A. When the suspended portion 88 of the piezoelectric layer 30 is deflected (e.g., in exposure to a change in pressure), changes in wave propagation properties between the paired IDTs 58, 58A due to such deflection may be used to detect changes in pressure in a surrounding environment.

Figure 20B:
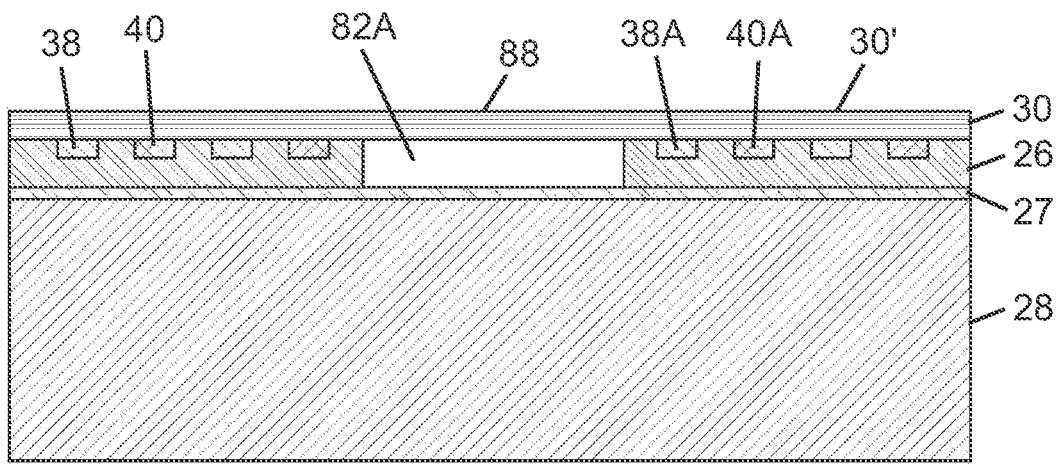
FIG. 20B is a cross-sectional view of the MEMS guided wave device of FIG. 20A taken along section line "J"-"J".

FIG. 20A is a top view, and FIG. 20B is a cross-sectional view, of another MEMS guided wave device configured to detect changes in pressure, but having a smaller cavity or recess 82A underlying the piezoelectric layer 30. The MEMS guided wave device includes a piezoelectric layer 30 having an exposed upper surface 30', with electrodes (including interdigital transducers and gratings) embedded in a slow wave propagation layer 26 underlying the piezoelectric layer 30. A guided wave confinement structure 28 underlies the slow wave propagation layer 26, with an optional intermediate layer 27 (which may serve as an etch stop, bonding, or interface layer) being arranged therebetween. As shown in FIG. 20B, a suspended portion 88 of the piezoelectric layer 30 is arranged over a cavity or recess 82A defined in the slow wave propagation layer 26. In certain embodiments, optional vertical openings 86 (shown in FIG. 20A) may be provided during manufacture to enable an etchant to be supplied through the piezoelectric layer 30 to the slow wave propagation layer 26 to define the cavity or recess 82A while the intermediate layer 27 may prevent interaction between etchant and the guided wave confinement structure 28; however, such openings 86 are preferably sealed after fabrication to avoid equalization of pressure between the cavity or recess 82A and a surrounding environment. In less preferred embodiments, the cavity or recess 82A may be defined in the slow wave propagation layer 26 (e.g., via etching) before attachment of the piezoelectric layer 30 (e.g., via direct bonding) over the slow wave propagation layer 26. The piezoelectric layer 30 is arranged over electrodes including interdigital transducers 58, 58A and reflector gratings 50 embedded in an upper portion of the slow wave propagation layer 26. The IDTs 58, 58A and the reflector gratings 50 include bus bars 52 and fingers 54. In the IDTs 58, 58A, one IDT 58 includes a first group of alternating electrodes 38, 40, and the other IDT 58A-1 includes a second group of alternating electrodes 38A, 40A. The IDTs 58, 58A and piezoelectric layer 30 form a resonator 84. In operation of the MEMS guided wave device of FIGS. 20A and 20B, voltage is applied across bus bars 52 of a transmitting IDT 58, and an acoustic wave is propagated through the suspended portion 88 of the piezoelectric layer 30 to a receiving IDT 58A. When the suspended portion 88 of the piezoelectric layer 30 is deflected (e.g., in exposure to a change in pressure), changes in wave propagation properties between the paired IDTs 58, 58A due to such deflection may be used to detect changes in pressure in a surrounding environment.

In certain embodiments, one or more functional materials and/or sensing materials may be arranged over a suspended portion of a piezoelectric layer of a MEMS guided wave device. Such an arrangement may provide enhanced detection sensitivity.

Figure 21B:
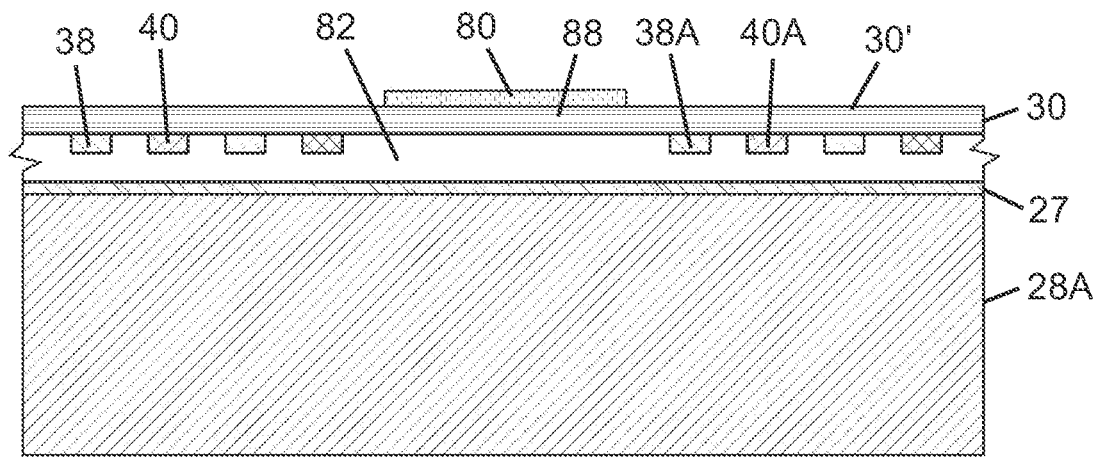
FIG. 21B is a cross-sectional view of the MEMS guided wave device of FIG. 21A taken along section line "K"-"K".

FIG. 21A is a top plan view, and FIG. 21B is a partial cross-sectional view, of a MEMS guided wave device bearing similarity to the device of FIGS. 19A and 19B, but modified to include a functional material and/or sensing material 80 arranged over the upper surface 30' of the suspended portion 88 of the piezoelectric layer 30, omitting reflector gratings, and including a delay line 84' instead of a resonator. The MEMS guided wave device includes an exposed piezoelectric layer 30 (preferably consisting of single crystal piezoelectric material) arranged over a cavity or recess 82 defined in a slow wave propagation layer or sacrificial material layer underlying the piezoelectric layer 30 to define a suspended portion 88 of the piezoelectric layer 30. An optional intermediate layer 27 (which may serve as an etch stop, bonding, or interface layer) and an underlying substrate 28A are provided below the cavity or recess 82. The cavity or recess 82 serves as a guided wave confinement structure to confine a lateral acoustic wave in the piezoelectric layer 30. Internal electrodes (i.e., interdigital transducers 58, 58A forming a delay line 84') are supported by a lower surface 30" of the suspended portion 88 of the piezoelectric layer 30. A first group of electrodes 38, 40 of opposing polarity form a first interdigital transducer 58, and a second group of electrodes 38A, 40A of opposing polarity form a second interdigital transducer 58A that is laterally spaced from the first interdigital transducer 58. The IDTs 58, 58A include bus bars 52 and fingers 54. In certain embodiments, optional vertical openings 86 (shown in FIG. 21A) may be provided during manufacture to enable an etchant to be supplied through the piezoelectric layer 30 to an underlying layer (sacrificial or slow wave propagation layer) to define the cavity or recess 82, while the intermediate layer 27 may prevent interaction between etchant and the substrate 28A. The functional material and/or sensing material 80 may include any suitable functional material or sensing material described herein. In certain embodiments, multiple functional material and/or sensing materials 80 may be provided.

In operation of the MEMS guided wave device of FIGS. 21A and 21B, voltage is applied across bus bars 52 of a transmitting IDT 58, and an acoustic wave is propagated through the suspended portion 88 of the piezoelectric layer 30 (overlaid with the functional material or sensing material 80) to a receiving IDT 58A. Any changes in wave propagation properties may be used to detect interaction between the functional material or sensing material 80 and a surrounding environment.

By providing the functional material and/or sensing material 80 over the suspended portion 88 of the piezoelectric layer 30, greater sensitivity and/or faster response may be obtained. In certain embodiments, the cavity or recess 82 may be sealed. In other embodiments, the cavity or recess 82 may remain unsealed, to avoid interference between detection of pressure and detection of other conditions by the functional material and/or sensing material 80.

Figure 22A:
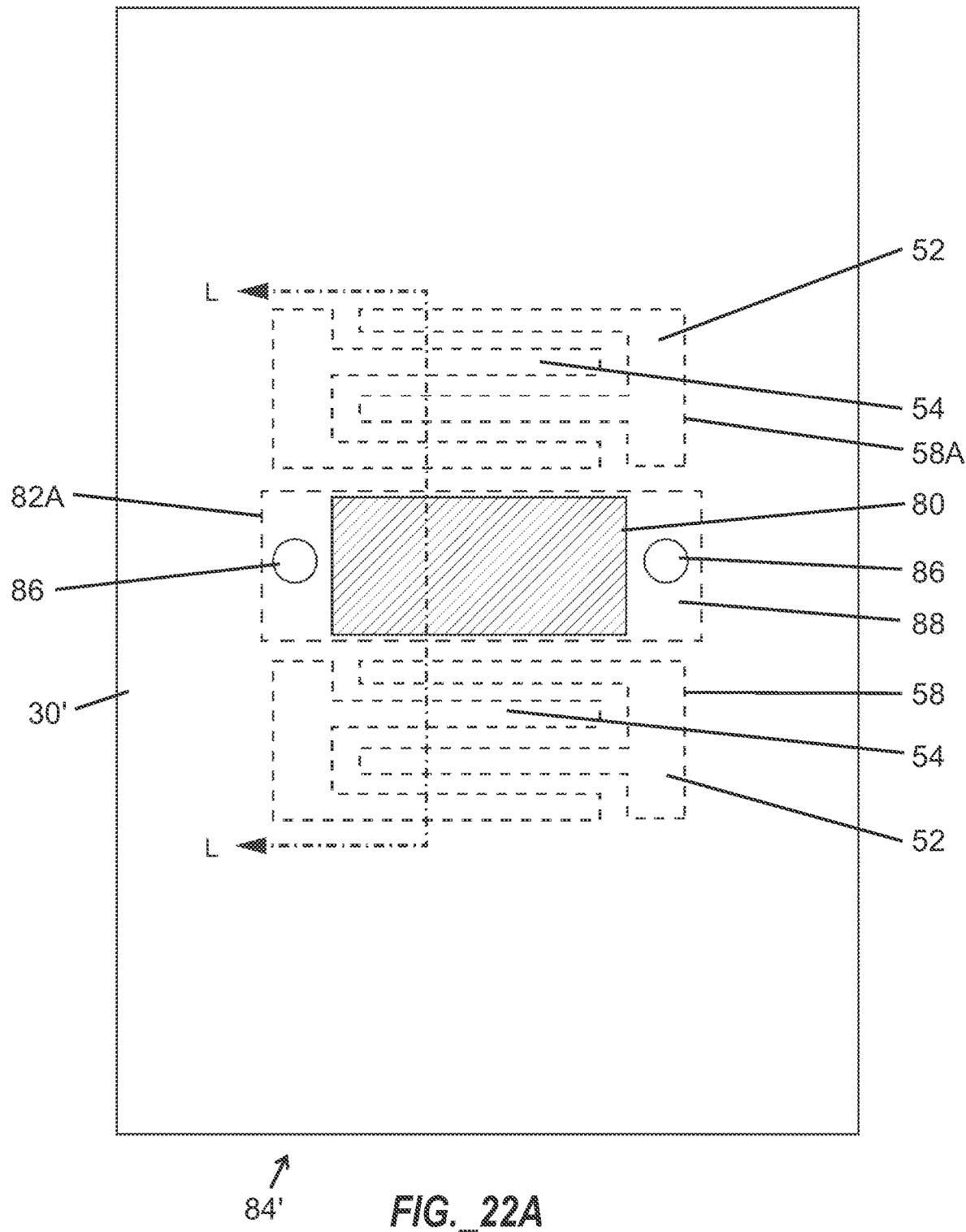
FIG. 22A is a top plan view of a MEMS guided wave device including an exposed piezoelectric layer with internal electrodes embedded in an underlying layer and forming a delay line (including a pair of laterally spaced interdigital transducers), with a central portion of the piezoelectric layer not in contact with the electrodes being suspended over a cavity or recess defined in the underlying layer, and with a functional material or sensing material arranged over the suspended portion of the piezoelectric layer, according to one embodiment of the present disclosure.

FIG. 22A is a top view, and FIG. 22B is a cross-sectional view, of a MEMS guided wave device bearing similarity to the device of FIGS. 20A and 20B, but with addition of a functional material or sensing material 80 over a suspended portion 88 of a piezoelectric layer 30, and omitting reflector gratings. The piezoelectric layer 30 has an exposed upper surface 30', with electrodes (including interdigital transducers) embedded in a slow wave propagation layer 26 underlying the piezoelectric layer 30. A guided wave confinement structure 28 underlies the slow wave propagation layer 26, with an intermediate layer 27 (which may serve as an etch stop, bonding, or interface layer) optionally being arranged therebetween. As shown in FIG. 20B, the suspended portion 88 of the piezoelectric layer 30 is arranged over a cavity or recess 82A defined in the slow wave propagation layer 26. In certain embodiments, optional vertical openings 86 (shown in FIG. 20A) may be provided to enable an etchant to be supplied through the piezoelectric layer 30 to the slow wave propagation layer 26 to define the cavity or recess 82A. In alternative embodiments, the cavity or recess 82A may be pre-defined in the slow wave propagation layer 26 (e.g., via etching) before attachment of the piezoelectric layer 30 (e.g., via direct bonding) over the slow wave propagation layer 26. The piezoelectric layer 30 is arranged over electrodes including interdigital transducers 58, 58A embedded in an upper portion of the slow wave propagation layer 26. The IDTs 58, 58A include bus bars 52 and fingers 54. In the IDTs 58, 58A, one IDT 58 includes a first group of alternating electrodes 38, 40, and the other IDT 58A includes a second group of alternating electrodes 38A, 40A. The IDTs 58, 58A and piezoelectric layer 30 form a sensor delay line 84'. In operation of the MEMS guided wave device of FIGS. 22A and 22B, voltage is applied across bus bars 52 of a transmitting IDT 58, and an acoustic wave is propagated through a delay path including the suspended portion 88 of the piezoelectric layer 30 (overlaid with the functional material or sensing material 80) to a receiving IDT 58A. Any changes in wave propagation properties may be used to detect interaction between the functional material or sensing material 80 and a surrounding environment.

In certain embodiments, a MEMS guided wave device including an exposed piezoelectric layer, electrodes embedded in an underlying layer, and sensing material arranged over at least a portion of the piezoelectric layer may be incorporated into a microfluidic device. In such a device, liquid may be supplied to and/or over the sensing material.

FIG. 23 is a cross-sectional view of a microfluidic device 98 incorporating a MEMS guided wave device including a piezoelectric layer 30 having an upper surface 30' and groups of electrodes 38, 40, 38A, 40A embedded in a slow wave propagation layer 26 underlying the piezoelectric layer 30. A guided wave confinement structure 28 is further provided below the slow wave propagation layer 26. A sensing material 80 is provided over a portion of the piezoelectric layer 30 between a first group of electrodes 38, 40 (preferably configured as a first IDT) and a second group of electrodes 38A, 40A (preferably configured as a second IDT). Multiple microfluidic structure layers 91-93 are stacked over the piezoelectric layer 30 to define at least one microfluidic channel 90 and vias 96A, 96B in communication with ports 94A, 94B to permit passage of fluid through the microfluidic device 98. The term "microfluidic" as used herein refers to structures or devices through which one or more fluids are capable of being passed or directed and having at least one dimension less than about 500 microns. In certain embodiments, at least one of the microfluidic structure layers 91-93 may include a stencil layer, which refers to a material layer or sheet that is preferably substantially planar through which one or more variously shaped and oriented portions have been cut or otherwise removed (e.g., by laser ablation, blade cutting, etching, or the like) through the entire thickness of the layer, and that permits substantial fluid movement within the layer. The outlines of the cut or otherwise removed portions form the lateral boundaries of microstructures that are formed when a stencil is sandwiched between other layers. Microfluidic structure layers 91-93 may be affixed to one another and to the piezoelectric layer 30 by any suitable means such as adhesive bonding, direct bonding, clamping, or the like.

In operation of the microfluidic device 98, a fluid is supplied via an inlet port 94A and inlet vias 96A to a microfluidic channel 90 that is bounded in part by the upper surface 30' of the piezoelectric layer 30, and that contains the sensing material 80. In certain embodiments, the fluid may flow through the microfluidic channel 90 to outlet vias 96B and an outlet port 96B to exit the device 98. While fluid is present within the microfluidic channel 90, an acoustic wave is transduced in the piezoelectric layer 30 by application of voltage to a transmitting IDT (including electrodes 38, 40), and such wave is propagated through a central (delay) region of the piezoelectric layer 30 overlaid with the sensing material 80 to be received by a receiving IDT (including electrodes 38A, 40A). Interaction between the fluid (or its contents) and the sensing material 80 may alter one or more wave propagation properties of the piezoelectric layer 30, and may be detected by the receiving IDT. Although not shown in FIG. 23, a reference delay line and/or multiple sensing delay lines (as described hereinabove) may be provided in a single microfluidic device in certain embodiments.

In certain embodiments, at least one functional layer is arranged on or over at least a portion of an exposed piezoelectric layer, and configured to interact with the piezoelectric layer to provide mixed domain signal processing utility. More specifically, in certain embodiments, a micro-electrical-mechanical system (MEMS) mixed domain guided wave device includes: a piezoelectric layer; a plurality of electrodes disposed below the piezoelectric layer and configured for transduction of at least one lateral acoustic wave in the piezoelectric layer; a guided wave confinement structure configured to confine the at least one lateral acoustic wave in the piezoelectric layer; and at least one functional layer arranged on or over at least a portion of the piezoelectric layer, and configured to interact with the at least one lateral acoustic wave in the piezoelectric layer to provide mixed domain signal processing utility. Such utility may include, for example, acousto-semiconductor, acousto-magnetic, or acousto-optic signal processing utility. In certain embodiments, the at least one functional layer includes one or more of a conductive material, a semiconducting material, or a dielectric material. In certain embodiments, the at least one functional layer includes one or more of a piezoelectric material, a ferroelectric material, a ferromagnetic material, or a magnetostrictive material. In certain embodiments, the at least one functional layer includes one or more of an optically responsive material, a pyroelectric material, or an organic material. In certain embodiments, the at least one functional layer in combination with the underlying layers forms a non-reciprocal device in which an input signal transduced by a first IDT is received by a second IDT under specified conditions.

In certain embodiments, the at least one functional layer includes at least one semiconducting layer, a first electrical contact arranged over a first portion of the at least one semiconducting layer, and a second electrical contact arranged over a second portion of the at least one semiconducting layer; and the at least one semiconducting layer is configured to interact with the piezoelectric layer to provide acoustic amplification utility.

FIG. 26 illustrates a MEMS mixed domain guided wave device suitable for providing acoustic amplification utility. The device includes a piezoelectric layer 30 having an exposed upper surface 30', wherein the piezoelectric layer 30 overlies alternating electrodes 38, 40 of a first IDT and alternating electrodes 38A, 40A of a second IDT embedded in an upper portion of an underlying slow wave propagation layer 26 that overlies a guided wave confinement structure 28. A portion of the piezoelectric layer 30 is overlaid with a semiconductor layer 100 (e.g., GaN, ZnO, or the like), wherein first and second electrical contacts 102, 104 are arranged over portions of the semiconductor layer 100. The semiconductor layer 100 may be applied over the piezoelectric layer 30 by any suitable method, such as direct bonding, layer transfer, epitaxial growth, or other methods known in the art.

In operation of the device shown in FIG. 26, an acoustic wave transduced by at least one group of electrodes 38, 40, 38A, 40A travelling through the piezoelectric layer 30 generates an alternating longitudinal electric field travelling at the acoustic wave velocity. The electric field, which is non-uniform, induces formation of periodic bunches of electric charge throughout the piezoelectric layer 30. Upon application of a DC bias voltage across the electrical contacts 102, 104, the electric charge bunches are augmented by charge carriers in response to the alternating electric field. The augmented field in turn reacts upon the piezoelectric layer 30, causing additional acoustic wave components. When the drift velocity of the charge carriers exceeds the velocity of an acoustic wave in the piezoelectric layer 30, the acoustic wave is amplified. Maximum amplification of the acoustic wave occurs at a steady state bias voltage that induces a corresponding drift velocity of the charge carriers.

FIG. 27 illustrates a MEMS mixed domain guided wave device suitable for providing acoustic amplification utility similar to the device of FIG. 26, but including a cavity or recess 82 defined in at least one underlying layer to form a suspended portion 88 of an exposed piezoelectric layer 30. The exposed piezoelectric layer 30 (preferably consisting of single crystal piezoelectric material) is arranged over the cavity or recess 82 defined in at least one layer (e.g., a slow wave propagation layer or sacrificial material layer) underlying the piezoelectric layer 30 to define a suspended portion 88 of the piezoelectric layer 30. An optional intermediate layer 27 (which may serve as an etch stop, bonding, or interface layer) and an underlying substrate 28A are provided below the cavity or recess 82. The cavity or recess 82 serves as a guided wave confinement structure to confine a lateral acoustic wave in the piezoelectric layer 30. Internal electrodes are supported by a lower surface 30" of the suspended portion 88 of the piezoelectric layer 30. A first group of electrodes 38, 40 of opposing polarity form a first interdigital transducer, and a second group of electrodes 38A, 40A of opposing polarity form a second interdigital transducer that is laterally spaced from the first interdigital transducer. Presence of the cavity or recess 82 alters wave propagation properties of the piezoelectric layer 30 relative to solid mounting of the entire piezoelectric layer 30 to the slow wave propagation layer 26. The suspended portion 88 of the piezoelectric layer 30 is overlaid with a semiconductor layer 100 (e.g., GaN, ZnO, or the like), wherein first and second electrical contacts 102, 104 are arranged over portions of the semiconductor layer 100. The semiconductor layer 100 may be applied over the piezoelectric layer 30 by any suitable method, such as direct bonding, epitaxial growth, or other methods known in the art. Operation of the device of FIG. 27 is similar to that previously described for the device of FIG. 26.

In certain embodiments, at least one functional layer of a MEMS mixed domain guided wave device includes a first semiconducting layer having a first bandgap and a second semiconducting layer having a second bandgap that differs from the first bandgap. The first semiconducting layer and the second semiconducting layer form a heterostructure configured to form a two-dimensional electron gas at an interface between the first semiconducting layer and the second semiconducting layer. Examples of semiconductor combinations suitable for forming a two-dimensional electron gas at an interface therebetween include, but are not limited to, GaN/AlGaN heterostructures and GaAs/AlGaAs heterostructures.

FIG. 28 illustrates a MEMS mixed domain guided wave device including a heterostructure configured to form a two-dimensional electron gas (2DEG) between two semiconductor layers. The device includes a piezoelectric layer 30 having an exposed upper surface 30', wherein the piezoelectric layer 30 overlies alternating electrodes 38, 40 of a first IDT and alternating electrodes 38A, 40A of a second IDT embedded in an upper portion of an underlying slow wave propagation layer 26 that overlies a guided wave confinement structure 28. A portion of the piezoelectric layer 30 is overlaid with stacked semiconductor layers 112, 114, preferably with at least one electrode 110 that preferably comprises an ohmic contact. In certain embodiments, multiple top side electrodes may be provided, and/or an additional electrode may be provided in conductive communication with the lower semiconductor layer 114. For example, another ohmic contact may be provided to the lower semiconductor layer 114 at a different cross-section than shown in FIG. 28. Formation of a semiconductor heterostructure over a piezoelectric transducer permits acoustic waves to be launched into a 2DEG, such that each acoustic wave may serve to transport one or more electrons. Alternatively, or additionally, the 2DEG may be selectively formed to affect acoustic response. For example, frequency or delay time of the guided wave device may be altered by presence or absence of a 2DEG formed along an interface between the semiconductor layers 112, 114. In certain embodiments, charge may be selectively injected as an acoustic wave travels under the at least one electrode 110. Other utilities may be provided with a semiconductor-based heterostructure provided over an exposed piezoelectric layer of a MEMS guided wave device, as will be recognized by one skilled in the art. As will also be recognized by one skilled in the art, in certain embodiments, the semiconductor layers 112, 114 may be extended over any suitable area of the piezoelectric layer 30, such as to overlap the IDTs formed by the electrodes 38, 40, 38A, 40A.

In certain embodiments, at least one functional layer formed over an exposed piezoelectric layer surface includes at least one semiconducting layer; and a source (ohmic) contact, a gate (Schottky) contact, and a drain (ohmic) contact are operatively arranged with the at least one semiconducting layer to serve as a transistor.

FIG. 29 illustrates a MEMS mixed domain guided wave device in which a portion of a piezoelectric layer 30 is overlaid with at least one semiconductor layer 118, an oxide layer 120, a source contact 102, a gate contact 106, and a drain contact 104 configured to form a transistor. Selective application of voltage to the gate contact 106 permits regulation of current flow between the source contact 102 and the drain contact 106. In certain embodiments, the at least one semiconductor layer 118 may include multiple semiconductor layers of different bandgaps providing a heterostructure suitable for forming a 2DEG, thereby yielding a high electron mobility transistor. The piezoelectric layer 30, which includes an exposed upper surface 30', overlies alternating electrodes 38, 40 of a first IDT and alternating electrodes 38A, 40A of a second IDT embedded in an upper portion of an underlying slow wave propagation layer 26 that overlies a guided wave confinement structure 28. In operation of the device, an acoustic wave transduced by at least one group of electrodes 38, 40, 38A, 40A travels through the piezoelectric layer 30. In certain embodiments, transistor operation can be modulated by the acoustic wave. Other interactions between an acoustic wave and transistor operation may alter response or other performance characteristics of the transistor and/or of the acoustic resonator.

In certain embodiments, the MEMS mixed domain guided wave device further includes an inner conductive layer arranged within a portion of the slow wave propagation layer, and an outer conductive layer arranged on or over a portion of the piezoelectric layer, wherein the inner conductive layer and the outer conductive layer are configured to interact with the piezoelectric layer to provide acoustoelectric convolver utility.

FIG. 30 is a cross-sectional view of a MEMS mixed domain guided wave device in which a portion of a piezoelectric layer 30 is utilized as part of an acoustoelectric convolver that incorporates at least one semiconductor layer. The piezoelectric layer 30, which includes an exposed surface 30', overlies alternating electrodes 38, 40 of a first IDT and alternating electrodes 38A, 40A of a second IDT embedded in an upper portion of an underlying slow wave propagation layer 26, which overlies a guided wave confinement structure 28. A central portion of the slow wave propagation layer 26 (between groups of alternating electrodes 38, 40 and 38A, 40A) includes an additional (output) electrode in the form of an embedded plate electrode 130, which is arranged in contact with a lower surface of the piezoelectric layer 30. A central portion of the piezoelectric layer 30 is overlaid with stacked functional layers, including a dielectric layer 126, a semiconductor layer 124, and a top side plate electrode 122. A sandwich structure including the central portion of the piezoelectric layer 30, the dielectric layer 126, and the semiconductor layer 124 arranged between the top side plate electrode 122 and the embedded plate electrode 130 provides a parallel plate acousto-electric convolver structure.

In operation of the device of FIG. 30, a coded input signal having a frequency f is supplied to alternating electrodes 38, 40 of a first IDT, and a time-reversed reference code having a frequency f is supplied to alternating electrodes 38A, 40A of a second IDT. Acoustic waves generated in the piezoelectric layer 30 are received by the sandwich structure (including the central portion of the piezoelectric layer 30, the dielectric layer 126, and the semiconductor layer 124 arranged between the top side plate electrode 122 and the embedded plate electrode 130), providing an autocorrelated output signal at a frequency of 2f through an output electrode comprising in combination the electrodes 122, 130.

Alternative parallel plate acousto-electric convolver structures may be provided. In certain embodiments, a MEMS mixed domain guided wave device further includes at least one semiconducting layer arranged between the inner conductive layer and the outer conductive layer. FIG. 31 is a cross-sectional view of a MEMS mixed domain guided wave device similar to the device of FIG. 30, but with two dielectric layers 126, 128 accompanying the semiconductor layer 124 within a sandwich structure of an acousto-electric convolver. The piezoelectric layer 30, which includes an exposed upper surface 30', overlies alternating electrodes 38, 40 of a first IDT and alternating electrodes 38A, 40A of a second IDT embedded in an upper portion of an underlying slow wave propagation layer 26, which overlies a guided wave confinement structure 28. A central portion of the slow wave propagation layer 26 (between groups of alternating electrodes 38, 40 and 38A, 40A) includes an additional electrode in the form of an embedded plate electrode 130, which is arranged in contact with a lower surface of the piezoelectric layer 30. A central portion of the piezoelectric layer 30 is overlaid with stacked functional layers, including the first dielectric layer 126, the semiconductor layer 124, the second dielectric layer 128, and a top side plate electrode 122. A sandwich structure including the central portion of the piezoelectric layer 30, the dielectric layers 126, 128, and the semiconductor layer 124 arranged between the top side plate electrode 122 and the embedded plate electrode 130 provides a parallel plate acousto-electric convolver structure. Operation of the device of FIG. 31 is similar to that previously described for the device of FIG. 30.

In certain embodiments, at least one functional layer of a mixed domain guided wave device includes at least one semiconducting layer; the plurality of electrodes includes a first group of input electrodes configured for transduction of a first lateral acoustic wave in the piezoelectric layer and a second group of input electrodes configured for transduction of a second lateral acoustic wave in the piezoelectric layer; output electrodes of opposing polarity are provided in ohmic contact with the at least one semiconducting layer; and the first group of input electrodes, the second group of input electrodes, and the output electrodes are configured to interact with the piezoelectric layer to provide acoustic wave convolver with bidirectional amplification utility.

One example of a mixed domain guided wave device configured to provide acoustic wave convolver with bidirectional amplification utility is shown in FIG. 32. Such device includes a piezoelectric layer 30 having an exposed upper surface 30', wherein the piezoelectric layer 30 overlies alternating electrodes 38, 40 of a first IDT and alternating electrodes 38A, 40A of a second IDT embedded in an upper portion of an underlying slow wave propagation layer 26 that overlies a guided wave confinement structure 28. A portion of the piezoelectric layer 30 between the respective IDTs is overlaid with at least one semiconductor layer 132 that is further overlaid with ohmic contacts 134, 136 of opposing polarity that yield an output IDT. In certain embodiments, a single semiconductor layer 132 may be provided, but in alternative embodiments, multiple semiconductor layers 132 may be provided, and may optionally form a heterostructure with a significant bandgap difference between layers. In the mixed domain device, convolution may occur primarily in the semiconductor layer 132, but may be further augmented by the piezoelectric layer 30. As will be recognized by one skilled in the art, the ohmic contacts 134, 136 of the output IDT may differ substantially from the contacts 38, 40, 38A, 40A of the first and second IDTs with respect to material, number, periodicity, and/or other properties. In operation of the device of FIG. 32, signals of the same or different frequencies may be supplied through the first IDT (including alternating electrodes 38, 40) and through the second IDT (including alternating electrodes 38A, 40A), and a DC voltage may be applied across the ohmic contacts 134, 136 of the output IDT. Acoustic waves transduced by the first and second IDTs are propagated through the piezoelectric layer 30 to the at least one semiconductor layer 132 and received by the ohmic contacts 134, 136 of the output IDT. Interaction between the acoustic waves and the at least one semiconductor layer 132, as well as the piezoelectric layer 30, effects convolution of the input signals, and results in generation of an output signal detected by the ohmic contacts 134, 136 of the output IDT.

Embodiments as disclosed herein may provide one or more of the following beneficial technical effects: enablement of adjustment of one or more properties of a guided wave device; integration of one or more functional and/or sensing structures with a guided wave device without interfering with placement of acoustic electrodes; providing guided wave devices with enhanced utility; and facilitating efficient manufacture of guided wave devices, including those with enhanced utility.

Upon reading the following description in light of the accompanying drawing figures, those skilled in the art will understand the concepts of the disclosure and will recognize applications of these concepts not particularly addressed herein. Those skilled in the art will recognize improvements and modifications to the preferred embodiments of the present disclosure. All such improvements and modifications are considered within the scope of the concepts disclosed herein and the claims that follow. Any of the various features and elements as disclosed herein may be combined with one or more other disclosed features and elements unless indicated to the contrary herein.

What is claimed is:

1. A method of fabricating a MEMS guided wave device, the method comprising:
    defining a plurality of electrodes on a piezoelectric layer;
    depositing a slow wave propagation layer over the plurality of electrodes and at least a portion of the piezoelectric layer;
    providing a guided wave confinement structure proximate to the slow wave propagation layer, wherein the guided wave confinement structure is configured to confine a lateral acoustic wave in the piezoelectric layer and the slow wave propagation layer; and
    locally thinning the piezoelectric layer to define a first thickness region and a second thickness region, wherein a thickness of the first thickness region differs from a thickness of the second thickness region.

2. The method of claim 1, wherein the piezoelectric layer comprises a single crystal piezoelectric material.

3. The method of claim 1, further comprising planarizing a surface of the slow wave propagation layer prior to said providing of the guided wave confinement structure proximate to the slow wave propagation layer.

4. The method of claim 1, wherein said local thinning of the piezoelectric layer comprises etching.

5. The method of claim 1, further comprising depositing at least one loading material at least partially covering the piezoelectric layer after said local thinning of the piezoelectric layer, wherein the at least one loading material is configured to locally alter a property of the lateral acoustic wave in the piezoelectric layer.

6. The method of claim 5, wherein the at least one loading material comprises a metal.

7. The method of claim 5, wherein the at least one loading material comprises a fast wave propagation material.

8. The method of claim 5, wherein the at least one loading material comprises a dielectric material.

9. The method of claim 5, wherein the at least one loading material comprises a magnetic material or a magnetically responsive material.

10. The method of claim 5, wherein the at least one loading material comprises an epitaxial film grown on at least one portion of the piezoelectric layer.

11. The method of claim 5, wherein the at least one loading material is devoid of contact with any electrode of the plurality of electrodes.

12. The method of claim 5, wherein the at least one loading material is in direct contact with the piezoelectric layer.

13. The method of claim 1, further comprising depositing a functional material at least partially covering the piezoelectric layer after said local thinning of the piezoelectric layer.

14. The method of claim 1, wherein the plurality of electrodes comprises a first plurality of electrodes arranged against or adjacent to the first thickness region and configured for transduction of a first lateral acoustic wave having a wavelength $\lambda_1$ in the first thickness region, and comprises a second plurality of electrodes arranged against or adjacent to the second thickness region and configured for transduction of a second lateral acoustic wave having a wavelength $\lambda_2$ in the second thickness region, wherein $\lambda_2$ differs from $\lambda_1$.

15. The method of claim 1, wherein the guided wave confinement structure comprises a Bragg mirror.

* * * * *